(12) United States Patent
Kimura et al.

(10) Patent No.: US 10,186,496 B2
(45) Date of Patent: Jan. 22, 2019

(54) SEMICONDUCTOR DEVICE AND METHOD FOR MANUFACTURING SEMICONDUCTOR DEVICE TO PREVENT SEPARATION OF TERMINALS

(71) Applicant: ROHM CO., LTD., Kyoto (JP)

(72) Inventors: Akihiro Kimura, Kyoto (JP); Takeshi Sunaga, Kyoto (JP)

(73) Assignee: ROHM CO., LTD., Kyoto-Shi, Kyoto (JP)

( * ) Notice: Subject to any disclaimer, the term of this patent is extended or adjusted under 35 U.S.C. 154(b) by 0 days.

(21) Appl. No.: 15/474,727

(22) Filed: Mar. 30, 2017

(65) Prior Publication Data
US 2017/0207192 A1     Jul. 20, 2017

Related U.S. Application Data

(63) Continuation of application No. 15/091,410, filed on Apr. 5, 2016, now Pat. No. 9,653,384, which is a
(Continued)

(30) Foreign Application Priority Data

Apr. 4, 2011  (JP) ................................. 2011-082406
Apr. 4, 2011  (JP) ................................. 2011-082407
Apr. 19, 2011 (JP) ................................. 2011-092709

(51) Int. Cl.
    *H01L 21/00*     (2006.01)
    *H01L 23/52*     (2006.01)
    (Continued)

(52) U.S. Cl.
    CPC .............. *H01L 24/81* (2013.01); *H01L 21/52* (2013.01); *H01L 21/56* (2013.01); *H01L 21/568* (2013.01);
    (Continued)

(58) Field of Classification Search
    CPC ........ H01L 21/569; H01L 24/29; H01L 24/97
    See application file for complete search history.

(56) References Cited

U.S. PATENT DOCUMENTS 6,352,437 B1   3/2002  Tate
6,406,942 B2   6/2002  Honda
(Continued)

FOREIGN PATENT DOCUMENTS

CN    1476670 A    2/2004
EP    1361657 A1   11/2003
(Continued)

OTHER PUBLICATIONS

Patent Cooperation Treaty, Japanese Patent Office; International Search Report and Written Opinion of PCT/JP2012/058878 (related application); dated Jul. 3, 2012; 10 pages.

*Primary Examiner* — Nicholas Tobergte
(74) *Attorney, Agent, or Firm* — Gregory M. Howison

(57) ABSTRACT

A semiconductor device is provided with a semiconductor element having a plurality of electrodes, a plurality of terminals electrically connected to the plurality of electrodes, and a sealing resin covering the semiconductor element. The sealing resin covers the plurality of terminals such that a bottom surface of the semiconductor element in a thickness direction is exposed. A first terminal, which is one of the plurality of terminals, is disposed in a position that overlaps a first electrode, which is one of the plurality of electrodes, when viewed in the thickness direction. The semiconductor device is provided with a conductive connection member that contacts both the first terminal and the first electrode.

19 Claims, 63 Drawing Sheets

Related U.S. Application Data continuation of application No. 14/009,993, filed as application No. PCT/JP2012/058878 on Apr. 2, 2012, now Pat. No. 9,324,677.

(51) Int. Cl.

| | | |
|---|---|---|
| *H01L 23/00* | (2006.01) | |
| *H01L 21/56* | (2006.01) | |
| *H01L 23/495* | (2006.01) | |
| *H01L 25/065* | (2006.01) | |
| *H01L 23/31* | (2006.01) | |
| *H01L 23/29* | (2006.01) | |
| *H01L 21/52* | (2006.01) | |

(52) U.S. Cl.
CPC ........ *H01L 23/293* (2013.01); *H01L 23/3114* (2013.01); *H01L 23/3142* (2013.01); *H01L 23/49541* (2013.01); *H01L 23/49548* (2013.01); *H01L 23/49575* (2013.01); *H01L 23/49582* (2013.01); *H01L 24/11* (2013.01); *H01L 24/16* (2013.01); *H01L 24/71* (2013.01); *H01L 24/90* (2013.01); *H01L 25/0657* (2013.01); *H01L 24/45* (2013.01); *H01L 24/49* (2013.01); *H01L 2224/05554* (2013.01); *H01L 2224/11005* (2013.01); *H01L 2224/1146* (2013.01); *H01L 2224/16104* (2013.01); *H01L 2224/16221* (2013.01); *H01L 2224/16225* (2013.01); *H01L 2224/16501* (2013.01); *H01L 2224/32145* (2013.01); *H01L 2224/45144* (2013.01); *H01L 2224/49171* (2013.01); *H01L 2224/73265* (2013.01); *H01L 2225/06513* (2013.01); *H01L 2225/06541* (2013.01); *H01L 2225/06568* (2013.01); *H01L 2225/06582* (2013.01); *H01L 2924/15174* (2013.01); *H01L 2924/181* (2013.01)

(56) References Cited

U.S. PATENT DOCUMENTS

| | | | |
|---|---|---|---|
| 6,969,945 | B2 | 11/2005 | Namba et al. |
| 2002/0000643 | A1* | 1/2002 | Uemura ................ H01L 24/03 257/639 |
| 2002/0117762 | A1 | 8/2002 | Ikegami |
| 2003/0030134 | A1* | 2/2003 | Tao ........................ H01L 21/563 257/678 |
| 2004/0026361 | A1* | 2/2004 | Namba ................ H01L 21/568 216/13 |
| 2004/0089957 | A1* | 5/2004 | Shizuno ............. H01L 23/5389 257/787 |
| 2005/0245066 | A1 | 11/2005 | Mis |
| 2006/0006760 | A1 | 1/2006 | Namba et al. |
| 2007/0052076 | A1 | 3/2007 | Ramos et al. |
| 2008/0113164 | A1 | 5/2008 | Yamashita et al. |
| 2013/0320527 | A1 | 12/2013 | Sunaga et al. |

FOREIGN PATENT DOCUMENTS

| | | |
|---|---|---|
| JP | 2001257288 A | 9/2001 |
| JP | 2002280491 A | 9/2002 |
| JP | 200323133 A | 1/2003 |
| JP | 2005223162 A | 8/2005 |
| JP | 200847832 A | 2/2008 |
| JP | 200847836 A | 2/2008 |
| JP | 2009246395 A | 10/2009 |
| WO | 2002063763 A1 | 8/2002 |

* cited by examiner

Fig.10
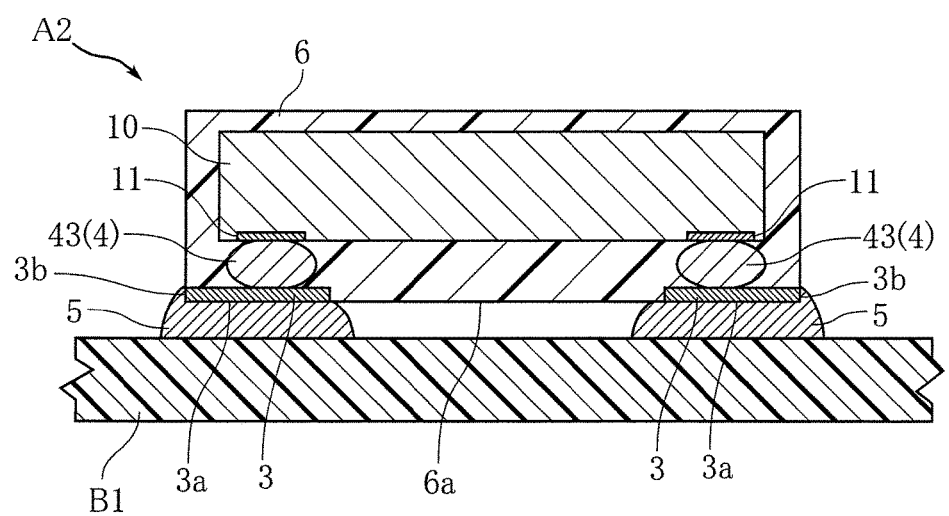
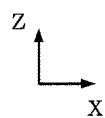

Fig.24
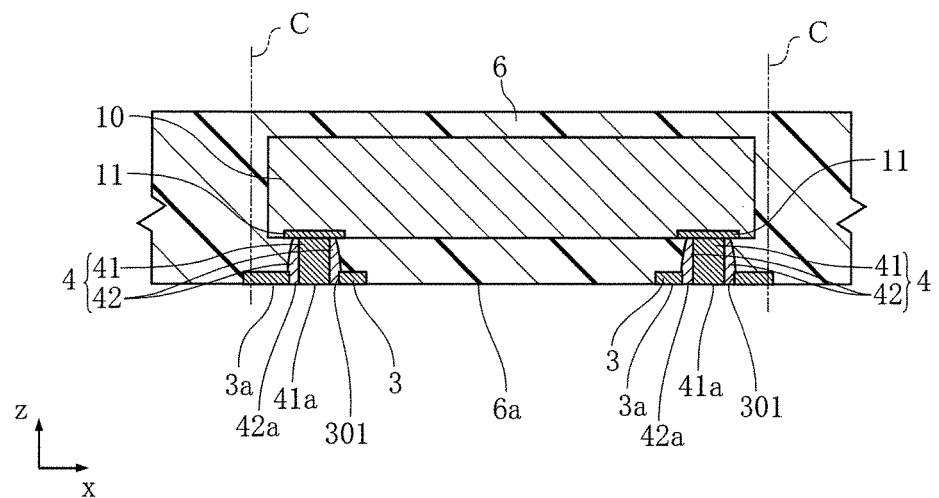
Fig.25
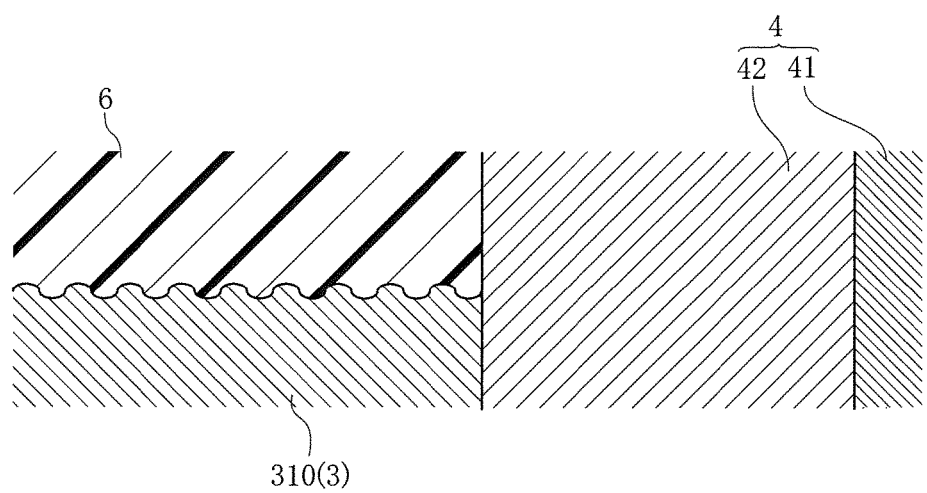
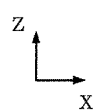

SEMICONDUCTOR DEVICE AND METHOD FOR MANUFACTURING SEMICONDUCTOR DEVICE TO PREVENT SEPARATION OF TERMINALS

CROSS-REFERENCE TO RELATED APPLICATIONS

This application is a Continuation of U.S. application Ser. No. 15/091,410, filed on Apr. 5, 2016, entitled SEMICONDUCTOR DEVICE AND METHOD FOR MANUFACTURING SEMICONDUCTOR DEVICE which published as U.S. Application Publication No. 2016-0218052 on Jul. 28, 2016. U.S. application Ser. No. 15/091,410 is incorporated by reference herein in its entirety. U.S. application Ser. No. 15/091,410 is a Continuation of U.S. application Ser. No. 14/009,993, filed Apr. 2, 2012, entitled SEMICONDUCTOR DEVICE AND METHOD FOR MANUFACTURING SEMICONDUCTOR DEVICE, which published as U.S. Application Publication No. 2014-0021627 on Jan. 23, 2014, and is now U.S. Pat. No. 9,324,677. U.S. application Ser. No. 14/009,993 is incorporated by reference herein in its entirety. U.S. application Ser. No. 14/009,993 claims priority to U.S. National Phase application submitted under 35 U.S.C. § 371 of Patent Cooperation Treaty Application Serial No. PCT/JP2012/058878, filed Apr. 2, 2012, and entitled SEMICONDUCTOR DEVICE AND METHOD FOR MANUFACTURING SEMICONDUCTOR DEVICE, which application claims priority to Japanese Patent Application Serial Nos. JP 2011-082406, filed Apr. 4, 2011, JP 2011-082407, filed Apr. 4, 2011 and JP 2011-092709, filed Apr. 19, 2011, entitled 発明の名称 回路基板の製造方法, all of which are incorporated herein by reference.

Patent Cooperation Treaty Application Serial No. PCT/JP2012-058878, published on Oct. 11, 2012, as Publication No. WO/2012/137714, and Japanese Patent Application Serial Nos. 2011-082406, 2011-082407 and 2011-092709, are incorporated herein by reference.

TECHNICAL FIELD

The present invention relates to semiconductor devices and methods for manufacturing semiconductor devices.

BACKGROUND

In recent years, semiconductor devices with package types such as SON (Small Outline Non-leaded Packages) and QFN (Quad Flat Non-Leaded Packages) have been widely manufactured. An example of a QFN semiconductor device is shown in FIG. 77 in cross-sectional view (e.g., see Patent Document 1). The semiconductor device 90 shown in FIG. 77 is provided with a resin case 91, a base lead 92, a semiconductor chip 93, lead terminals 94, and connection wires 95. The semiconductor chip 93 is fixed to the base lead 92, and is connected to the lead terminals 94 via the connection wires 95. Semiconductor devices such as the semiconductor device 90 are manufactured using a lead frame. A lead frame is manufactured by forming a metal plate having a thickness of about 0.2 mm into a desired pattern by punching with a precision press or etching.

When manufacturing the semiconductor device 90 using a lead frame, the semiconductor chip 93 is placed on the base lead 92, and the semiconductor chip 93 and the lead terminals 94 are connected with the connection wires 95, before covering the lead frame with the resin case 91. Thereafter, unnecessary portions of the lead frame are cut off and removed.

There are calls to downsize the semiconductor device 90 following the downsizing of various electronic devices. One conceivable method of downsizing is to reduce the dimensions of the semiconductor device 90 in the thickness direction. The thickness of the base lead 92 and the lead terminals 94 which are formed from a metal plate is not a favorable element in making the semiconductor device 90 thinner. Manufacturing semiconductor devices in a package form without using a lead frame has thus been proposed. For example, a technique that involves forming terminals by plating on a metal base, and subsequently removing the base by etching is known (e.g., see Patent Document 1).

However, in the case where terminals are formed by plating as described above, without using a lead frame, the thickness of the terminals will be about 20 μm, and the terminals could possibly be more likely to separate from the resin case. In terms of manufacturing semiconductor devices without using a lead frame, securing the pullout strength of the terminals is an issue.

Conventionally, various methods for manufacturing semiconductor devices have been conceived besides the above-mentioned examples. For example, in a method disclosed in Patent Document 2, first an external electrode pad part is formed on a metal plate having high flatness. Next, the metal plate and the external electrode pad part are covered with an insulating resin thin film layer. Next, after forming an opening in the insulating resin thin film layer, a metal thin film interconnect part is formed in the opening. Next, the metal thin film interconnect part is covered with an insulating resin thin film layer. A plurality of metal thin film interconnect parts are stacked by repeating processes such as the above. Next, a multilayer interconnect substrate is formed by removing the metal plate by etching. A semiconductor chip is mounted to the multilayer interconnect substrate, and the metal thin film interconnect parts in the multilayer interconnect substrate are thus electrically connected to electrodes of the semiconductor chip.

In a method for manufacturing a semiconductor device such as this, photolithography is performed to etch the metal film formed on the metal plate when forming the metal thin film interconnect parts. Since the metal thin film interconnect parts are formed in sequence on the metal plate, the photolithography is also performed in sequence. To perform photolithography, tasks such as forming a photomask and preparing an exposure machine are necessary, requiring time and effort.

PRIOR ART DOCUMENTS

Patent Document

Patent Document 1: JP 2009-246395A
Patent Document 2: JP 2001-257288A

SUMMARY OF THE INVENTION

Problem to be Solved by the Invention

The present invention was conceived in light of the above situation and has a first object of providing a semiconductor device and a method for manufacturing a semiconductor device that can prevent separation of the terminals.

The present invention was conceived in light of the above situation and has a second object of providing a method for manufacturing a semiconductor device that can manufacture semiconductor devices efficiently.

Means for Solving the Problem

A semiconductor device provided according to a first aspect of the present invention includes a semiconductor element having a plurality of electrodes; a plurality of terminals that are electrically connected to the plurality of electrodes; and a sealing resin that covers the semiconductor element. The sealing resin covers the plurality of terminals such that one of end faces of the semiconductor element in a thickness direction is exposed, a first terminal, which is any of the plurality of terminals, is disposed in a position that overlaps a first electrode, which is any of the plurality of electrodes, when viewed in the thickness direction, and the semiconductor device comprises a conductive connection member that contacts both the first terminal and the first electrode.

In a preferable embodiment, the first terminal has a thickness of 0.02-0.03 mm.

In a more preferable embodiment, the first terminal includes a plurality of metal layers, and the plurality of metal layers include a first metal layer that contacts the conductive connection member, and a second metal layer that is disposed to one side of the first metal layer in the thickness direction and consists of a different material from the first metal layer.

Preferably, the second metal layer is thicker than the first metal layer.

For example, the first metal layer is made from gold or palladium, and the second metal layer is made from nickel.

In a preferable embodiment, the conductive connection member is provided with a columnar member that contacts the first electrode and a fixing member that fixes the columnar member to the first terminal.

For example, the columnar member is a post made from copper or gold.

For example, the fixing member is solder.

For example, the fixing member may be made from silver.

In another preferable embodiment, the conductive connection member is a solder bump.

In a preferable embodiment, the plurality of terminals are arranged in a grid when viewed in the thickness direction.

In a preferable embodiment, the plurality of terminals have a rough surface that comes in contact with the sealing resin.

In a preferable embodiment, the sealing resin covers the first terminal such that one of end faces of the first terminal in a first direction orthogonal to the thickness direction is exposed.

For example, the sealing resin has a thickness of 0.2-0.3 mm.

In one preferable embodiment, the semiconductor device includes an additional semiconductor element disposed in a position that overlaps the semiconductor element when viewed in the thickness direction; and a plurality of additional terminals that are electrically connected to the additional semiconductor element.

Preferably, the additional semiconductor element has a plurality of additional electrodes, and the semiconductor device includes a plurality of wires that connect the plurality of additional electrodes to the plurality of additional terminals.

Preferably, the sealing resin covers the plurality of additional terminals such that one of end faces of the plurality of additional terminals in the thickness direction is exposed.

Preferably, the plurality of additional terminals are disposed in a rectangular shape surrounding the plurality of terminals.

A method for manufacturing a semiconductor device provided according to a second aspect of the present invention includes the steps of forming a plurality of terminals on a base; placing a semiconductor element so as to overlap the plurality of terminals when viewed in a thickness direction of the base; sealing the plurality of terminals and the semiconductor element with a resin; and removing the base. The semiconductor element has a plurality of electrodes, and the step of placing the semiconductor element includes the step of forming a conductive connection member that contacts a first electrode, which is one of the plurality of electrodes, and a first terminal, which is one of the plurality of a terminals.

In a preferable manufacturing method, the step of forming the plurality of terminals includes the step of forming a metal plating layer on the base.

In a preferable manufacturing method, the step of forming the conductive connection member includes the steps of forming a columnar member that stands erect in the thickness direction on the first electrode; and fixing the columnar member to the first terminal.

Preferably, in the step of forming the columnar member, a post made from copper or gold is formed.

In a preferable example, the step of fixing the columnar member to the first terminal is performed using a solder material.

In another preferable example, the step of fixing the columnar member to the first terminal is performed using a silver paste.

In another preferable manufacturing method, in the step of forming the conductive connection member, a solder bump is formed.

In a more preferable example, the manufacturing method is provided with a step of performing rough surface formation processing on at least one of the plurality of terminals.

A preferable manufacturing method includes the steps of placing an additional semiconductor element having a plurality of additional electrodes on the semiconductor element; forming a plurality of additional terminals on the base; and connecting the plurality of additional electrodes to the plurality of additional terminals.

Preferably, the step of forming the plurality of additional terminals includes the step of forming a metal plating layer on the base.

Other features and advantages of the present invention will become apparent from the detailed description given below with reference to the accompanying drawings.

BRIEF DESCRIPTION OF THE DRAWINGS

FIG. 10 is a cross-sectional view showing a semiconductor device based on Embodiment 2-A of the present invention.

FIG. 24 is a cross-sectional view of the main portion showing a state where the base has been removed, in an exemplary method for manufacturing the semiconductor device of FIG. 15.

FIG. 25 is a diagram showing a preferable shape of the terminals in detail.

DETAILED DESCRIPTION

Hereinafter, semiconductor devices and methods for manufacturing the semiconductor devices that are based on the present invention will be specifically described with reference to FIGS. 1 to 14.

Embodiment 1-A

Figure 1:
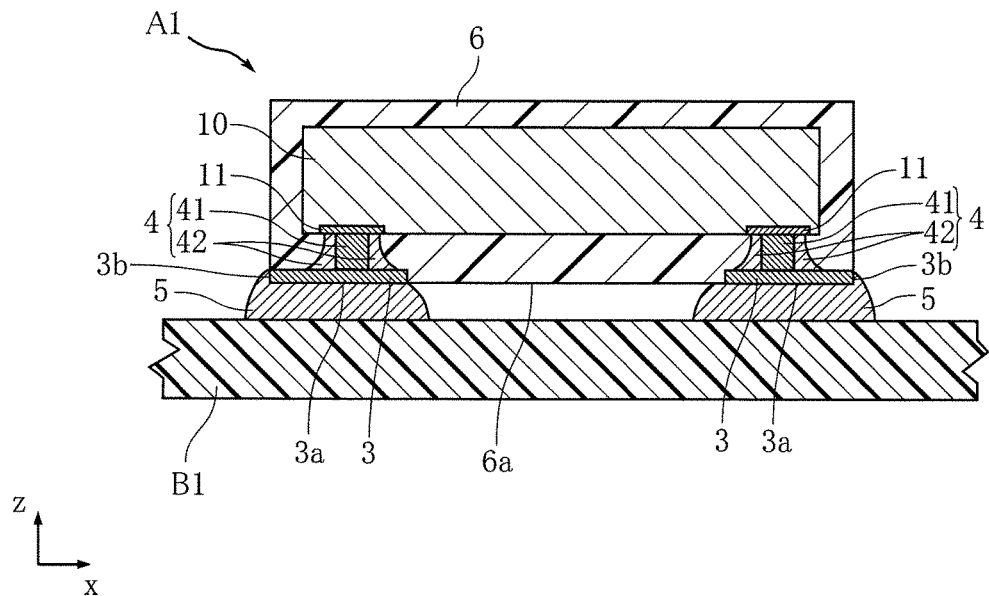
FIG. 1 is a cross-sectional view showing a semiconductor device based on Embodiment 1-A of the present invention.
Figure 2:
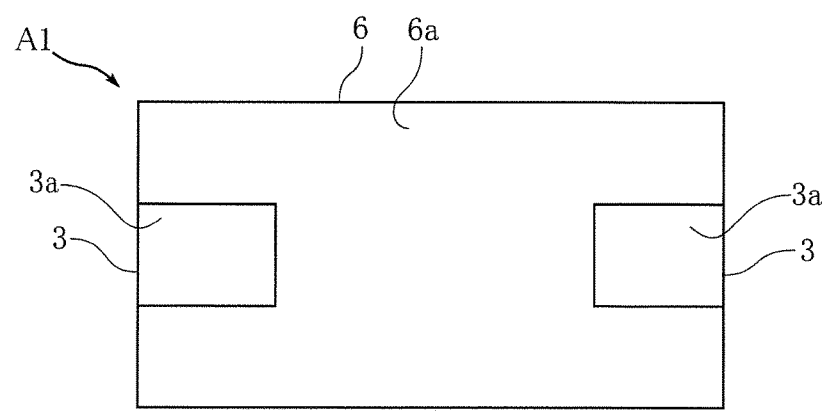
FIG. 2 is a bottom view of the semiconductor device shown in FIG. 1.
Figure 3:
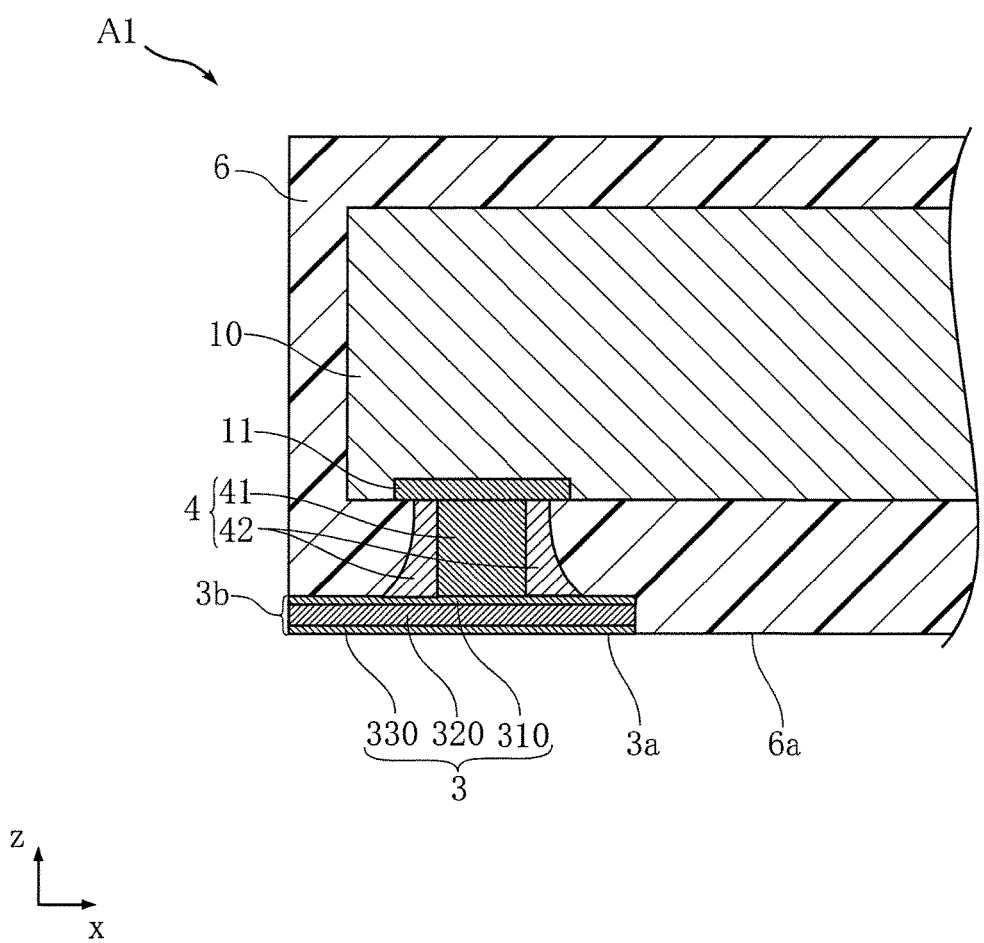
FIG. 3 is an enlarged cross-sectional view of a main portion of the semiconductor device shown in FIG. 1.

FIGS. 1 to 3 show the semiconductor device based on Embodiment 1-A of the present invention. The semiconductor device A1 of the present embodiment is provided with a semiconductor element 10, a pair of terminals 3, a pair of conductive connection members 4, and a sealing resin 6.

Note that the x, y, and z directions that are used in the following description are directions that are orthogonal to each other, with the z direction being the thickness direction of the sealing resin 6, the semiconductor element 10, and the terminals 3. Also, hereinafter, the lower side in FIG. 1 in the z direction is the bottom side, and the upper side in FIG. 1 is the top side.

As shown in FIG. 1, the semiconductor device A1 is fixed for use to a substrate B1 by solder 5. A wiring pattern not shown is formed on the top surface of the substrate B1. The solder 5 electrically connects the wiring pattern not shown to the pair of terminals 3. Note that, in FIG. 3, the substrate B1 and the solder 5 are omitted.

The sealing resin 6 completely covers the semiconductor element 10, and covers the pair of terminals 3 such that a bottom surface 3a and a side surface 3b of the pair of terminals 3 are exposed. The sealing resin 6 consists of a black epoxy resin, for example, and is formed in a rectangular parallelepiped shape that is long in the x direction. As an example, the dimensions of the sealing resin 6 in the x, y, and z directions are respectively 2.10 mm, 1.60 mm, and 0.2-0.3 mm. These dimensions can be appropriately changed according to the size of the semiconductor element 10.

The semiconductor element 10 consists of a semiconductor material such as Si, and a micro-circuit is built therein. A pair of electrodes 11 are formed on the bottom surface of the semiconductor element 10. The pair of electrodes 11 are placed so as to be spaced from each other in the x direction. The pair of electrodes 11 are connected to the micro-circuit in the semiconductor element 10. The semiconductor element 10 is incorporated for use in an electronic circuit. At that time, the semiconductor element 10 exhibits the function thereof as a result of connecting the pair of electrodes 11 to the wiring in the electronic circuit. Note that, in the present embodiment, the number of electrodes 11 is given as two for simplification of description. The number of the electrodes 11 can be appropriately changed according to the function of the semiconductor element 10.

The pair of terminals 3 are, as shown in FIG. 2, disposed so as to be spaced from each other in the x direction, and to partially overlap the pair of electrodes 11 when viewed in the z direction. Each terminal 3, when viewed in the z direction, has a rectangular shape that is long in the x direction, and has a length in the x direction of 0.2 mm, for example. As shown in FIG. 1, the right end portion of the terminal 3 disposed on the right of the diagram in the x direction projects at a position that does not overlap the semiconductor element 10 when viewed in the z direction, and the side surface 3b on the right is flush with the side surface on the right side of the sealing resin 6. The left end portion of the terminal 3 disposed on the left of the diagram in the x direction projects at a position that does not overlap the semiconductor element 10 when viewed in the z direction, and the side surface 3b on the left is flush with the side surface on the left side of the sealing resin 6. Furthermore, the bottom surface 3a of each terminal 3 is flush with the bottom surface 6a of the sealing resin 6. Note that the number of terminals 3 depends on the number of electrodes 11 of the semiconductor element 10, and can be appropriately changed according to the function of the semiconductor element 10.

The terminals 3 have a thickness of 0.02-0.03 mm, for example. As shown in FIG. 3, the terminals 3 are provided with a first metal layer 310, a second metal layer 320, and a third metal layer 330. The first metal layer 310 is made from gold or palladium, and has a thickness in the z direction of 5 μm. The first metal layer 310 is disposed on the top surface side in the z direction, and contacts the conductive connection member 4. The second metal layer 320 consists of a different material from the first metal layer 310, and is formed so as to be thicker in the z direction than the first metal layer 310. Specifically, the second metal layer 320 is made from nickel and has a thickness in the z direction of 20 μm. In the example shown in FIG. 3, the second metal layer 320 is disposed so as to contact the bottom surface of the first metal layer 310. The third metal layer 330 is made from gold and has a thickness in the z direction of 5 μm. The third metal layer 330 is disposed on the bottom surface side in the z direction. The bottom surface 3a of the terminal 3 is the bottom surface of the third metal layer 330.

The pair of conductive connection members 4 are, as shown in FIG. 1, each provided between an electrode 11 and a terminal 3 that overlap when viewed in the z direction. Each conductive connection member 4 is provided with a columnar member 41 and a fixing member 42. The columnar member 41 is a post made from copper or gold, for example, and is formed in a columnar shape whose height direction is in the z direction. As shown in FIG. 3, the top surface of the columnar member 41 in the z direction contacts the electrode 11, and the bottom surface of the columnar member 41 in the z direction contacts the first metal layer 310. The electrode 11 and the terminal 3 are electrically connected by this columnar member 41. The fixing member 42 is an unleaded solder or a high melting point solder, for example, and covers the columnar member 41 and part of the top surface of the terminal 3. This fixing member 42 fixes the columnar member 41 to the terminal 3. In the example shown in FIG. 3, the fixing member 42 also contacts the electrode 11, and fixes the columnar member 41 to the electrode 11.

Note that although the columnar member 41 contacts the terminal 3 in the present embodiment, it is possible that the fixing member 42 enters between the columnar member 41 and the terminal 3. Even in such a case, since the fixing member 42 is solder, there is no adverse affect on the electrical connection between the terminal 3 and the electrode 11.

The solder 5 that connects the semiconductor device A1 to the substrate B1 is, as shown in FIG. 1, formed so as to cover the bottom surface 3a and the side surface 3b of the terminals 3.

Next, an exemplary method for manufacturing the semiconductor device A1 will be described below, with reference to FIGS. 4 to 8.

A base 7 is used in manufacturing the semiconductor device A1. The base 7 is, for example, a copper plate having a thickness in the z direction of about 0.125 mm. The base 7 has, for example, a rectangular shape when viewed in the z direction, and is large enough to contain a large number of semiconductor devices A1.

Figure 4:
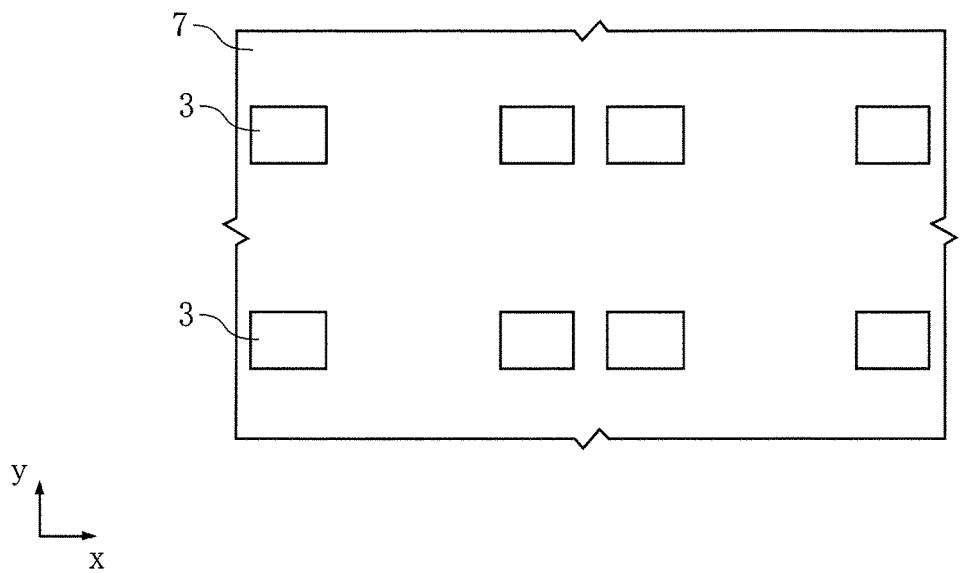
FIG. 4 is a plan view of the main portion showing a state where terminals are formed on a base, in an exemplary method for manufacturing the semiconductor device of FIG. 1.

When manufacturing the semiconductor device A1, first a process of preparing the base 7 and forming a plurality of terminals 3 in the top surface of the base 7 is performed. In the process of forming the terminals 3, a metal plating layer is formed over the entire top surface of the base 7 using electroless plating, for example. In the present embodiment, first a metal plating layer is formed, next a nickel plating layer is formed, and thereafter a gold or palladium plating layer is formed. Thereafter the metal plating layer is formed into a desired shape by etching. This enables a large number of terminals 3 to be formed on the base 7, as shown in FIG. 4. Note that the metal plating layer initially formed becomes the third metal layer 330, the nickel plating layer becomes the second metal layer 320, and the gold or palladium plating layer becomes the first metal layer 310.

Figure 5:
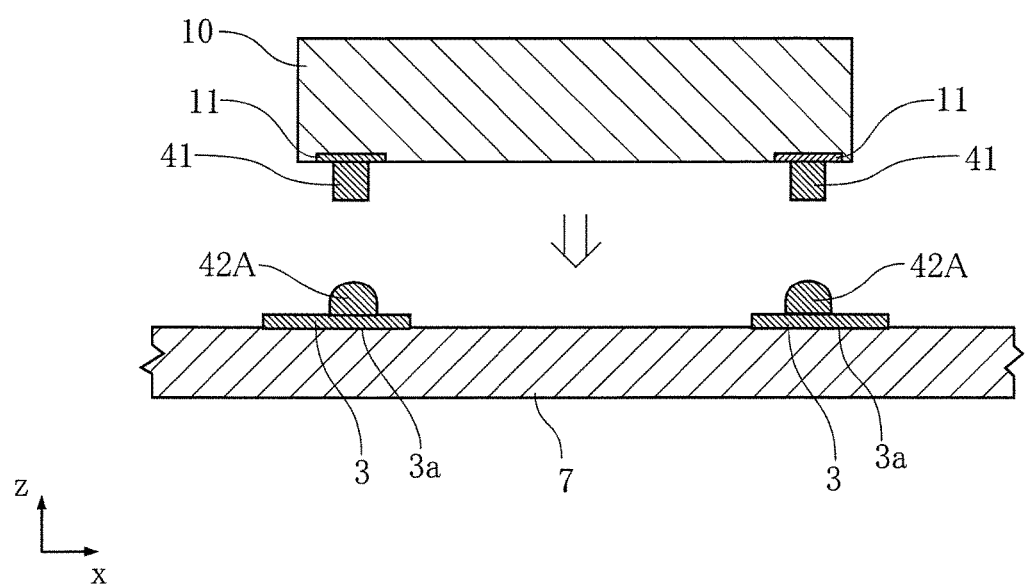
FIG. 5 is a cross-sectional view of the main portion showing a process of placing a semiconductor element, in an exemplary method for manufacturing the semiconductor device of FIG. 1.
Figure 6:
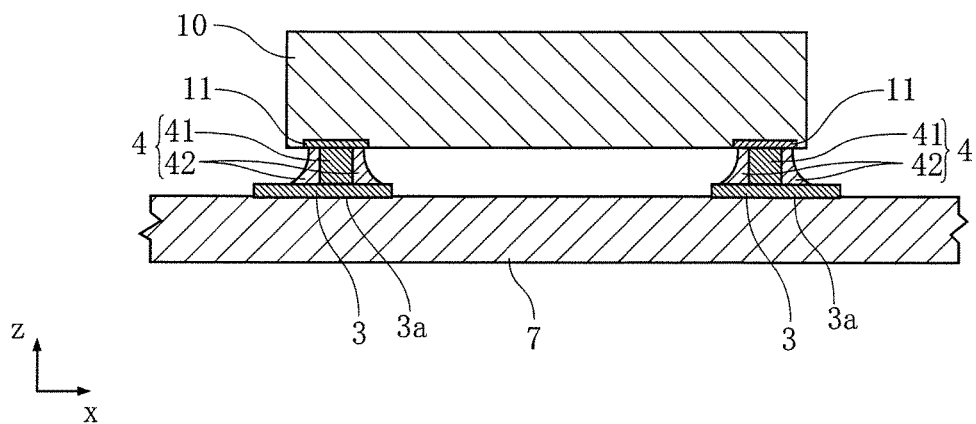
FIG. 6 is a cross-sectional view of the main portion showing a state where the semiconductor element has been placed, in the exemplary method for manufacturing the semiconductor device shown in FIG. 1.

Next, a process of forming the conductive connection members 4 is performed. In this process, first a process of forming the columnar member 41 on each electrode 11 of the semiconductor element 10 is performed. This process is performed by, for example, providing the semiconductor element 10 with a resist having openings corresponding to the columnar members 41, and filling the opening portions with gold or copper. Alternatively, a semiconductor element 10 provided with posts in advance may be prepared. Next, as shown in FIG. 5, a process of placing a solder material 42A on the terminal 3, and a process of placing the semiconductor element 10 to which the columnar members 41 have been attached on the base 7 are performed. The process of placing the solder material 42A can be performed by printing, for example. The process of placing the semiconductor element 10 on the base 7 is performed by heating the base 7 in a reflow furnace to melt the solder material 42A, and pressing the semiconductor element 10 against the base 7 so that the columnar members 41 come into contact with the place where the solder material 42A is printed. As a result of this process, the columnar members 41 is pushed into the solder material 42A and the solder material 42A forms a shape that covers the columnar members 41. This solder material 42A solidifies to form the fixing members 42. As a result of the above processes, the conductive connection members 4 are formed as shown in FIG. 6, and the semiconductor element 10 is connected to the terminals 3 via the conductive connection members 4.

Figure 7:
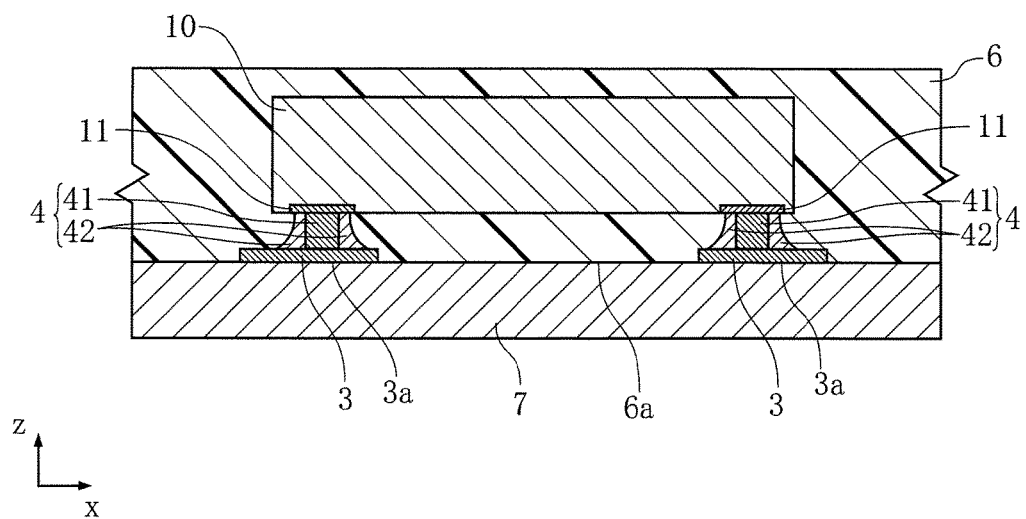
FIG. 7 is a cross-sectional view of the main portion showing a state where a sealing resin has been formed, in an exemplary method for manufacturing the semiconductor device of FIG. 1.

Next, a process of forming the sealing resin 6 is performed. In this process, the plurality of terminals 3 and the semiconductor element 10 are sealed with resin. The state after forming the sealing resin 6 is shown in FIG. 7. This process can be performed using a transfer mold technique, for example. With this technique, processing for placing the base 7 in a metal mold and pouring a liquefied epoxy resin into the metal mold is performed.

Next, a process of removing the base 7 is performed. The process of removing the base 7 is performed by etching the base 7 from the bottom surface side. Note that etching may be performed by mechanical grinding, or may be performed using a solution that dissolves copper. As a result of this process, the bottom surface 3a of each terminal 3 is exposed on the bottom surface side of the sealing resin 6, as shown in FIG. 8.

Figure 8:
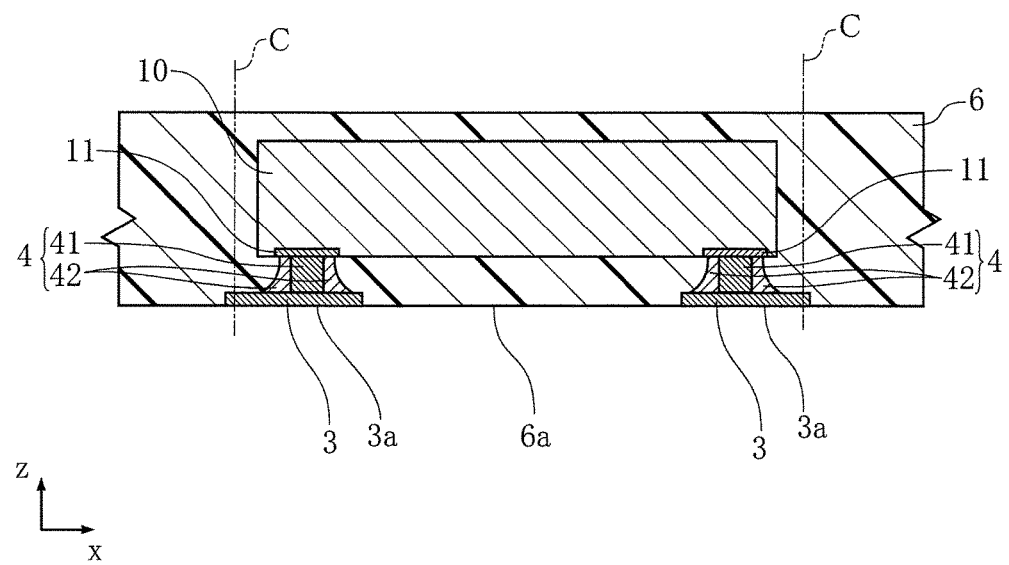
FIG. 8 is a cross-sectional view of the main portion showing a state where the base has been removed, in an exemplary method for manufacturing the semiconductor device of FIG. 1.

In the state shown in FIG. 8, the sealing resin 6 is the same size as the base 7 when viewed in the z direction. Cutting the sealing resin 6 of FIG. 8 enables the semiconductor device A1 shown in FIG. 1 to be obtained. When cutting the sealing resin 6, the cutting is performed along a two-dot chain line C shown in FIG. 8, for example. An end portion of the terminals 3 is also cut at this time. This results in a configuration in which the side surface 3b is exposed from the sealing resin 6, as shown in FIG. 1.

Next, the working of the semiconductor device A1 and the manufacturing method thereof will be described.

Since the terminals 3 are formed on the top surface of the base 7 by plating, the terminals 3 will be thin compared with the lead terminals 94 of the semiconductor device 90 shown in the Background Art. The manufacturing method described above is suitable for achieving a thinner semiconductor device A1.

As shown in FIG. 1, the terminals 3 are fixed to the substrate B1 by the solder 5. As described above, the terminals 3, being thin, come in contact with a small area of the sealing resin 6, and there is concern that in the case where an unintended force is applied to the semiconductor device A1 the terminals 3 may separate from the sealing resin 6 while remaining stuck to the solder 5. However, in the present embodiment, the terminals 3 are fixed to the columnar members 41 by the fixing members 42. Even in the case where the contact area between each terminal 3 and the sealing resin 6 is small, the terminals 3 do not readily separate from the sealing resin 6. Accordingly, with the semiconductor device A1, reliability can be ensured while at the same time achieving thinner terminals 3. Also, since the terminals 3 are fixed to the columnar members 41, the terminals 3 do not readily separate when removing the base 7, and an improvement in the defect rate can be anticipated. This is desirable in increasing the efficiency of the process of manufacturing the semiconductor device A1.

In the present embodiment, the process of cutting the terminals 3 is included in the manufacturing process. When cutting the terminals 3, a force that pulls the terminals 3 in the z direction occurs at the cutting surface. There is thus concern that the edge that is being cut will pull the terminals 3 and cause the terminals 3 to separate from the sealing resin 6. However, in the present embodiment, since the terminals 3 are thinner, the cutting surface at the time of cutting the terminals 3 is small, and the force with which the edge pulls the terminals 3 will also be reduced. Furthermore, since the terminals 3 are made thinner, burring can be easily prevented when cutting the terminals 3. Accordingly, with the semiconductor device A1, the occurrence of defects at the time of manufacture can be favorably prevented.

In the present embodiment, each terminal 3 is constituted by the first to third metal layers 310, 320 and 330. The second metal layer 320, which is the thickest of the three layers, is comparatively hard, and is not easily deformed compared with gold or the like. The occurrence of burring in the process of cutting the terminals 3 is thus even more easily prevented. Also, nickel is cheap compared with gold, and making the second metal layer 320 thicker is also favorable economically.

In the present embodiment, the side surface 3b of the terminals 3 is exposed from the sealing resin 6. This configuration can be easily realized by adjusting the position at the time of cutting the sealing resin 6, as described above. The thickness and structure of the terminals 3 are desirable in performing this manufacturing method. Specifically, since plating is used to form terminals 3 that are thin compared with conventional terminals, it is possible to perform the cutting process more smoothly, and an increase in the efficiency of the manufacturing process can be anticipated.

As shown in FIG. 1, the solder 5 is formed so as to cover the side surface 3b of the terminals 3. This structure enhances the joining force between the terminals 3 and the solder 5, and is favorable in stably mounting the semiconductor device A1 to the substrate B1, compared with the case where the solder 5 contacts only the bottom surface 3a.

In the present embodiment, the terminals 3 are disposed so as to overlap the semiconductor element 10 when viewed in the z direction. This configuration is desirable in reducing the size of the sealing resin 6 when viewed in the z directional vision.

In the present embodiment, a third metal layer 330 composed of gold which has low reactivity is disposed on the bottom surface 3a side of each terminal 3. Such a configuration is desirable in the case of removing the base 7 using a solution.

Note that although solder is used as the fixing member 42 in the above embodiment, the fixing member 42 may be formed using a silver paste. In this case, the finished fixing member 42 will be made from silver.

Figure 9:
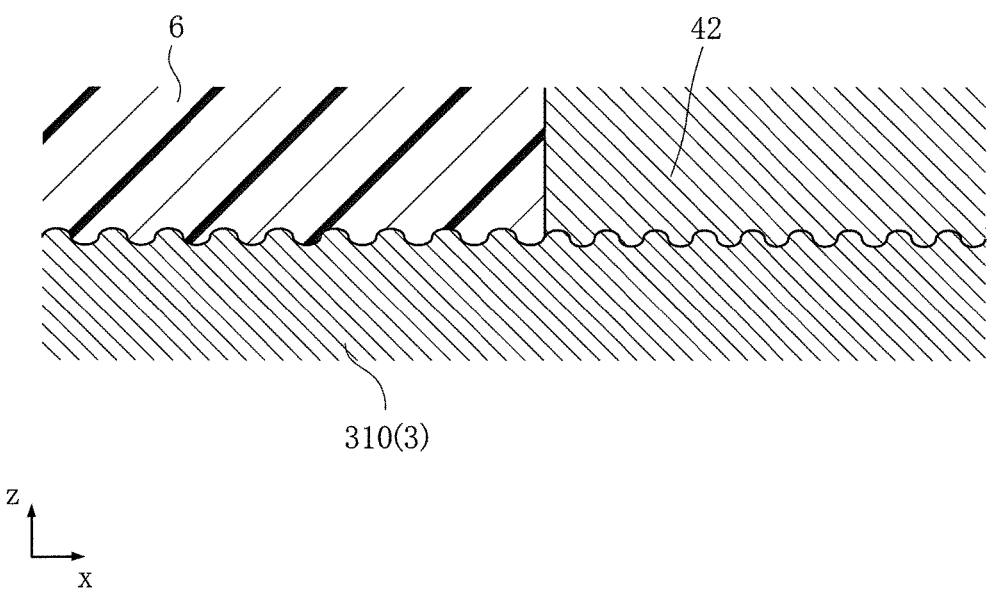
FIG. 9 is a diagram showing a preferable shape of the terminals in detail.

Although the top surface (upper surface in the diagram) of each terminal 3 is a flat surface that comes in contact with the sealing resin 6 in the example shown in FIG. 3, the top surface of each terminal 3 may be a rough surface formed with minute unevenness, as shown in the enlarged view of FIG. 9. After forming the terminals 3, minute unevenness can be formed on the top surface of the terminals 3 by performing rough surface formation processing. Rough surface formation processing can be performed by blasting, for example. Forming minute unevenness on the top surface of each terminal 3 increases the contact area between the terminals 3 and the sealing resin 6. The terminals 3 can thus be made less likely to separate from the sealing resin 6. Also, as shown in FIG. 9, the contact area between the top surface of the terminals 3 and the fixing members 42 also increases, and the joining strength between the terminals 3 and the fixing members 42 is also reinforced.

The terminals 3 have a rectangular shape when viewed in the z direction, as shown in FIG. 2. Each terminal 3 has four side surfaces along the four sides of the rectangle. Three of the four side surfaces excluding the side surface 3b are covered by the sealing resin 6, and come in contact with the sealing resin 6. The contact area between each terminal 3 and the sealing resin 6 can also be increased by forming minute unevenness on these side surfaces and creating rough surfaces. Furthermore, the joining force between the terminals 3 and the solder 5 can be further enhanced by also providing the side surface 3b with a rough surface having minute unevenness.

FIGS. 10 to 14 show another embodiment of the present invention. Note that, in these diagrams, the same reference signs are given to elements that are the same or similar to the above embodiment.

Embodiment 2-A

FIG. 10 shows a semiconductor device that is based on Embodiment 2-A of the present invention. In the semiconductor device A2 shown in FIG. 10, solder bumps 43 are used as the conductive connection members 4, and the remaining configuration is similar to the semiconductor device A1.

The solder bumps 43 can be formed on the semiconductor element 10 using a resist having openings tailored to the shape of the solder bumps 43. Alternatively, a semiconductor element 10 provided with the solder bumps 43 in advance may be prepared. In the present embodiment, the terminals 3 are fixed to the electrodes 11 of the semiconductor element 10 via the solder bumps 43. The terminals 3 thus also do not readily detach from the sealing resin 6 with the semiconductor device A2. Accordingly, reliability can also be ensured while at the same time achieving thinner terminals 3 when the configuration of the semiconductor device A2 is used.

Embodiment 3-A

Figure 11:
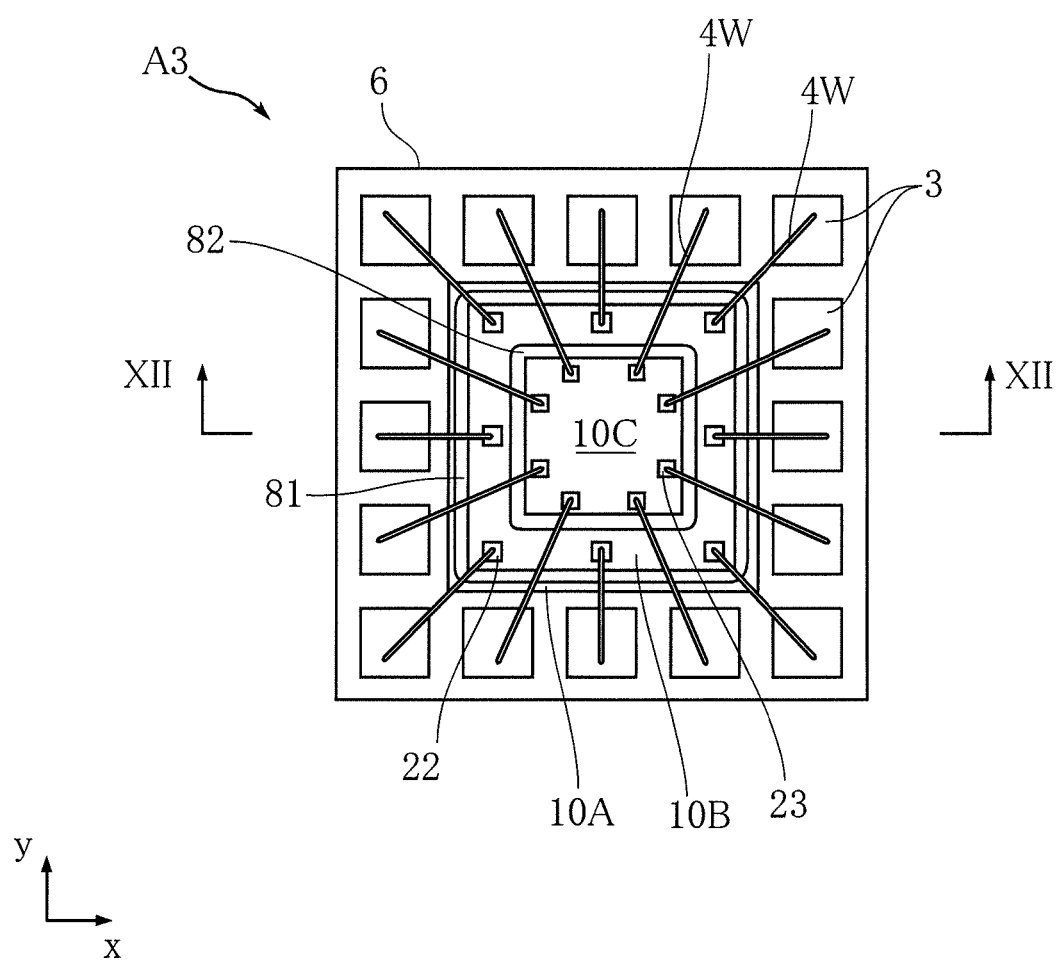
FIG. 11 is a plan view showing a semiconductor device based on Embodiment 3-A of the present invention.
Figure 12:
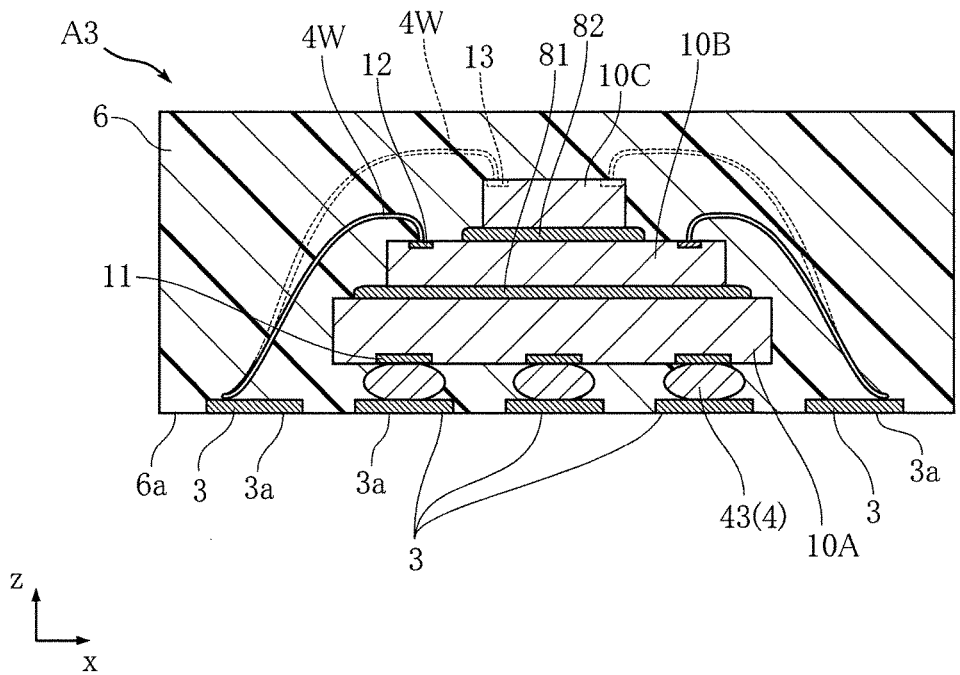
FIG. 12 is a cross-sectional view along line XI-XI in FIG. 11.
Figure 13:
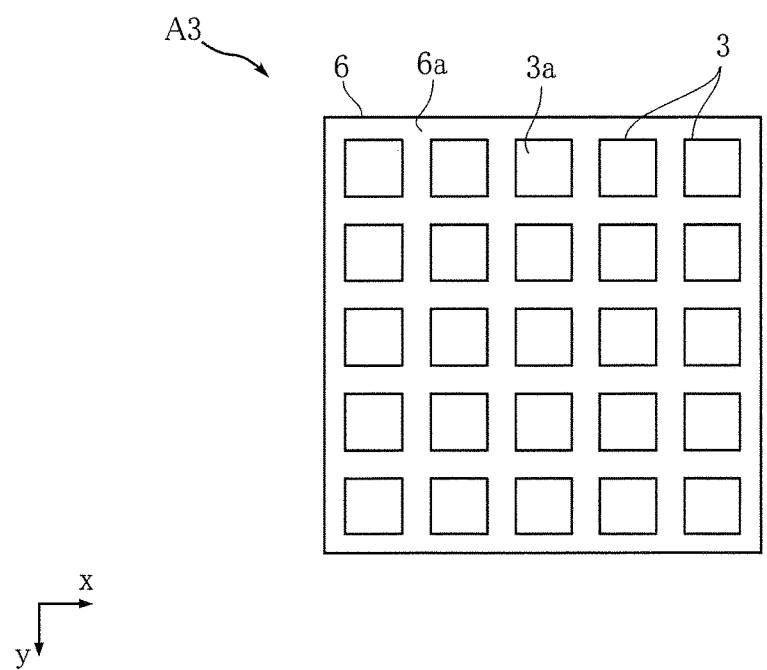
FIG. 13 is a bottom view of the semiconductor device shown in FIG. 11.

FIGS. 11 to 13 show a semiconductor device that is based on Embodiment 3-A of the present invention. Note that although the sealing resin 6 is black, for example, and the inside cannot be seen from the outside, in FIG. 12 the inside of the sealing resin 6 is shown for convenience of description. The semiconductor device A3 of the present embodiment is provided with a sealing resin 6, 3 semiconductor elements 10A, 10B and 10C, 25 terminals 3, 9 solder bumps 43, 16 wires 4W, and joining members 81 and 82. The semiconductor device A3 is an example of an area array semiconductor device, and, as shown in FIG. 13, the 25 terminals 3 are disposed in a grid when viewed in the z direction. Of the 25 terminals 3, the 16 outer terminals are connected to the semiconductor elements 10B and 10C, and the 9 inner terminals are connected to the semiconductor element 10A. In the present embodiment, each terminal 3 has a square shape when viewed in the z direction.

The sealing resin 6 completely covers the semiconductor elements 10A, 10B and 10C, the solder bumps 43, the wires 4W, and the joining members 81 and 82, and covers the terminals 3 such that the bottom surface 3a of the terminals 3 is exposed. The sealing resin 6 consists of an epoxy resin, for example, and is formed to have a square shape when viewed in the z direction.

The semiconductor element 10A consists of a semiconductor material such as Si, and a micro-circuit is built therein. In the example shown in FIG. 12, the semiconductor element 10A has a square shape when viewed in the z direction, and is disposed on the inside of the rectangular frame formed by the 16 terminals 3. 9 electrodes 11 arranged in a grid when viewed in the z direction are provided on the bottom surface of the semiconductor element 10A. The electrodes 11 are connected to the micro-circuit in the semiconductor element 10A. Note that the number of electrodes 11 can be appropriately changed according to the function of the semiconductor element 10A.

Of the 25 terminals 3, the 9 inner terminals 3 are disposed in positions that overlap the semiconductor element 10A when viewed in the z direction. More specifically, the 9 terminals 3 are disposed so as to oppose the 9 electrodes 11 provided on the bottom surface of the semiconductor element 10A. The solder bumps 43 are conductive connection members in the present invention, and join the electrodes 11 to the terminals 3.

The semiconductor element 10B consists of a semiconductor material such as Si, and has a micro-circuit built therein. In the example shown in FIG. 11, the semiconductor element 10B has a square shape that is smaller than the semiconductor element 10A when viewed in the z direction. The bottom surface of the semiconductor element 10B is fixed to the top surface of the semiconductor element 10A via the joining member 81. 8 electrodes 12 are provided on the top surface of the semiconductor element 10B. The 8 electrodes 12 are arranged on a peripheral portion of the top surface, such that a central portion of the semiconductor element 10B when viewed in the z direction is clear. In the example shown in FIG. 11, the electrodes 12 are disposed at both ends and in proximity to the middle of each side of the top surface of the semiconductor element 10B. The electrodes 12 are connected to the micro-circuit in the semiconductor element 10B. Note that the number of electrodes 12 can be appropriately changed according to the function of the semiconductor element 10B.

The semiconductor element 10C consists of a semiconductor material such as Si, and has a micro-circuit built therein. In the example shown in FIG. 11, the semiconductor element 10C has a square shape that is smaller than the semiconductor element 10B when viewed in the z direction. The bottom surface of the semiconductor element 10C is fixed to the top surface of the semiconductor element 10B via the joining member 82. 8 electrodes 13 are formed on the top surface of the semiconductor element 10C. In the example shown in FIG. 11, the 8 electrodes 13 are disposed in positions that do not overlap the 8 electrodes 12 when viewed in the x direction or the y direction. The electrodes 13 are connected to the micro-circuit in the semiconductor element 10C. Note that the number of electrodes 13 can be appropriately changed according to the function of the semiconductor element 10C.

The joining members 81 and 82 are composed of DAF tape, for example. As shown in FIG. 11, the joining member 81 has a rectangular shape when viewed in the z direction, and covers a large portion of the top surface of the semiconductor element 10A. As aforementioned, the electrodes 11 of the semiconductor element 10A are provided on the bottom surface side. The joining member 81 can thus be made substantially the same size as the semiconductor element 10A. This works advantageously when placing a comparatively large semiconductor element 10B on the semiconductor element 10A. The joining member 82 is placed on the inside of the frame created by the 8 electrodes 12. Note that the joining members 81 and 82 are not limited to DAF tape, and insulating paste may also be used.

As shown in FIG. 11, the electrodes 12 and 13 are connected to the terminals 3 by the gold wires 4W. The wires 4W can be formed using a commercial wire bonding capillary, for example.

When manufacturing such a semiconductor device A3, a process of placing the semiconductor elements 10B and 10C on the semiconductor element 10A, and a process of connecting the electrodes 12 and 13 to the terminals 3 with the wires 4W are provided, in addition to the process of manufacturing the semiconductor device A1. These processes are performed before the process of forming the sealing resin 6. Also, the process of placing the semiconductor element 10A of the semiconductor device A3 is equivalent to the process of placing the semiconductor element 10 of the semiconductor device A1.

The semiconductor device A3 is incorporated for use into the substrate of any of a variety of electronic devices. Incorporating as many semiconductor elements inside the same area as possible is effective in downsizing the substrate. In the semiconductor device A3, the semiconductor element 10B is fixed to the top surface of the semiconductor element 10A, and the semiconductor element 10C is further fixed to the top surface of the semiconductor element 10B. Such a configuration enables the number of semiconductor elements per unit area to be increased, compared with the case where the three semiconductor elements 10A, 10B and 10C are separately resin sealed and incorporated in an electronic circuit. Accordingly, the semiconductor device A3 is provided with a useful configuration in downsizing the substrate.

With the abovementioned semiconductor device A3, the semiconductor elements 10B and 10C are placed on the semiconductor element 10A, but a configuration in which only the semiconductor element 10B is placed on the semiconductor element 10A is possible. A configuration in which another semiconductor element is further placed on the semiconductor element 10C can also be implemented.

Embodiment 4-A

Figure 14:
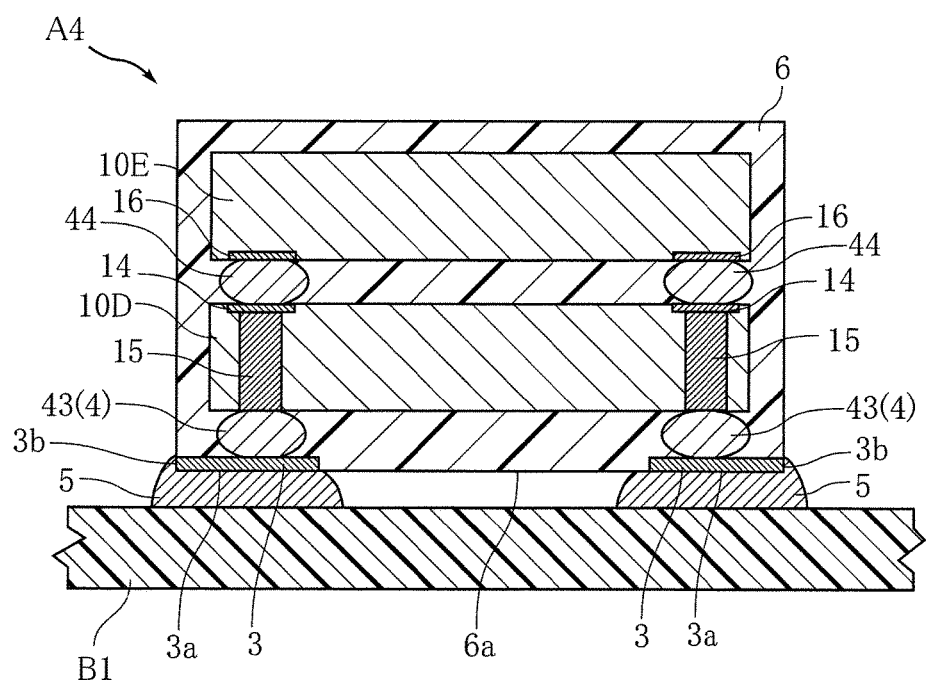
FIG. 14 is a cross-sectional view showing a semiconductor device based on Embodiment 4-A of the present invention.

FIG. 14 shows a semiconductor device that is based on Embodiment 4-A of the present invention. The semiconductor device A4 shown in FIG. 14 is provided with 2 semiconductor elements 10D and 10E, a pair of terminals 3, 4 solder bumps 43 and 44, and a sealing resin 6. As shown in FIG. 14, with the semiconductor device A4, the semiconductor element 10D and the semiconductor element 10E are disposed so as to overlap in the z direction. The remaining configuration of the semiconductor device A4 is similar to the semiconductor device A2.

The semiconductor element 10D consists of a semiconductor material such as Si, and has a micro-circuit built therein. As shown in FIG. 14, the semiconductor element 10D is provided with a pair of electrodes 14 provided on the top surface, and a pair of copper through-silicon vias (hereinafter, TSVs) 15. As shown in FIG. 14, the TSVs 15 are each connected to one of the pair of electrodes 14, and pass through the semiconductor material of the semiconductor element 10D in the z direction. The TSVs 15 are connected to the solder bumps 43 at a lower end thereof in the z direction in FIG. 14. The solder bumps 43 connected to the TSVs 15 are connected to the terminals 3.

The semiconductor element 10E consists of a semiconductor material such as Si, and has a micro-circuit built therein. As shown in FIG. 14, a pair of electrodes 16 are provided on the bottom surface of the semiconductor element 10E. The pair of electrodes 16 are connected to the micro-circuit in the semiconductor element 10E. The electrodes 16 are connected to the solder bumps 44. The solder bumps 44 connected to the electrodes 16 are each connected to one of the pair of electrodes 14 of the semiconductor element 10D.

Such a configuration enables the number of semiconductor elements per unit area to be increased, compared with the case where the two semiconductor elements 10D and 10E are separately resin sealed and incorporated in an electronic circuit. Accordingly, the semiconductor device A4 is provided with a useful configuration in downsizing the substrate.

Semiconductor devices and methods for manufacturing the semiconductor devices that are based on the present invention are not limited to the abovementioned embodiments. Various design changes can be made to the specific configurations of the semiconductor devices and the methods for manufacturing semiconductor devices that are based on the present invention. Although a copper plate is used as the base 7 in the abovementioned embodiments, materials other than a copper plate may be used as the base 7. For example, it is also possible to use paper as the base 7. In this case, the base 7 is removed by tearing the base 7 off from the sealing resin 6. Since the process of dissolving the base 7 with a solution does not need to be performed at this time, there is less need to place the gold third metal layer 330 on the bottom surface 3a side of the terminals 3. In such a case, the third metal layer 330 may be formed with a cheaper material such as silver or palladium.

Also, although the terminals 3 are constituted by the first to third metal layers 310, 320 and 330 in the abovementioned embodiment, the present invention is not limited to such a configuration. The terminals 3 may be a single metal layer or may be constituted by a larger number of metal layers. The first to third metal layers 310, 320 and 330 are also not limited to the abovementioned examples, and may be appropriately selected.

Also, although the process of forming the terminals 3 is performed with electroless plating in the abovementioned embodiment, other methods capable of forming thin-film terminals 3 may be used. For example, similar terminals 3 can also be formed by sputtering.

Although the method of fixing the semiconductor element 10A of the semiconductor device A3 employs the configuration of the semiconductor device A2, this is merely an example. The method of fixing the semiconductor element 10A of the semiconductor device A3 may employ the configuration of either the semiconductor device A1 or A2. Also, although the method of fixing the semiconductor element 10D of the semiconductor device A4 employs the configuration of the semiconductor device A2, this is merely an example. The method of fixing the semiconductor element 10D of the semiconductor device A4 may employ the configuration of either the semiconductor device A1 or A2.

Hereinafter, semiconductor devices and methods for manufacturing the semiconductor devices that are for solving the first object of the present invention will be specifically described with reference to FIGS. 15 to 36.

Embodiment 1-B

Figure 15:
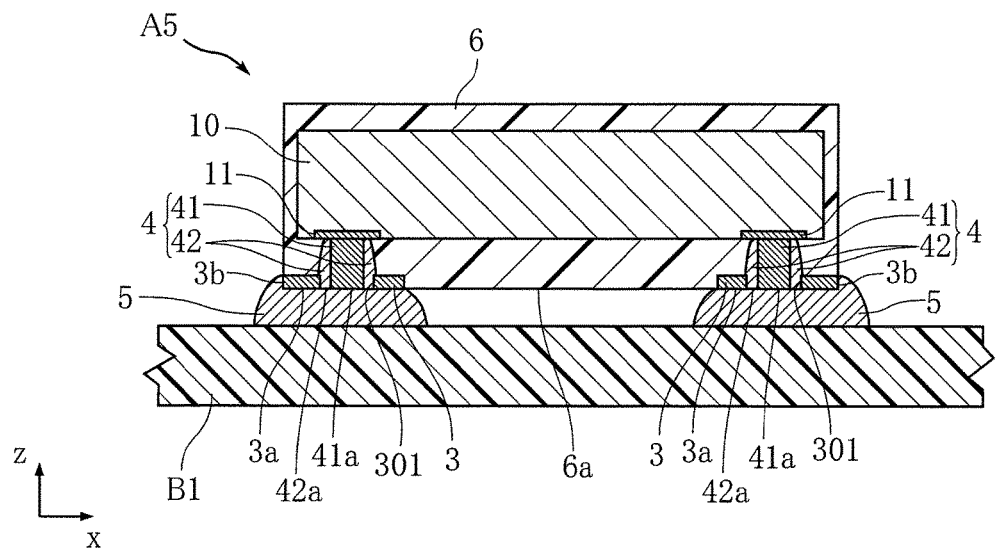
FIG. 15 is a cross-sectional view showing a semiconductor device based on Embodiment 1-B of the present invention.
Figure 16:
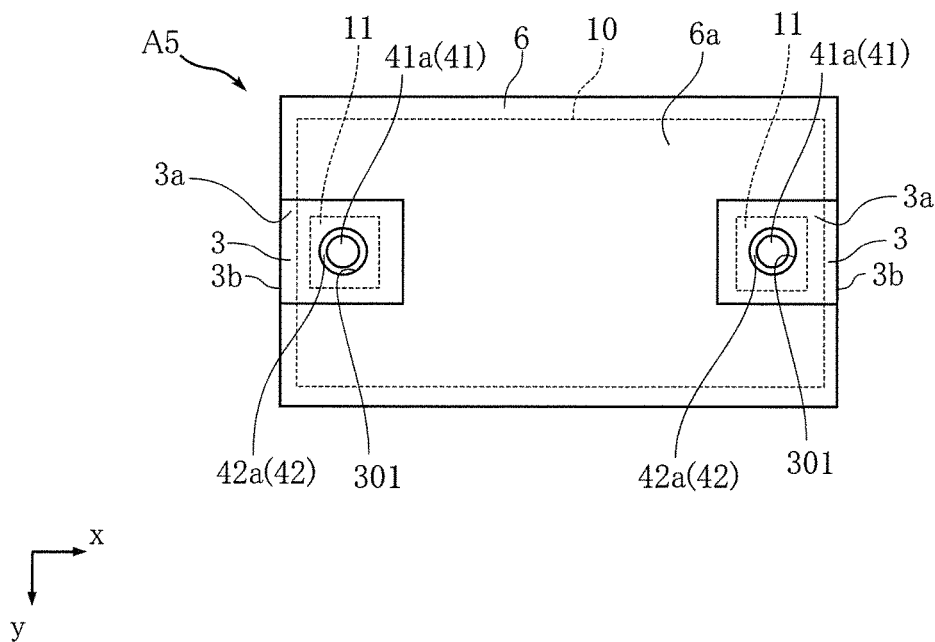
FIG. 16 is a bottom view of the semiconductor device shown in FIG. 15.
Figure 17:
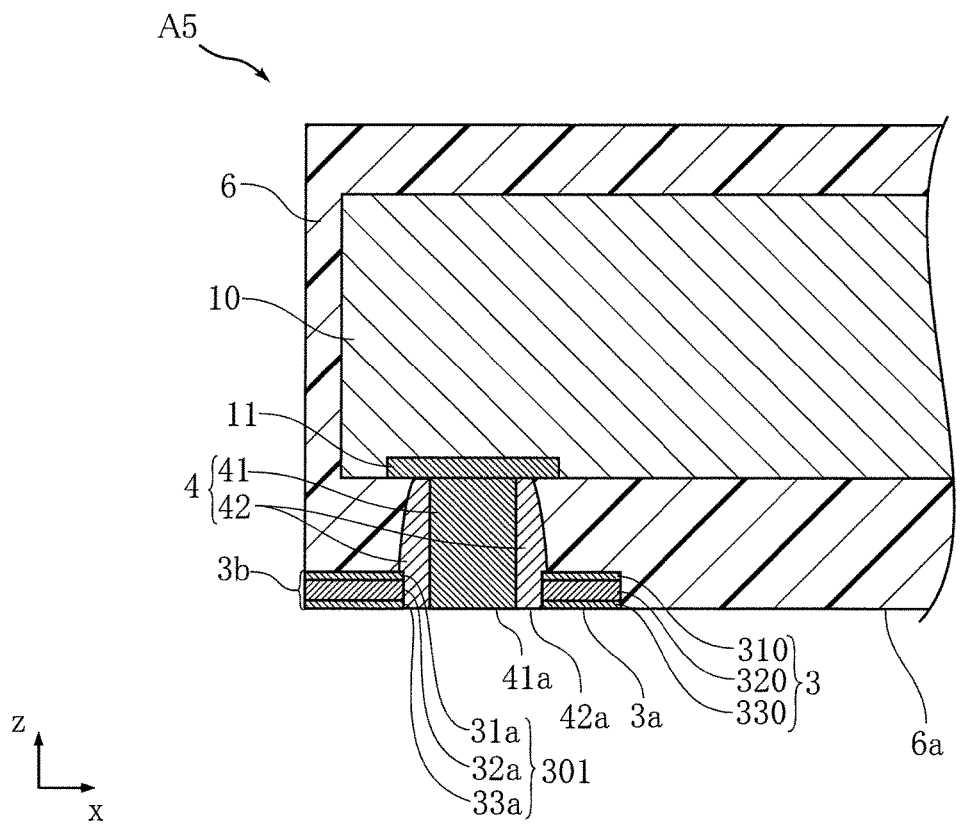
FIG. 17 is an enlarged cross-sectional view of a main portion of the semiconductor device shown in FIG. 15.

FIGS. 15 to 17 show a semiconductor device that is based on Embodiment 1-B of the present invention. A semiconductor device A5 of the present embodiment is provided with a semiconductor element 10, a pair of terminals 3, a pair of conductive connection members 4, and a sealing resin 6. Note that the x, y, and z directions that are used in the following description are directions that are orthogonal to each other, and that the z direction is the thickness direction of the sealing resin 6, the semiconductor element 10, and the terminals 3. Also, hereinafter, the lower side in FIG. 15 in the z direction is the bottom side, and the upper side in FIG. 15 is the top side.

As shown in FIG. 15, the semiconductor device A5 is fixed for use to a substrate B1 by solder 5. A wiring pattern not shown is formed on the top surface of the substrate B1. The solder 5 electrically connects the wiring pattern not shown to the pair of terminals 3. Note that, in FIG. 17, the substrate B1 and the solder 5 are omitted.

The sealing resin 6 completely covers the semiconductor element 10, and covers the pair of terminals 3 such that a bottom surface 3a and a side surface 3b of the pair of terminals 3 are exposed. The sealing resin 6 consists of a black epoxy resin, for example, and is formed in a rectangular parallelepiped shape that is long in the x direction shown in FIG. 15. As an example, the dimensions of the sealing resin 6 in the x, y, and z directions are respectively 2.10 mm, 1.60 mm, and 0.2-0.3 mm. These dimensions can be appropriately changed according to the size of the semiconductor element 10.

The semiconductor element 10 consists of a semiconductor material such as Si, and a micro-circuit is built therein. A pair of electrodes 11 are formed on the bottom surface of the semiconductor element 10. The pair of electrodes 11 are placed so as to be spaced from each other in the x direction. The pair of electrodes 11 are connected to the micro-circuit in the semiconductor element 10. The semiconductor element 10 is incorporated for use in an electronic circuit. At that time, the semiconductor element 10 exhibits the function thereof as a result of connecting the pair of electrodes 11 to the wiring in the electronic circuit. Note that, in the present embodiment, the number of electrodes 11 is given as two for simplification of description. The number of the electrodes 11 can be appropriately changed according to the function of the semiconductor element 10.

The pair of terminals 3 are, as shown in FIG. 16, spaced from each other in the x direction, and are disposed so as to partially overlap the pair of electrodes 11 when viewed in the z direction. Each terminal 3, when viewed in the z direction, has a rectangular shape that is long in the x direction, and has a length in the x direction of 0.2 mm, for example. As shown in FIG. 15, the right end portion of the terminal 3 disposed on the right of the diagram in the x direction projects at a position that does not overlap the semiconductor element 10 when viewed in the z direction, and the side surface 3b on the right is flush with the side surface on the right side of the sealing resin 6. The left end portion of the terminal 3 disposed on the left of the diagram in the x direction projects at a position that does not overlap the semiconductor element 10 when viewed in the z direction, and the side surface 3b on the left is flush with the side surface on the left side of the sealing resin 6. Furthermore, the bottom surface 3a of each terminal 3 is flush with the bottom surface 6a of the sealing resin 6. Note that the number of terminals 3 depends on the number of electrodes 11 of the semiconductor element 10, and can be appropriately changed according to the function of the semiconductor element 10.

The pair of terminals 3 each have a through hole 301 that passes through in the z direction formed therein. As shown in FIG. 16, the through holes 301 are circular when viewed in the z direction, and are provided in positions that overlap the electrodes 11.

As shown in FIG. 17, the terminals 3 have a thickness of 0.02-0.03 mm, for example, and are provided with a first metal layer 310, a second metal layer 320, and a third metal layer 330. The first metal layer 310 is made from palladium, and has a thickness in the z direction of 5 μm. The first metal layer 310 is disposed on the top surface side in the z direction. The second metal layer 320 consists of a different material from the first metal layer 310, and is formed so as to be thicker in the z direction than the first metal layer 310. Specifically, the second metal layer 320 is made from nickel and has a thickness in the z direction of 20 μm. In the example shown in FIG. 17, the second metal layer 320 is disposed so as to contact the bottom surface of the first metal layer 310. The third metal layer 330 consists of a different material from the second metal layer 320. The third metal layer, specifically, is made from gold, and has a thickness in the z direction of 5 μm. The third metal layer 330 is disposed on the bottom surface side in the z direction. The bottom surface 3a of the terminal 3 is the bottom surface of the third metal layer 330.

The first to third metal layers 310, 320 and 330 respectively have a first opening 31a, a second opening 32a and a third opening 33a that pass through in the z direction formed therein. The first opening 31a, the second opening 32a and the third opening 33a are the same shape when viewed in the z direction, and form the through holes 301.

The pair of conductive connection members 4 are, as shown in FIG. 15, each provided between an electrode 11 and a through hole 301 that overlap when viewed in the z direction, and electrically connect the electrode 11 to the terminal 3. Each conductive connection member 4 is provided with a columnar member 41 and a fixing member 42.

The columnar member 41 is a post made from copper or gold, for example, and is formed in a columnar shape whose height direction is in the z direction. As shown in FIG. 16, the columnar member 41 is disposed on the inside of the through hole 301 when viewed in the z direction. As shown in FIG. 17, the top surface of the columnar member 41 in the z direction contacts the electrode 11. The columnar member 41 enters into the through hole 301, and the position of the bottom surface 41a of the columnar member 41 in the z direction is the same position as the bottom surface 3a of the terminal 3. The bottom surface 41a contacts the solder 5.

The fixing member 42 is filled into the through hole 301, and is formed so as to cover the columnar member 41. In the example shown in FIG. 17, a portion of the electrode 11 is also covered. The terminal 3 is fixed to the columnar member 41 by the fixing member 42. A bottom surface 42a of the fixing member 42 is in the same position in the z direction as the bottom surface 3a of the terminal 3. The bottom surface 42a contacts the solder 5. The fixing member 42 is made from silver, for example.

The solder 5 that connects the semiconductor device A5 to the substrate B1 is, as shown in FIG. 15, formed so as to cover the bottom surface 3a and the side surface 3b of the terminals 3.

Next, an exemplary method for manufacturing the semiconductor device A5 will be described below, with reference to FIGS. 18 to 24.

A base 7 is used in manufacturing the semiconductor device A5. The base 7 is, for example, a copper plate having a thickness in the z direction of about 0.125 mm. The base 7 has, for example, a rectangular shape when viewed in the z direction, and is large enough to contain a large number of semiconductor devices A5.

Figure 18:
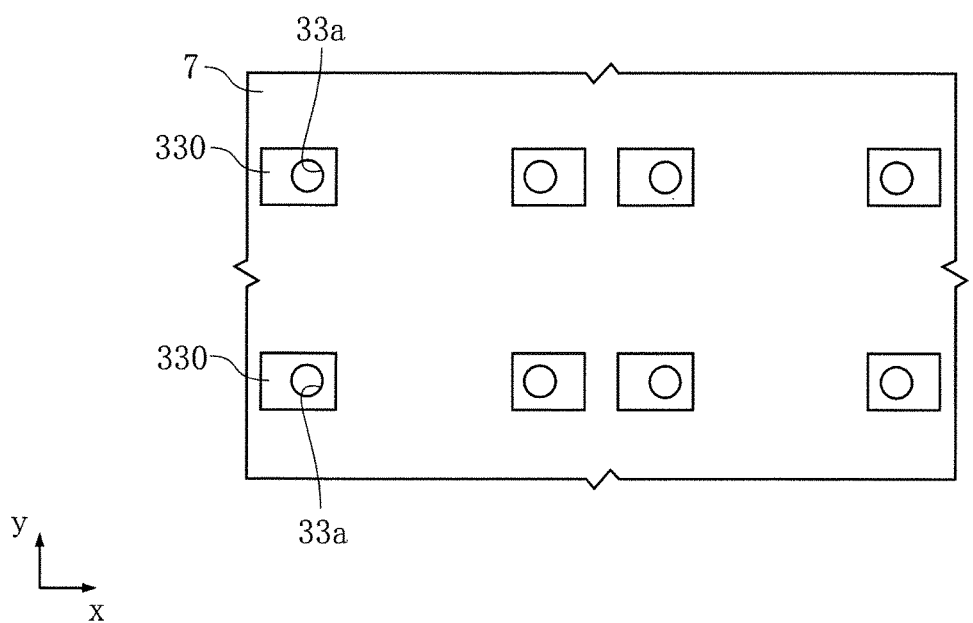
FIG. 18 is a plan view of the main portion showing a state where a third metal layer has been formed on a base, in an exemplary method for manufacturing the semiconductor device of FIG. 15.

When manufacturing the semiconductor device A5, first a process of preparing the base 7 and forming a plurality of terminals 3 on the top surface of the base 7 is performed. In the process of forming the terminals 3, first a process of forming the third metal layer 330 is performed. In this process, a metal plating layer is formed over the entire top surface of the base 7 by electroless plating, for example. Thereafter the metal plating layer is formed into a desired shape by etching. Such processing enables a plurality of third metal layers 330 in which the third opening 33a is formed to be formed, as shown in FIG. 18.

Figure 19:
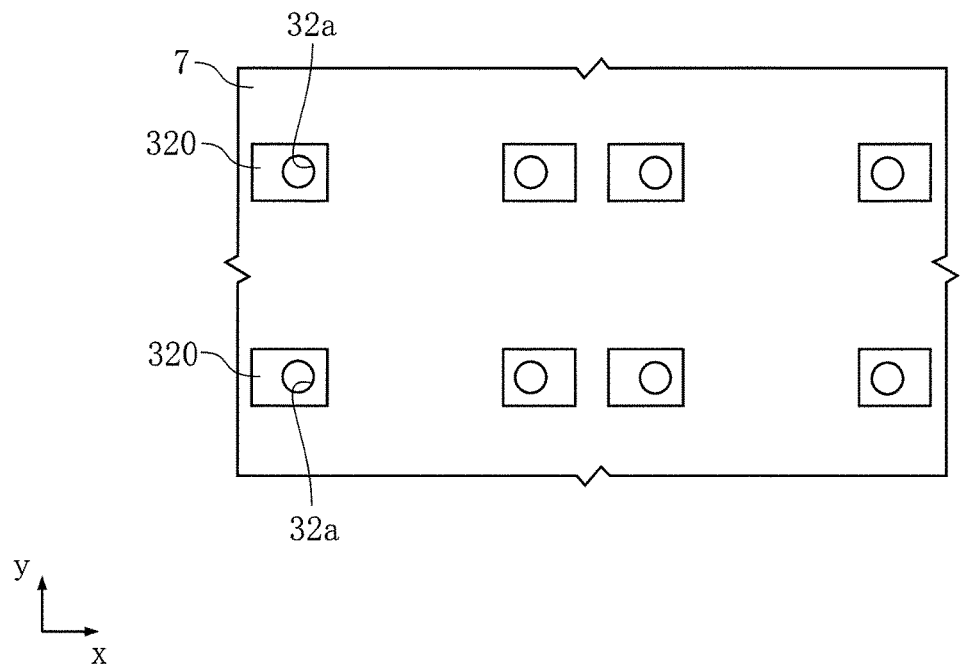
FIG. 19 is a plan view of the main portion showing a state where a second metal layer has been formed on the base, in an exemplary method for manufacturing the semiconductor device of FIG. 15.

Next, a process of forming the second metal layer 320 is performed. This process is performed by forming a nickel plating layer on the second metal layer 320 by electroless plating, and removing unnecessary portions of the nickel plating layer by etching. This process enables a plurality of second metal layers 320 in which the second opening 32a is formed to be formed, as shown in FIG. 19.

Figure 20:
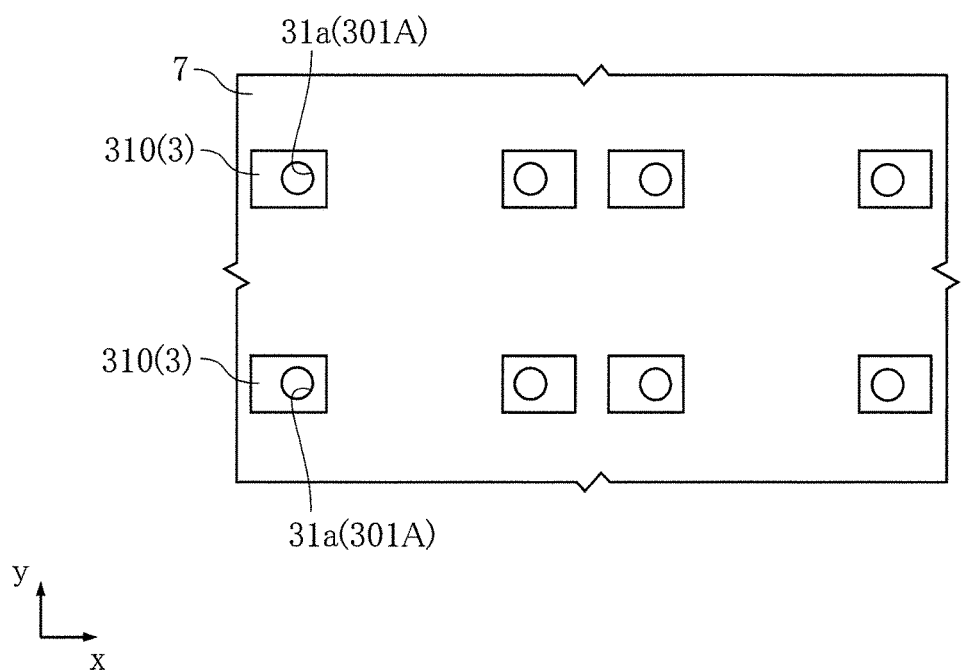
FIG. 20 is a plan view of the main portion showing a state where a first metal layer has been formed on the base, in an exemplary method for manufacturing the semiconductor device of FIG. 15.

Next, a process of forming the first metal layer 310 is performed. This process is performed by forming a palladium plating layer on the second metal layer 320 by electroless plating, and removing unnecessary portions of the palladium plating layer by etching. This process enables a plurality of first metal layers 310 in which the first opening 31a is formed to be formed, as shown in FIG. 20. As a result of these processes, terminals 3 having a recessed portion 301A are formed. Note that the bottom surface of the recessed portion 301A is the top surface of the base 7.

Figure 21:
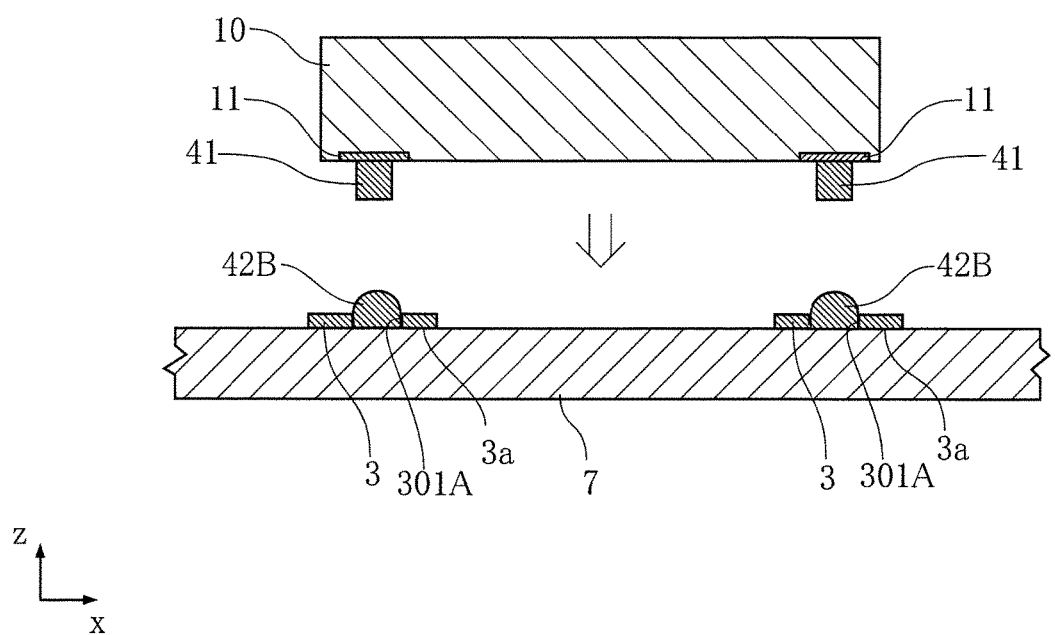
FIG. 21 is a cross-sectional view of the main portion showing a process of forming a conductive connection member, in an exemplary method for manufacturing the semiconductor device of FIG. 15.
Figure 22:
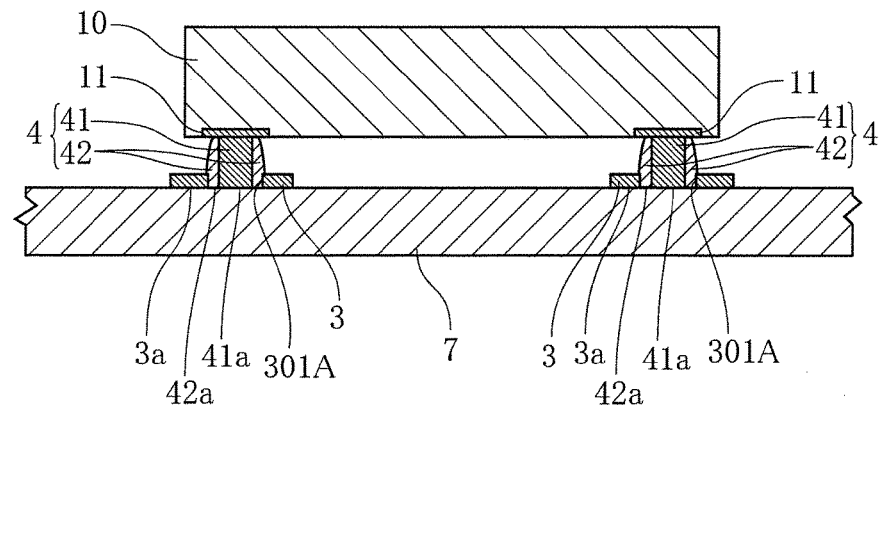
FIG. 22 is a cross-sectional view of the main portion showing a state where the conductive connection member has been formed, in an exemplary method for manufacturing the semiconductor device shown in FIG. 15.

Next, a process of forming the conductive connection members 4 is performed. In this process, first a process of forming a columnar member 41 on each electrode 11 of the semiconductor element 10 is performed. This process is performed by, for example, providing the semiconductor element 10 with a resist having openings corresponding to the columnar members 41, and filling the opening portions with gold or copper. Alternatively, a semiconductor element 10 provided with posts in advance may be prepared. Next, as shown in FIG. 21, a process of placing silver paste 42B in the recessed portions 301A, and a process of placing the semiconductor element 10 to which the columnar members 41 are attached on the base 7 are performed. The process of placing the silver paste 42B can be performed by printing, for example. The process of placing the semiconductor element 10 on the base 7 is performed by pressing the semiconductor element 10 against the base 7 so that the columnar members 41 stick into the silver paste 42B. As a result of this process, the columnar members 41 are pushed into the silver paste 42B, and the bottom surface 41a of the columnar members 41 contacts the base 7, as shown in FIG. 22. Furthermore, the silver paste 42B forms into a shape that covers the columnar members 41. This silver paste 42B solidifies to form the fixing members 42. The conductive connection members 4 are formed by the above processes, and the semiconductor element 10 is connected to the terminals 3 via the conductive connection members 4.

Figure 23:
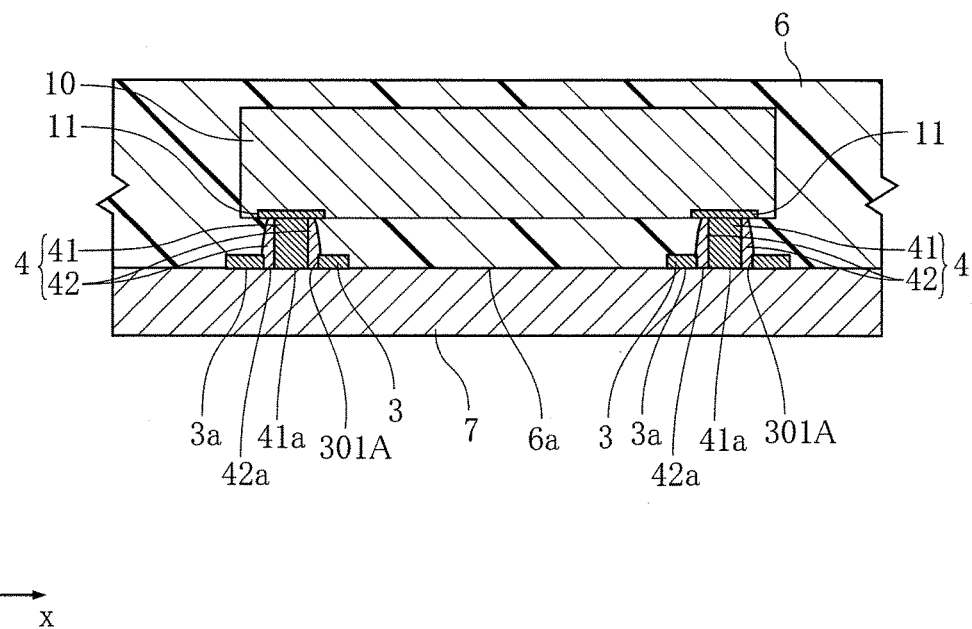
FIG. 23 is a cross-sectional view of the main portion showing a state where a sealing resin has been formed, in an exemplary method for manufacturing the semiconductor device of FIG. 15.

Next, a process of forming the sealing resin 6 is performed. In this process, the plurality of terminals 3 and the semiconductor element 10 are sealed with resin. The state after forming the sealing resin 6 is shown in FIG. 23. This process can be performed using a transfer mold technique, for example. With this technique, processing for placing the base 7 in a metal mold and pouring a liquefied epoxy resin into the metal mold is performed.

Next, a process of removing the base 7 is performed. The process of removing the base 7 is performed by etching the base 7 from the bottom surface side. Note that etching may be performed by mechanical grinding, or may be performed using a solution that dissolves copper. As a result of this process, the bottom surface 3a of the terminals 3, the bottom surface 41a of the columnar members 41, and the bottom surface 42a of the fixing members 42 are exposed at the bottom surface 6a of the sealing resin 6, as shown in FIG. 24. Also, the recessed portions 301A become the through holes 301.

In the state shown in FIG. 24, the sealing resin 6 is the same size as the base 7 when viewed in the z direction. Cutting the sealing resin 6 of FIG. 24 enables the semiconductor device A5 shown in FIG. 15 to be obtained. When cutting the sealing resin 6, the cutting is performed along a two-dot chain line C shown in FIG. 24, for example. An end portion of the terminals 3 is also cut at this time. This results in a configuration in which the side surface 3b is exposed from the sealing resin 6, as shown in FIG. 15.

Next, the working of the semiconductor device A5 and the manufacturing method thereof will be described.

With the abovementioned semiconductor device A5, the columnar members 41 encroach into the through holes 301 formed in the terminals 3, and the terminals 3 are fixed to the columnar members 41 by the fixing members 42 filled into the through holes 301. According to such a structure, the contact area between the fixing members 42 and the terminals 3 is greatly increased compared with the case where the fixing members 42 are provided on the terminals 3 without providing the through holes 301. This is desirable in firmly joining the terminals 3 and the columnar members 41.

The terminals 3 are also fixed by the solder 5 in a state where the semiconductor device A5 is mounted to the substrate B1. There is thus concern that the terminals 3 may separate from the sealing resin 6 while remaining stuck to the solder 5 in the case where an unexpected force is applied to the semiconductor device A5. However, in the present embodiment, as described above, the terminals 3 are firmly fixed to the columnar members 41, and do not readily separate in such a manner. Accordingly, the semiconductor device A5 is provided with a favorable configuration in improving reliability.

As described above, since the semiconductor device A5 is configured so that the terminals 3 do not readily separate, achieving thinner terminals 3 is facilitated. The semiconductor device A5 is thus manufactured with a method that involves forming the terminals 3 by providing a metal plating layer on the base 7 and subsequently removing the base 7. According to such a manufacturing method, much thinner terminals can be anticipated compared with the case where the terminals are formed using a lead as described in the Background Art, for example.

Furthermore, in the present embodiment, the columnar members 41 enter into the through holes 301 provided in the terminals 3. Such a configuration facilitates narrowing of the interval between the semiconductor element 10 and the terminals 3, and is suitable for achieving a thinner semiconductor device A5.

In the present embodiment, the process of cutting the terminals 3 is included in the manufacturing process. When cutting the terminals 3, a force that pulls the terminals 3 in the z direction occurs at the cutting surface. There is thus concern that the edge that is being cut will pull the terminals 3 and cause the terminals 3 to separate from the sealing resin 6. However, in the present embodiment, since the terminals 3 are thinner, the cutting surface at the time of cutting the terminals 3 is small, and the force with which the edge pulls the terminals 3 will also be reduced. Furthermore, since the terminals 3 are made thinner, it is easy to prevent burring when cutting the terminals 3. Accordingly, with the semiconductor device A5, the occurrence of defects at the time of manufacture can be favorably prevented.

In the present embodiment, each terminal 3 is constituted by the first to third metal layers 310, 320 and 330. The second metal layer 320, which is the thickest of the three layers, is comparatively hard, and is not easily deformed compared with gold or the like. The occurrence of burring in the process of cutting the terminals 3 is thus even more easily prevented. Also, nickel is cheap compared with gold, and making the second metal layer 320 thicker is also favorable economically.

In the present embodiment, the side surface 3b of the terminals 3 is exposed from the sealing resin 6. This configuration can be easily realized by adjusting the position at the time of cutting the sealing resin 6, as abovementioned. The thickness and structure of the terminals 3 are desirable in performing this manufacturing method.

As shown in FIG. 15, the solder 5 is formed so as to cover the side surface 3b of the terminals 3. This structure enhances the joining force between the terminals 3 and the solder 5, and is favorable in stably mounting the semiconductor device A5 to the substrate B1, compared with the case where the solder 5 contacts only the bottom surface 3a.

In the present embodiment, the terminals 3 are disposed so as to overlap the semiconductor element 10 when viewed in the z direction. This configuration is desirable in reducing the size of the sealing resin 6 when viewed in the z directional vision.

In the abovementioned manufacturing method, the silver paste 42B is placed in the recessed portions 301A. The silver paste 42B is easily contained within the recessed portions 301A in this way, compared with the case where the silver paste 42B is placed on a flat surface. The silver paste 42B can thus be prevented from spreading to unexpected positions. This is desirable in improving the reliability of the semiconductor device A5. At the same time, the silver paste 42B can be prevented from spreading unnecessarily. This is also advantageous in reducing the area of each terminal 3 when viewed in the z direction. If the area of the terminals 3 when viewed in the z direction can be reduced, the dimensions of the sealing resin 6 in the x and y directions can be downsized.

Note that although etching is performed when forming each of the first to third metal layers 310, 320 and 330 in the abovementioned manufacturing method, the etching may be performed at the one time.

Note that although the silver paste 42B is used in order to form the fixing members 42 in the above embodiments, unleaded solder or high melting point solder, for example, may also be used in some cases. Since the through holes 301 are, however, formed to pass through in the z direction in the present embodiment, some of the fixing members 42 could flow out of the through holes 301 to the substrate B1 side when forming the solder 5, in the case where solder is used as the fixing members 42.

Although the top surface (upper surface in the diagram) of the terminals 3 is a flat surface that comes in contact with the sealing resin 6 in the example shown in FIG. 18, the top surface of the terminals 3 may be a rough surface formed with minute unevenness, as shown in the enlarged view of FIG. 25.

After forming the terminals 3, minute unevenness can be formed on the top surface of the terminals 3 by performing rough surface formation processing. Rough surface formation processing can be performed by blasting, for example. Forming minute unevenness on the top surface of the terminals 3 increases the contact area between each terminal 3 and the sealing resin 6. The terminals 3 can thus be made less likely to separate from the sealing resin 6.

The terminals 3 are a rectangular shape when viewed in the z direction, as shown in FIG. 16. Each terminal 3 has four side surfaces along the four sides of the rectangle. Three of the four side surfaces excluding the side surface 3b are covered by the sealing resin 6, and come in contact with the sealing resin 6. The contact area between each terminal 3 and the sealing resin 6 can also be increased by forming minute unevenness on these side surfaces and creating rough surfaces. Furthermore, the joining force between the terminals 3 and the solder 5 can be further enhanced by providing the side surface 3b with a rough surface having minute unevenness.

FIGS. 26 to 36 show other embodiments of the present invention. Note that, in these diagrams, the same reference signs are given to elements that are the same or similar to the above embodiments.

Embodiment 2-B

Figure 26:
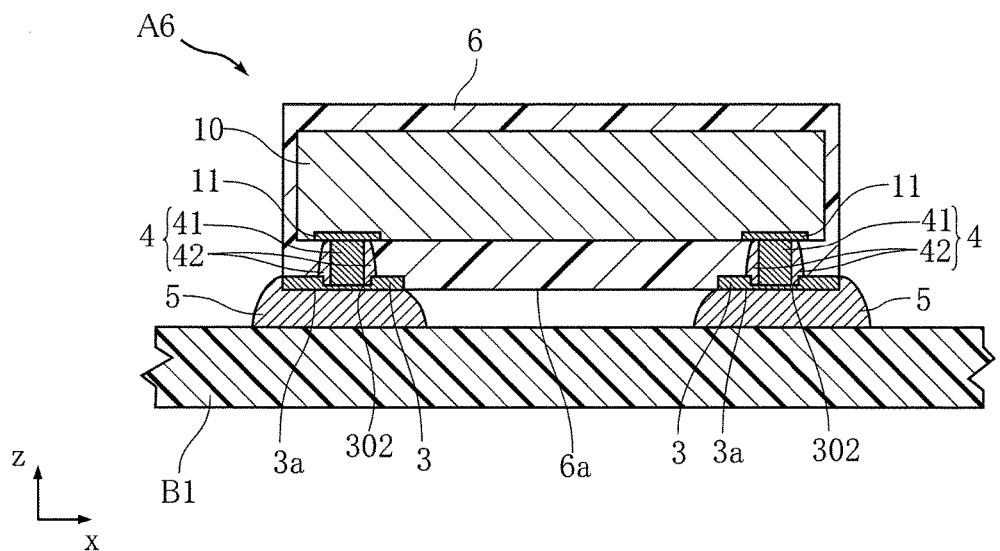
FIG. 26 is a cross-sectional view showing a main portion of a semiconductor device based on Embodiment 2-B of the present invention.
Figure 27:
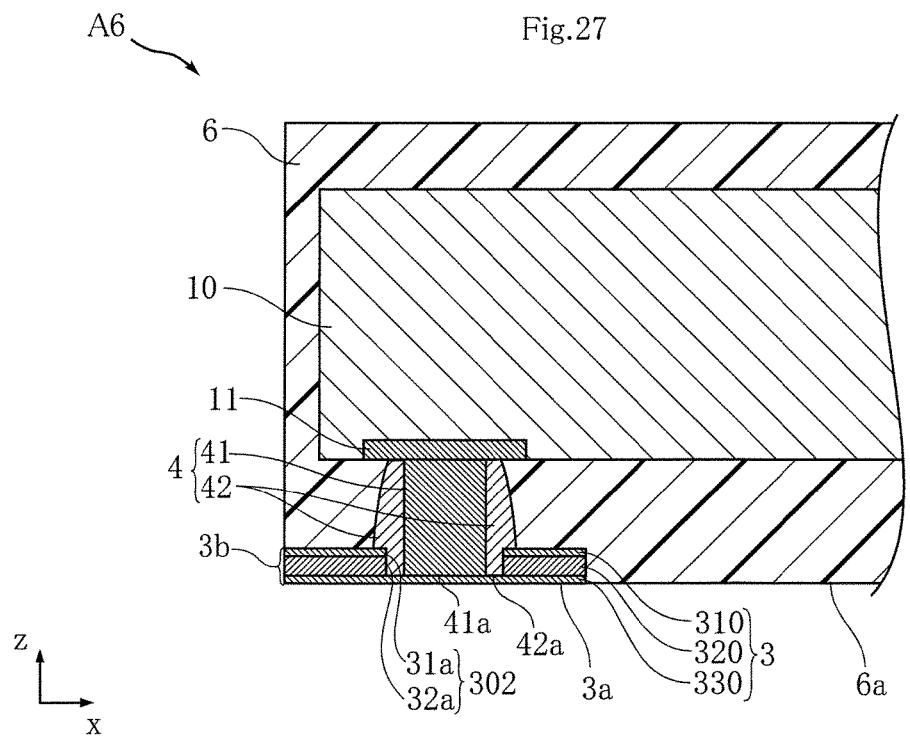
FIG. 27 is an enlarged cross-sectional view of a main portion of the semiconductor device of FIG. 26.
Figure 28:
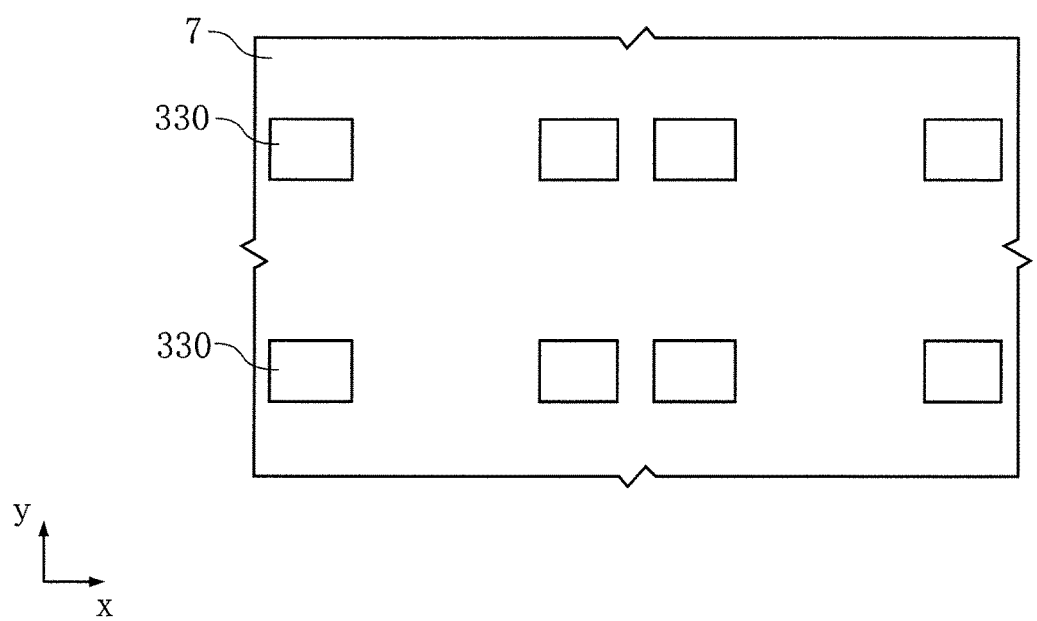
FIG. 28 is a plan view of the main portion in an exemplary method for manufacturing the semiconductor device of FIG. 26.

FIGS. 26 and 27 show a semiconductor device that is based on Embodiment 2-B of the present invention. With the semiconductor device A6 shown in FIGS. 26 and 27, recessed portions 302 that consist of a first opening 31a and a second opening 32a are formed instead of the through holes 301, and the remaining configuration is similar to the semiconductor device A5.

As shown in FIG. 27, with the semiconductor device A6, openings are not formed in a third metal layer 330, unlike the semiconductor device A5. The bottom surface of the recessed portions 302 is thus the top surface of the third metal layer 330. With this configuration, a bottom surface 41a of columnar members 41 and a bottom surface 42a of fixing members 42 come in contact with the top surface of the third metal layer 330.

In a process of forming the third metal layer 330 of the semiconductor device A6, a third metal layer 330 having no openings need only be formed, as shown in FIG. 27.

With such a semiconductor device A6, the recessed portions 302 do not pass through in the z direction, and the fixing members 42 and the solder 5 are separated by the third metal layer 330. Thus, even if the fixing members 42 melt due to the heat generated when heating is performed in order to form the solder 5, for example, the fixing members 42 cannot flow out to the substrate B1 side. Accordingly, with the semiconductor device A6, problems are also unlikely to occur when solder rather than silver paste is employed as the fixing members 42.

Embodiment 3-B

Figure 29:
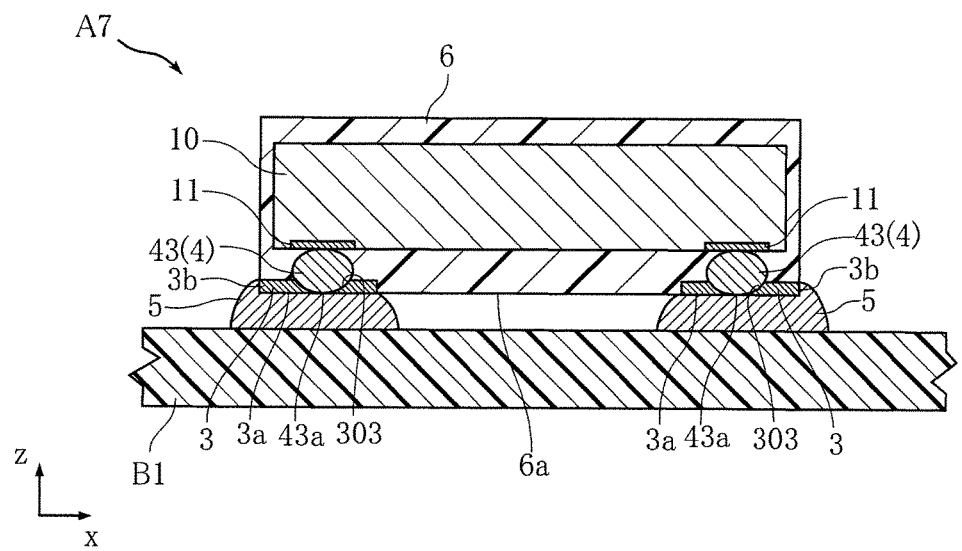
FIG. 29 is a cross-sectional view showing a semiconductor device based on Embodiment 3-B of the present invention.
Figure 30:
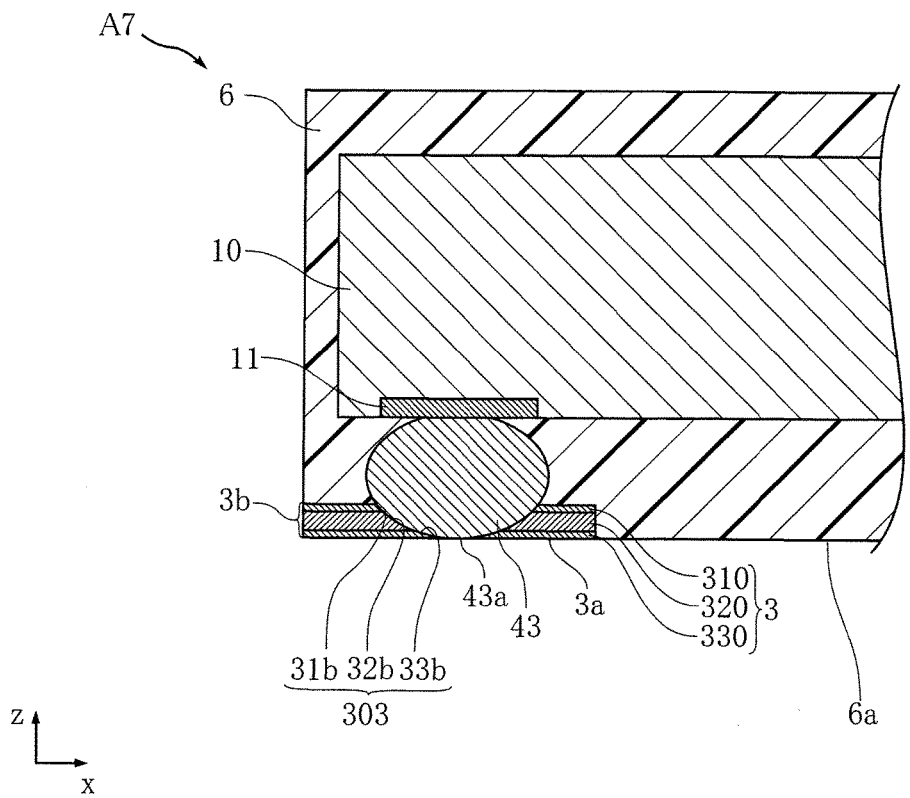
FIG. 30 is an enlarged cross-sectional view of a main portion of the semiconductor device shown in FIG. 29.

FIGS. 29 and 30 show a semiconductor device that is based on Embodiment 3-B of the present invention. A semiconductor device A7 shown in FIGS. 29 and 30 is provided with solder bumps 43 as conductive connection members 4. Through holes 303 into which the solder bumps 43 fit are provided in terminals 3 of the semiconductor device A7. The remaining configuration of the semiconductor device A7 is similar to the semiconductor device A5.

First openings 31b, second openings 32b and third openings 33b that are circular when viewed in the z direction are provided in the first to third metal layers 310, 320 and 330 of the semiconductor device A7. As shown in FIG. 30, the first to third openings 31b, 32b, and 33b are formed such that respective diameters thereof increase in size from bottom to top in the z direction. The through holes 303 are constituted by these first to third openings 31b, 32b, and 33b. Such through holes 303 can be formed by etching, for example. In the present embodiment, a bottom surface 43a of the solder bumps 43 is in the same position in the z direction as a bottom surface 3a of the terminals 3, and contacts solder 5.

The solder bumps 43 can be formed on the electrodes 11 of the semiconductor element 10 by using a known method. Alternatively, a semiconductor element 10 provided with the solder bumps 43 in advance may be prepared.

The contact area between the solder bumps 43 and the terminals 3 can also be increased in such a semiconductor device A7, compared with the case where flat terminals 3 are used, by providing the through holes 303 in the terminals 3. This is desirable in improving the joining strength between the terminals 3 and the solder bumps 43. Furthermore, since the solder bumps 43 encroach into the through holes 303, narrowing of the interval between the semiconductor element 10 and the terminals 3 is facilitated.

Embodiment 4-B

Figure 31:
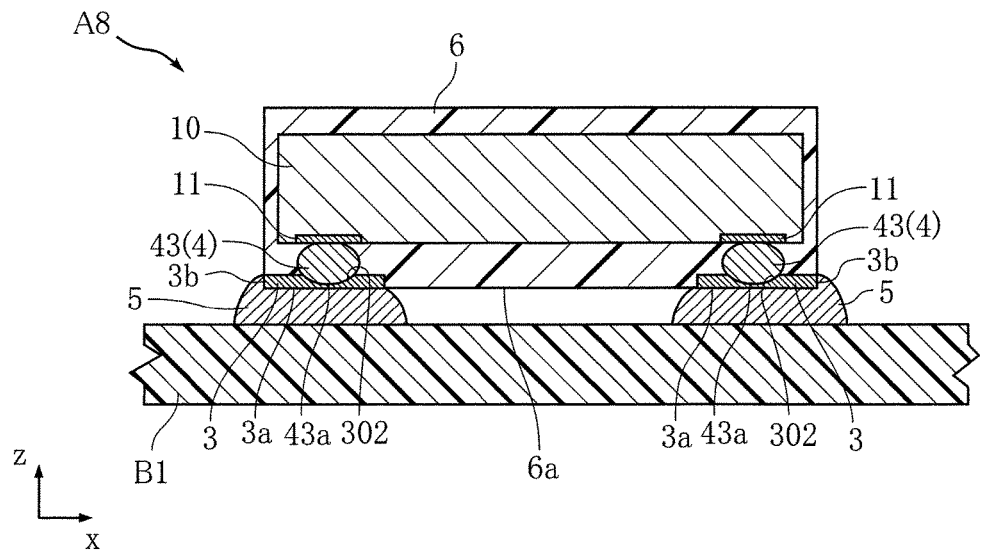
FIG. 31 is a cross-sectional view showing a semiconductor device based on Embodiment 4-B of the present invention.
Figure 32:
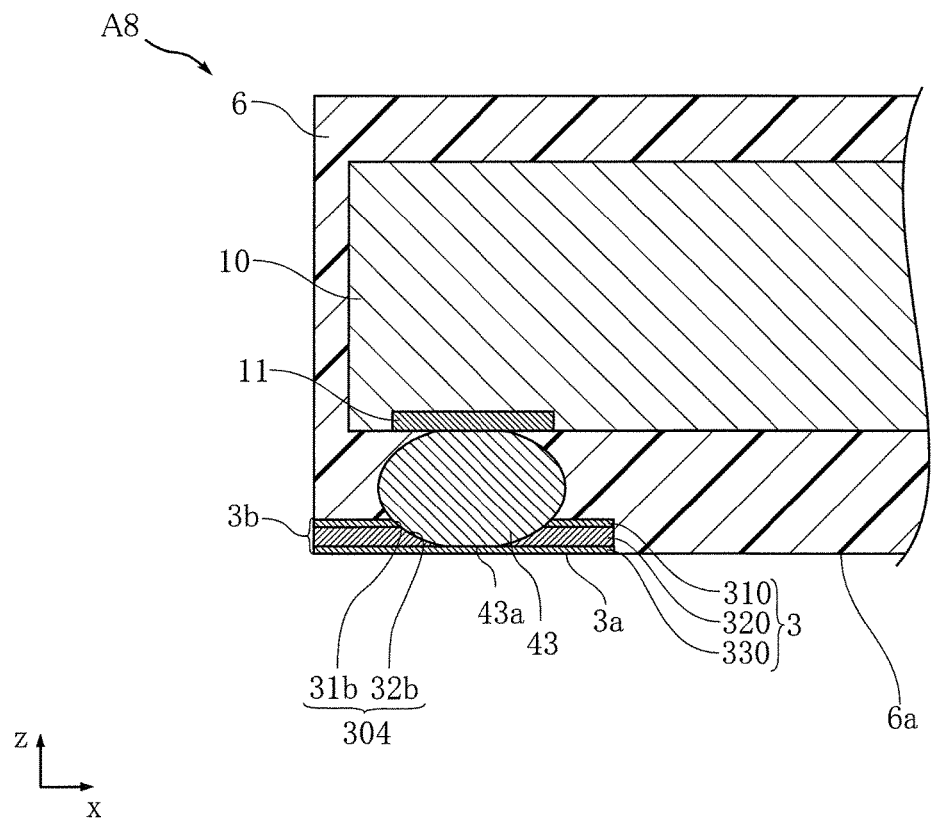
FIG. 32 is an enlarged cross-sectional view of a main portion of the semiconductor device shown in FIG. 31.

FIGS. 31 and 32 show a semiconductor device that is based on Embodiment 4-B of the present invention. In a semiconductor device A8 shown in FIGS. 31 and 32, a recessed portion 304 consisting of a first opening 31b and a second opening 32b is provided in each terminal 3 instead of the through hole 303, and the remaining configuration is similar to the semiconductor device A7.

As shown in FIG. 32, with the semiconductor device A8, an opening is not formed in the third metal layer 330, unlike the semiconductor device A7. The bottom surface of the recessed portions 304 is thus the top surface of the third metal layer 330. With this configuration, a bottom surface 43a of the solder bumps 43 contacts the top surface of the third metal layer 330.

In such a semiconductor device A8, the recessed portions 304 do not pass through in the z direction, and the solder bumps 43 and the solder 5 are separated by the third metal layer 330. Thus, even if the solder bumps 43 melt due to the heat generated when heating is performed in order to form the solder 5, for example, the solder bumps 43 will not flow out to the substrate B1 side. The solder 5 could possibly adhere to unintended places of the substrate B1 when excess solder flows to the solder 5, and this can affect the operation of the semiconductor device A8. The present embodiment enables such problems to be forestalled.

Embodiment 5-B

Figure 33:
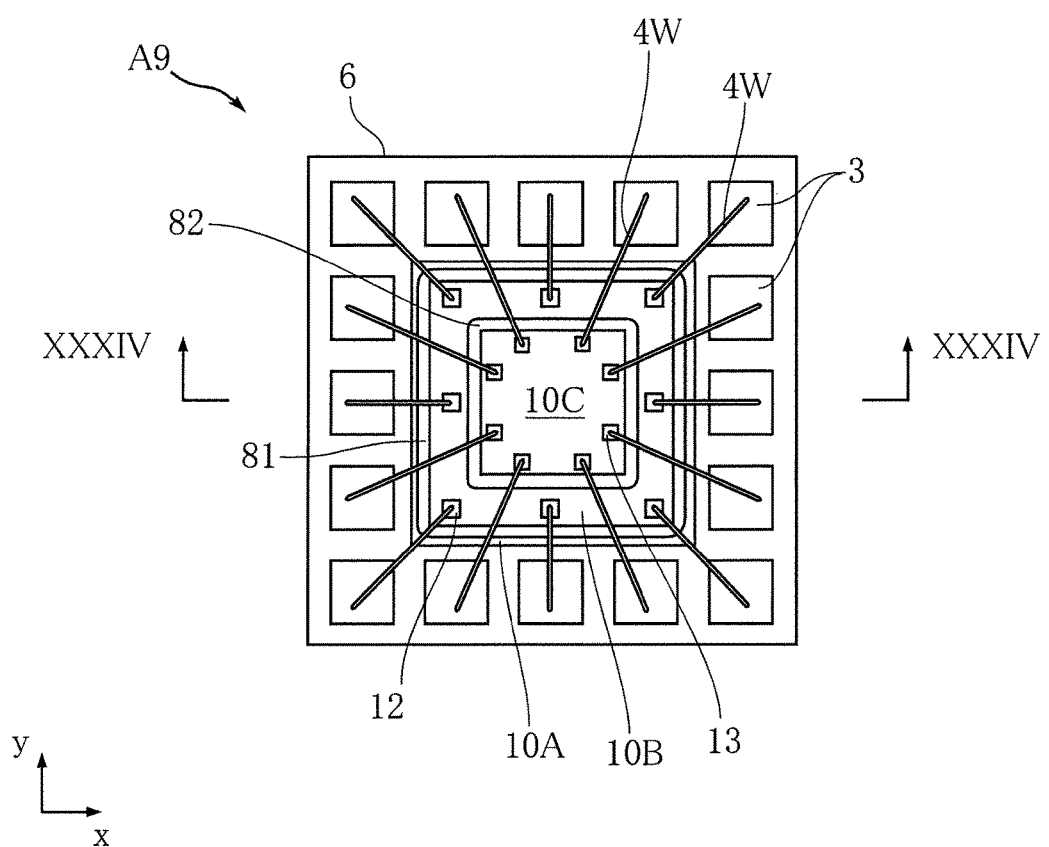
FIG. 33 is a plan view showing a semiconductor device based on Embodiment 5-B of the present invention.
Figure 34:
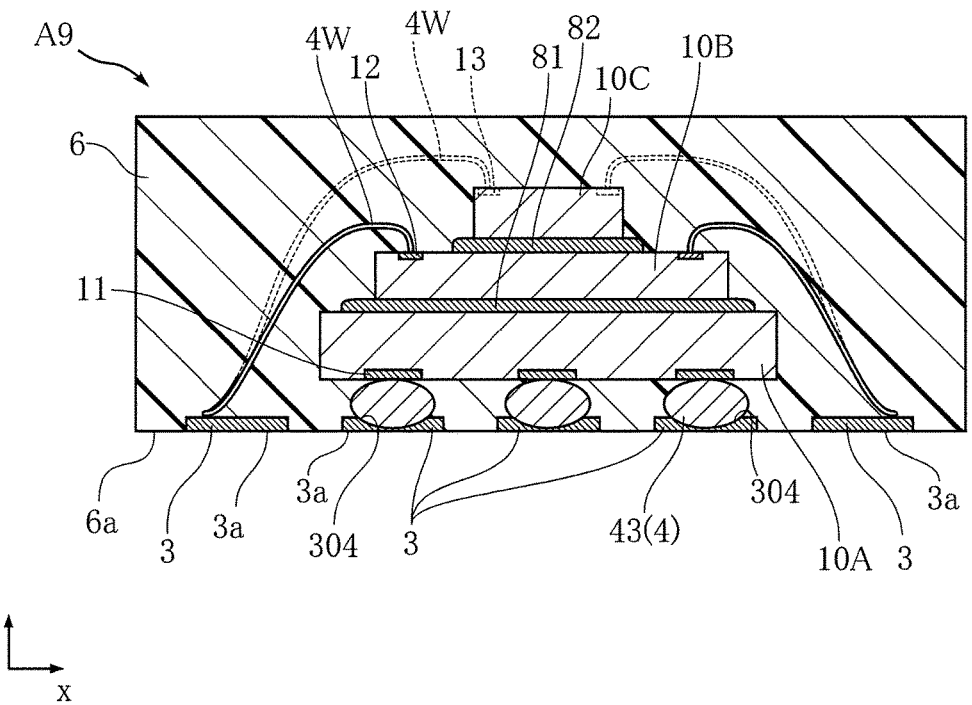
FIG. 34 is a cross-sectional view along line XXXIV-XXXIV in FIG. 33.
Figure 35:
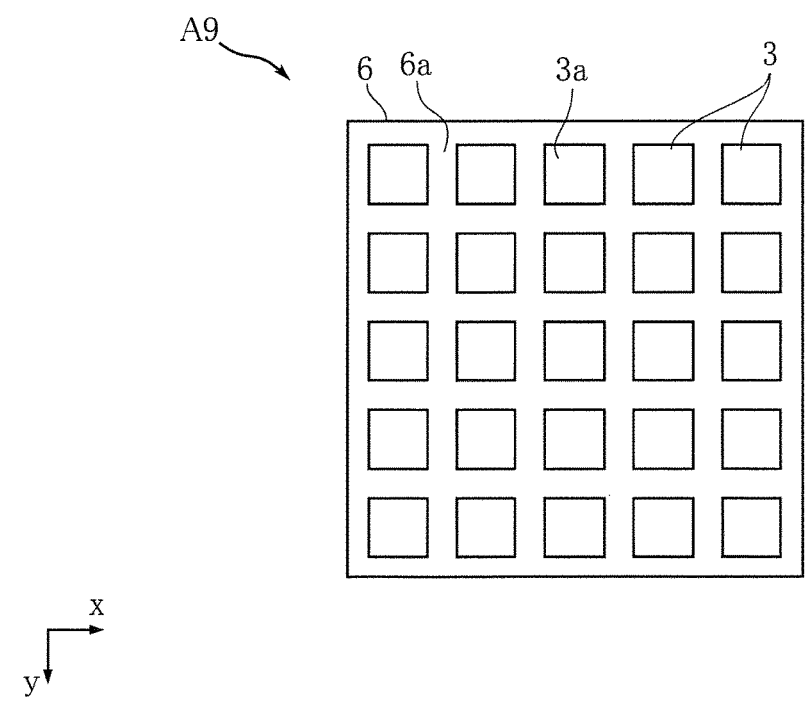
FIG. 35 is a bottom view of the semiconductor device shown in FIG. 33.

FIGS. 33 to 35 show a semiconductor device that is based on Embodiment 5-B of the present invention. Note that although sealing resin 6 is black, for example, and the inside cannot be seen from the outside, the inside of the sealing resin 6 is shown in FIG. 33 for convenience of description.

A semiconductor device A9 of the present embodiment is provided with the sealing resin 6, 3 semiconductor elements 10A, 10B and 10C, 25 terminals 3, 9 solder bumps 43, 16 wires 4W, and joining members 81 and 82. The semiconductor device A9 is an example of an area array semiconductor device, and, as shown in FIG. 35, the 25 terminals 3 are disposed in a grid when viewed in the z direction. Of the 25 terminals 3, the 16 outer terminals 3 are connected to the semiconductor elements 10B and 10C, and the 9 inner terminals 3 are connected to the semiconductor element 10A. In the present embodiment, the terminals 3 have a square shape when viewed in the z direction.

The sealing resin 6 completely covers the semiconductor elements 10A, 10B and 10C, the solder bumps 43, the wires 4W, and the joining members 81 and 82, and covers the terminals 3 such that a bottom surface 3a of the terminals 3 is exposed. The sealing resin 6 consists of an epoxy resin, for example, and is formed to have a square shape when viewed in the z direction.

The semiconductor element 10A consists of a semiconductor material such as Si, and has a micro-circuit built therein. In the example shown in FIG. 33, the semiconductor element 10A has a square shape when viewed in the z direction, and is disposed inside the rectangular frame formed by the 16 terminals 3. 9 electrodes 11 arranged in a grid when viewed in the z direction are provided on the bottom surface of the semiconductor element 10A. The electrodes 11 are connected to the micro-circuit in the semiconductor element 10A. Note that the number of electrodes 11 can be appropriately changed according to the function of the semiconductor element 10A.

Of the 25 terminals 3, the 9 inner terminals 3 are disposed in positions that overlap the semiconductor element 10A when viewed in the z direction. More specifically, the 9 terminals 3 are disposed so as to oppose the 9 electrodes 11 provided on the bottom surface of the semiconductor element 10A. Recessed portions 304 that are similar to the recessed portions 304 of the semiconductor device A9 are formed in these 9 terminals 3. The solder bumps 43 are provided so as to contact the recessed portions 304 and the electrodes 11. The solder bumps 43 are conductive connection members in the present invention, and electrically connect and join the electrodes 11 to the terminals 3.

The semiconductor element 10B consists of a semiconductor material such as Si, and has a micro-circuit built therein. In the example shown in FIG. 33, the semiconductor element 10B has a square shape that is smaller than the semiconductor element 10A when viewed in the z direction. The bottom surface of the semiconductor element 10B is fixed to the top surface of the semiconductor element 10A via the joining member 81. 8 electrodes 12 are provided on the top surface of the semiconductor element 10B. The 8 electrodes 12 are arranged on a peripheral portion of the top surface such that a central portion of the semiconductor element 10B when viewed in the z direction is clear. In the example shown in FIG. 33, the electrodes 12 are disposed at both ends and in proximity to the middle of each side of the top surface of the semiconductor element 10B. The electrodes 12 are connected to the micro-circuit in the semiconductor element 10B. Note that the number of electrodes 12 can be appropriately changed according to the function of the semiconductor element 10B.

The semiconductor element 10C consists of a semiconductor material such as Si, and has a micro-circuit built therein. In the example shown in FIG. 33, the semiconductor element 10C has a square shape that is smaller than the semiconductor element 10B when viewed in the z direction. The bottom surface of the semiconductor element 10C is fixed to the top surface of the semiconductor element 10B via the joining member 82. 8 electrodes 13 are provided on the top surface of the semiconductor element 10C. In the example shown in FIG. 33, the 8 electrodes 13 are disposed in positions that do not overlap the 8 electrodes 12 when viewed in the x direction or the y direction. The electrodes 13 are connected to the micro-circuit in the semiconductor element 10C. Note that the number of electrodes 13 can be appropriately changed according to the function of the semiconductor element 10C.

The joining members 81 and 82 are composed of DAF tape, for example. As shown in FIG. 33, the joining member 81 has a rectangular shape when viewed in the z direction, and covers a large portion of the top surface of the semiconductor element 10A. As aforementioned, the electrodes 11 of the semiconductor element 10A are provided on the bottom surface side. The joining member 81 can thus be made substantially the same size as the semiconductor element 10A. This works advantageously when placing a comparatively large semiconductor element 10B on the semiconductor element 10A. The joining member 82 is placed on the inside of the frame created by the 8 electrodes 12. Note that the joining members 81 and 82 are not limited to DAF tape, and insulating paste may also be used.

As shown in FIG. 33, the electrodes 12 and 13 are connected to the terminals 3 by the gold wires 4W. The wires 4W can be formed using a commercial wire bonding capillary, for example.

When manufacturing such a semiconductor device A9, a process of placing the semiconductor elements 10B and 10C on the semiconductor element 10A, and a process of connecting the electrodes 12 and 13 to the terminals 3 with the wires 4W are provided. These processes are performed before the process of forming the sealing resin 6. Also, the process of placing the semiconductor element 10A of the semiconductor device A9 is equivalent to the process of placing the semiconductor element 10 of the semiconductor device A5.

The semiconductor device A9 is mounted for use to a substrate incorporated in any of a variety of electronic devices. Incorporating as many semiconductor elements inside the same area as possible is effective in downsizing the substrate. In the semiconductor device A9, the semiconductor element 10B is fixed to the top surface of the semiconductor element 10A, and the semiconductor element 10C is further fixed to the top surface of the semiconductor element 10B. Such a configuration enables the number of semiconductor elements per unit area to be increased, compared with the case where the three semiconductor elements 10A, 10B and 10C are separately resin sealed and incorporated in an electronic circuit. Accordingly, the semiconductor device A9 is provided with a useful configuration in downsizing the substrate.

With the abovementioned semiconductor device A9, the semiconductor elements 10B and 10C are placed on the semiconductor element 10A, but a configuration in which only the semiconductor element 10B is placed on the semiconductor element 10A is possible. A configuration in which another semiconductor element is further placed on the semiconductor element 10C can also be implemented.

Embodiment 6-B

Figure 36:
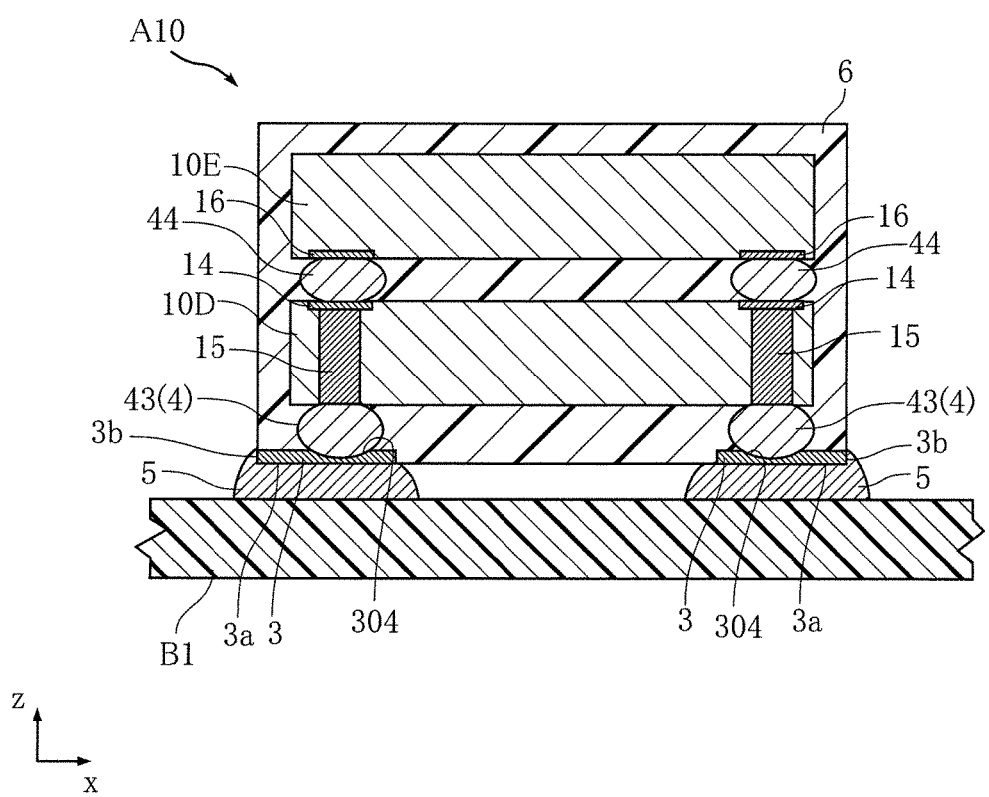
FIG. 36 is a cross-sectional view showing a semiconductor device based on Embodiment 6-B of the present invention.

FIG. 36 shows a semiconductor device that is based on Embodiment 6-B of the present invention. A semiconductor device A10 shown in FIG. 36 is provided with a sealing resin 6, 2 semiconductor elements 10D and 10E, a pair of terminals 3, and 4 solder bumps 43 and 44. As shown in FIG. 36, with the semiconductor device A10, the semiconductor element 10D and the semiconductor element 10E are disposed so as to overlap in the z direction. The remaining configuration of the semiconductor device A10 is similar to the semiconductor device A8.

The semiconductor element 10D consists of a semiconductor material such as Si, and has a micro-circuit built therein. As shown in FIG. 36, the semiconductor element 10D is provided with a pair of electrodes 14 provided on the top surface, and a pair of copper through-silicon vias (hereinafter, TSVs) 15. As shown in FIG. 36, the TSVs 15 are each connected to one of the pair of electrodes 14, and pass through the semiconductor material of the semiconductor element 10D in the z direction. The TSVs 15 are connected to the solder bumps 43 at a lower end thereof in the z direction in FIG. 36. The solder bumps 43 connected to the TSVs 15 are connected to the terminals 3.

The semiconductor element 10E consists of a semiconductor material such as Si, and has a micro-circuit built therein. As shown in FIG. 36, a pair of electrodes 16 are provided on the bottom surface of the semiconductor element 10E. The pair of electrodes 16 are connected to the micro-circuit in the semiconductor element 10E. The electrodes 16 are connected to the solder bumps 44. The solder bumps 44 connected to the electrodes 16 are each connected to one of the pair of electrodes 14 of the semiconductor element 10D.

Such a configuration enables the number of semiconductor elements per unit area to be increased, compared with the case where the two semiconductor elements 10D and 10E are separately resin sealed and incorporated in an electronic circuit. Accordingly, the semiconductor device A10 is provided with a useful configuration in downsizing the substrate.

Semiconductor devices and methods for manufacturing the semiconductor devices that are for solving the first object of the present invention are not limited to the abovementioned embodiments, and various design changes can be made to the specific configurations. Although a copper plate is used as the base 7 in the abovementioned embodiments, materials other than a copper plate may be used as the base 7. For example, it is also possible to use paper as the base 7. In this case, the processing of removing the base 7 is performed by tearing the base 7 off from the sealing resin 6. Since the process of dissolving the base 7 with a solution does not need to be performed at this time, there is less need to place the gold third metal layer 330 on the bottom surface 3a side of the terminals 3. In such a case, the third metal layer 330 may be formed with a cheaper material such as silver or palladium.

Although the process of forming the terminals 3 is performed with electroless plating in the abovementioned embodiments, other methods capable of forming thin-film terminals 3 may be used. For example, similar terminals 3 can also be formed by sputtering.

Also, although the terminals 3 are constituted by first to third metal layers 310, 320 and 330 in the abovementioned embodiments, the present invention is not limited to this configuration. The terminals 3 may be a single metal layer or may be constituted by a larger number of metal layers. Also, the first to third metal layers 310, 320 and 330 are not limited to the abovementioned examples, and may be appropriately selected. For example, the first metal layer 310 may be formed with gold.

Although the method of fixing the semiconductor element 10A of the semiconductor device A9 employs the configuration of the semiconductor device A8, this is merely an example. The method of fixing the semiconductor element 10A of the semiconductor device A9 may employ a configuration of any of the semiconductor devices A5 to A8. Also, although the method of fixing the semiconductor element 10D of the semiconductor device A10 employs the configuration of the semiconductor device A8, this is merely an example. The method of fixing the semiconductor element 10D of the semiconductor device A10 may employ the configuration of any of the semiconductor devices A5 to A8.

Appendix 1

A semiconductor device includes a semiconductor element having a plurality of electrodes; a plurality of terminals that are electrically connected to the plurality of electrodes; and a sealing resin that covers the semiconductor element. The sealing resin covers the plurality of terminals such that one of end faces of the semiconductor element in a thickness direction is exposed, a first terminal, which is any of the plurality of terminals, is disposed in a position that overlaps a first electrode, which is any of the plurality of electrodes, when viewed in the thickness direction, the semiconductor device comprises a conductive connection member that contacts both the first terminal and the first electrode, and the conductive connection member overlaps the first terminal in a first direction that is orthogonal to the thickness direction.

Appendix 2

In the semiconductor device according to appendix 1, the first terminal has a thickness of 0.02-0.03 mm.

Appendix 3

In the semiconductor device according to appendix 2, the first terminal includes a plurality of metal layers, and the plurality of metal layers include a first metal layer, and a second metal layer that is disposed to one side of the first metal layer in the thickness direction and consists of a different material from the first metal layer.

Appendix 4

In the semiconductor device according to appendix 3, the second metal layer is thicker than the first metal layer.

Appendix 5

In the semiconductor device according to appendix 3 or 4, the first metal layer is made from gold or palladium, and the second metal layer is made from nickel.

Appendix 6

In the semiconductor device according to any of appendixes 3 to 5, the first metal layer has formed therein a first opening that passes through in the thickness direction, and the conductive connection member enters into the first opening.

Appendix 7

In the semiconductor device according to appendix 6, the conductive connection member fills the first opening.

Appendix 8

In the semiconductor device according to appendix 6 or 7, the second metal layer has formed therein a second opening that overlaps the first opening when viewed in the thickness direction, and a portion of the conductive connection member enters into the second opening.

Appendix 9

In the semiconductor device according to appendix 8, the conductive connection member fills the second opening.

Appendix 10

In the semiconductor device according to any of appendixes 3 to 9, the plurality of metal layers include a third metal layer that is disposed on one side of the second metal layer in the thickness direction and consists of a different material from the second metal layer.

Appendix 11

In the semiconductor device according to appendix 10, the conductive connection member contacts a surface on the other side of the third metal layer in the thickness direction.

Appendix 12

In the semiconductor device according to appendix 10, an end face on one side of the third metal layer in the thickness direction is exposed from the sealing resin, the third metal layer has formed therein a third opening that overlaps the second opening when viewed in the thickness direction, and a portion of the conductive connection member enters into the third opening.

Appendix 13

In the semiconductor device according to appendix 12, the conductive connection member fills the third opening.

Appendix 14

In the semiconductor device according to any of appendixes 1 to 13, the conductive connection member is provided with a columnar member that contacts the first electrode and a fixing member that fixes the columnar member to the first terminal, and the fixing member overlaps the first terminal when viewed in the first direction.

Appendix 15

In the semiconductor device according to appendix 14, the columnar member overlaps the first terminal when viewed in the first direction.

Appendix 16

In the semiconductor device according to appendix 14 or 15, the columnar member is a post made from copper or gold.

Appendix 17

In the semiconductor device according to any of appendixes 14 to 16, the fixing member is solder.

Appendix 18

In the semiconductor device according to any of appendixes 14 to 16, the fixing member is made from silver.

Appendix 19

In the semiconductor device according to any of appendixes 1 to 13, the conductive connection member is a solder bump.

Appendix 20

In the semiconductor device according to any of appendixes 1 to 19, the plurality of terminals are arranged in a grid when viewed in the thickness direction.

Appendix 21

In the semiconductor device according to any of appendixes 1 to 20, the plurality of terminals have a rough surface that comes in contact with the sealing resin.

Appendix 22

In the semiconductor device according to any of appendixes 1 to 21, the sealing resin covers the first terminal such that one end face of the first terminal in the first direction is exposed.

Appendix 23

In the semiconductor device according to any of appendixes 1 to 22, the sealing resin has a thickness of 0.2-0.3 mm.

Appendix 24

The semiconductor device according to any of appendixes 1 to 21 includes an additional semiconductor element disposed in a position that overlaps the semiconductor element when viewed in the thickness direction, and a plurality of additional terminals that are electrically connected to the additional semiconductor element.

Appendix 25

In the semiconductor device according to appendix 24, the additional semiconductor element has a plurality of additional electrodes, and the semiconductor device is provided with a plurality of wires that connect the additional electrodes to the plurality of additional terminals.

Appendix 26

In the semiconductor device according to appendix 25, the sealing resin covers the plurality of additional terminals such that one end face of the plurality of additional terminals in the thickness direction is exposed.

Appendix 27

In the semiconductor device according to any of appendixes 24 to 26, the plurality of additional terminals are disposed in a rectangular shape that surrounds the plurality of terminals.

Appendix 28

A method for manufacturing a semiconductor device includes a process of forming a plurality of terminals on a base; a process of forming a recessed portion that is recessed in a thickness direction of the base in a first terminal that is any of the plurality of terminals; a process of placing a semiconductor element so as to overlap the first terminal when viewed in the thickness direction of the base; a process of sealing the plurality of terminals and the semiconductor element with resin; and a process of removing the base. The semiconductor element has a plurality of electrodes, and the process of placing the semiconductor element includes a process of forming a conductive connection member that contacts both the first electrode that is one of the plurality of the electrodes and the recessed portion formed in the first terminal.

Appendix 29

In the method for manufacturing a semiconductor device according to appendix 28, the process of forming the plurality of terminals includes a process of forming a metal plating layer on the base.

Appendix 30

In the method for manufacturing a semiconductor device according to appendix 29, the process of forming the recessed portion includes a process of etching the metal plating layer.

Appendix 31

The method for manufacturing a semiconductor device according to appendix 29 or 30 includes a process of forming an additional metal plating layer on the metal plating layer, and the process of forming the recessed portion includes a process of etching the additional metal plating layer.

Appendix 32

In the method for manufacturing a semiconductor device according to any of appendixes 28 to 31, the process of forming the conductive connection member includes a process of forming a columnar member that stands erect in the thickness direction on the first electrode, and a process of fixing the columnar member to the first terminal.

Appendix 33

In the method for manufacturing a semiconductor device according to appendix 32, a post made from copper or gold is formed in the process of forming the columnar member.

Appendix 34

In the method for manufacturing a semiconductor device according to appendix 32 or 33, the process of fixing the columnar member to the first terminal includes a process of placing a solder material in the recessed portion.

Appendix 35

In the method for manufacturing a semiconductor device according to appendix 32 or 33, the process of fixing the columnar member to the first terminal includes a process of placing a silver paste in the recessed portion.

Appendix 36

In the method for manufacturing a semiconductor device according to any of appendixes 28 to 31, the process of forming the conductive connection member includes a process of forming a solder bump between the first electrode and the recessed portion.

Appendix 37

The method for manufacturing a semiconductor device according to any of appendixes 28 to 36 includes a process of performing rough surface formation processing on at least one of the plurality of terminals.

Appendix 38

The method for manufacturing a semiconductor device according to any of appendixes 28 to 37 includes a process of placing an additional semiconductor element having a plurality of additional electrodes on the semiconductor element; a process of forming a plurality of additional terminals on the base; and a process of connecting the plurality of additional electrodes to the plurality of additional terminals.

Appendix 39

In the method for manufacturing a semiconductor device according to appendix 38, the process of forming a plurality of additional terminals includes a process of forming a metal plating layer on the base.

Hereinafter, semiconductor devices, methods for manufacturing the semiconductor devices and package structures of the semiconductor devices that are for solving the second object of the present invention will be specifically described with reference to FIGS. 37 to 76.

Embodiment 1-C

Figure 37:
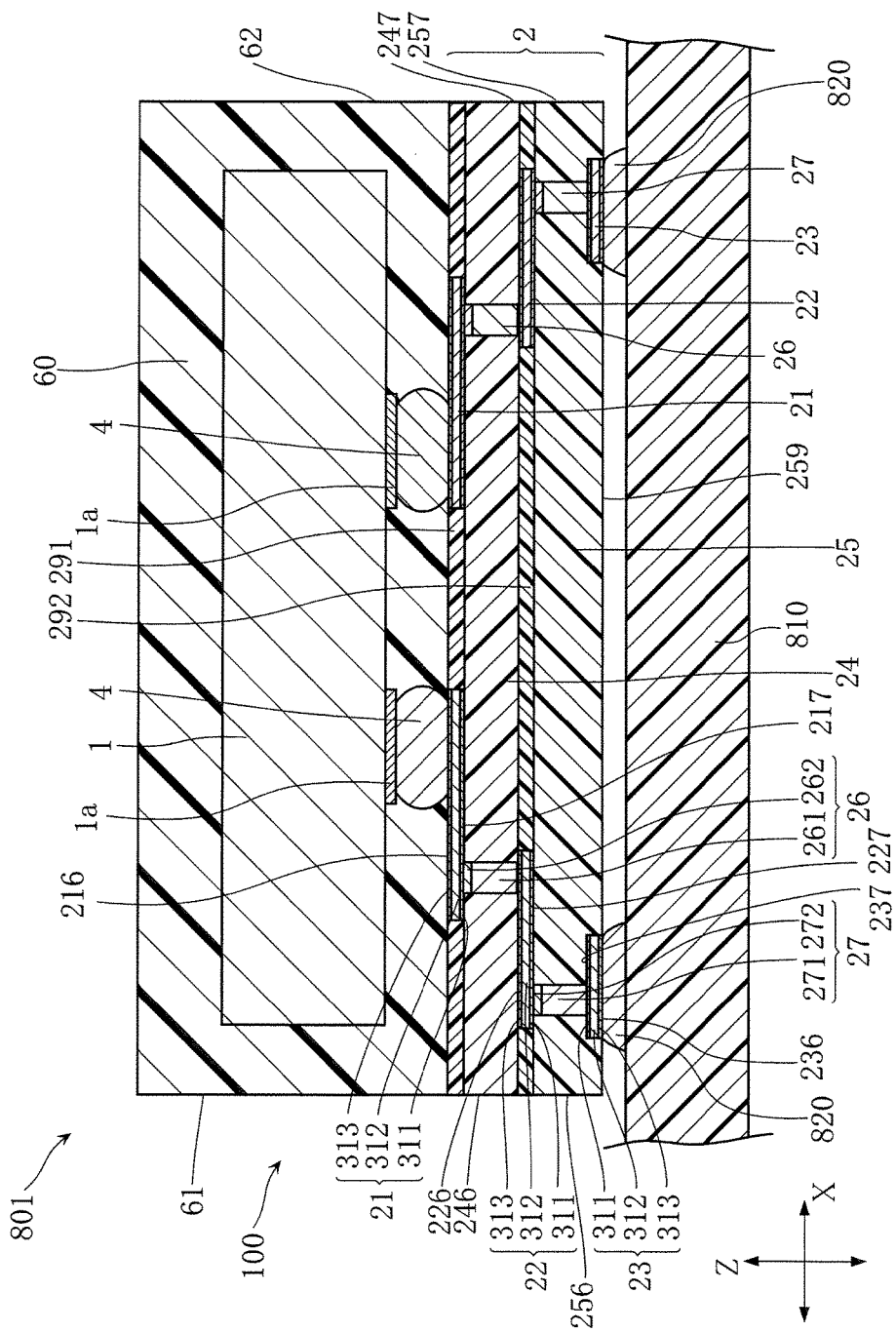
FIG. 37 is a cross-sectional view for describing a package structure of a semiconductor device based on Embodiment 1-C of the present invention.

FIG. 37 is a cross-sectional view of a package structure of a semiconductor device according to Embodiment 1-C of the present invention.

A package structure 801 shown in this diagram is provided with a semiconductor device 100, a package substrate 810, and a solder layer 820.

The package substrate 810 is a printed circuit board, for example. The package substrate 810 includes, for example, an insulating substrate and a pattern electrode (not shown) formed on the insulating substrate. The semiconductor device 100 is mounted to the package substrate 810. The solder layer 820 is interposed between the semiconductor device 100 and the package substrate 810. The solder layer 820 joins the semiconductor device 100 to the package substrate 810.

The semiconductor device 100 is provided with a semiconductor chip 1, a interconnect layer 2, 2 conductive connection members 4, and a sealing resin part 60. Note that, in the diagram, part of configuration is shown in an exaggerated manner for convenience of understanding. In particular, the thickness of the interconnect layer 2 is considerably thinner than the thickness of the sealing resin part 60.

The semiconductor chip 1 is an LSI chip, for example. A micro-circuit is formed in the semiconductor chip 1. In the present embodiment, the semiconductor chip 1 is a bare chip. A reinterconnect layer is thus not formed in the semiconductor chip 1. The semiconductor chip 1 includes 2 chip electrodes 1a. The 2 chip electrodes 1a are spaced from each other in a direction X. The chip electrodes 1a are electrically connected to the micro-circuit formed in the semiconductor chip 1. Note that, in the present embodiment, the number of the chip electrodes 1a is given as two for simplification of description. The number of chip electrodes 1*a* can be appropriately changed according to the type of semiconductor chip 1.

The interconnect layer 2 supports the semiconductor chip 1. The interconnect layer 2 includes a plurality of electrode films 21, 22 and 23, a plurality of insulating layers 24 and 25, and electrical connection members 26 and 27. Two each of the electrode films 21, 22 and 23, the insulating layers 24, 25, 291 and 292, and the electrical connection members 26 and 27 are shown in FIG. 37.

The electrode films 21, 22 and 23 each consists of a conductive material. The thickness (dimension in the direction Z) of each of the electrode films 21, 22 and 23 is 0.01-0.03 mm, for example. The electrode films 21, 22 and 23 are disposed in different positions to each other in the direction Z.

The two electrode films 21 are spaced from each other in the direction X. In the present embodiment, the electrode films 21 are disposed in positions that overlap the semiconductor chip 1 when viewed in a direction Z. More specifically, the electrode films 21 are each disposed in a position that overlap a chip electrode 1*a* of the semiconductor chip 1 when viewed in the direction Z (when viewed in the XY plane; the same applies hereinafter). The number of electrode films 21 in the present embodiment depends on the number of chip electrodes 1*a*, and the number of electrode films 21 can be other than two in the case of a different type of semiconductor chip 1. The same applies to the number of electrode films 22 and 23.

The electrode films 21 each have an electrode surface 216 and an electrode surface 217. The electrode surfaces 216 and the electrode surfaces 217 face in opposite directions to each other. The electrode surfaces 216 face the side on which the semiconductor chip 1 is located. The electrode surfaces 216 each oppose a chip electrode 1*a* across a conductive connection members 4 discussed below. On the other hand, the electrode surfaces 217 face away from the side on which the semiconductor chip 1 is located.

Figure 38:
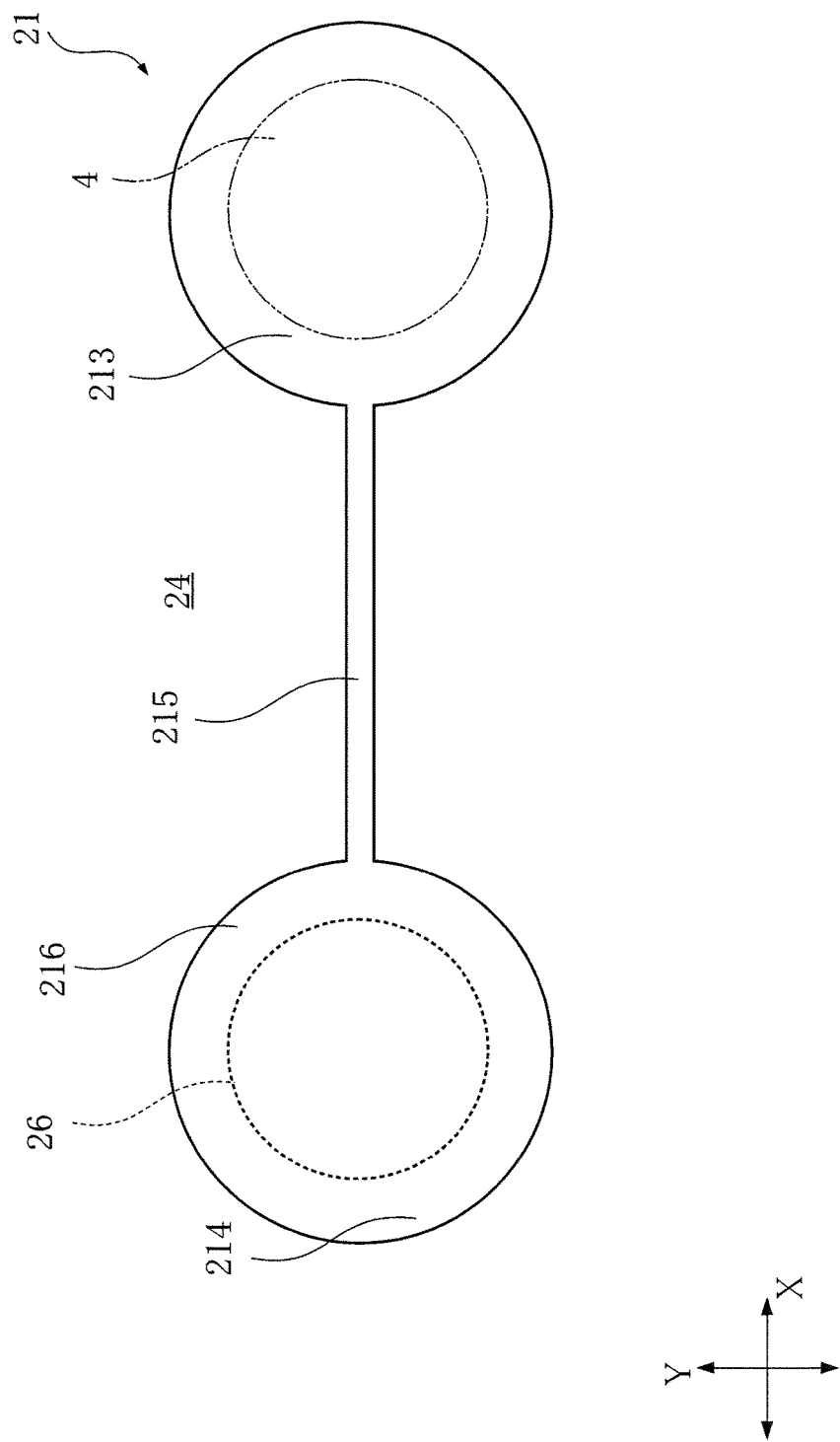
FIG. 38 is a plan view of an electrode film shown in FIG. 37.

In FIG. 38, an electrode film 21 is drawn schematically. Each electrode film 21 is formed in the shape of a designed pattern when viewed in the direction Z. Specifically, as shown in FIG. 38, the electrode film 21 has a first portion 213, a second portion 214, and a connecting portion 215. The first portion 213 and the second portion 214 are comparatively large when viewed in the direction Z. The connecting portion 215 is joined to the first portion 213 and the second portion 214. The connecting portion 215 electrically connects the first portion 213 and the second portion 214. The connecting portion 215 forms a straight line.

The two electrode films 22 are spaced from each other in the direction X. In the present embodiment, the electrode films 22 are each disposed in a position that overlaps an electrode film 21 when viewed in the direction Z.

The electrode films 22 each have an electrode surface 226 and an electrode surface 227. The electrode surfaces 226 and the electrode surfaces 227 face in opposite directions to each other. The electrode surfaces 226 face the side on which the electrode films 21 are located. The electrode surfaces 226 each oppose an electrode film 21 across an electrical connection member 26 discussed below. On the other hand, the electrode surfaces 227 face away from the side on which the semiconductor chip 1 is located.

Each electrode film 22 is formed in the shape of a designed pattern when viewed in the direction Z, similarly to the electrode films 21.

The two electrode films 23 are spaced from each other in the direction X. In the present embodiment, the electrode films 23 are each disposed in a position that overlaps an electrode film 22 when viewed in the direction Z.

The electrode films 23 each have an electrode surface 236 and an electrode surface 237. The electrode surfaces 236 and the electrode surfaces 237 face in opposite directions to each other. The electrode surfaces 237 face the side on which the electrode films 22 are located. The electrode surfaces 237 each oppose an electrode film 22 across an electrical connection member 27 discussed below. On the other hand, the electrode surfaces 236 face away from the side on which the semiconductor chip 1 is located.

Each electrode film 23 is formed in the shape of a designed pattern when viewed in the direction Z, similarly to the electrode films 21.

In the present embodiment, the electrode films 21, 22 and 23 all have a first layer 311, a second layer 312 and a third layer 313. The first layer 311 consists of gold or palladium. The first layer 311 has a thickness (dimension in direction Z) of 5 μm, for example. The second layer 312 consists of a material that differs from the material constituting the first layer 311. The material constituting the second layer 312 is nickel, for example. The thickness (dimension in direction Z) of the second layer 312 is greater than the thickness of the first layer 311. The second layer 312 has a thickness of 20 μm, for example. The third layer 313 consists of a different material from the material constituting the second layer 312. The material constituting the third layer 313 is gold or palladium, for example. The thickness (dimension in direction Z) of the third layer 313 is less than the thickness of the second layer 312. The third layer 313 has a thickness of 5 μm, for example.

In the electrode films 21, 22 and 23, the electrode surfaces 217, 227 and 237 respectively constitute the first layer 311. On the other hand, in the electrode films 21, 22 and 23, the electrode surfaces 216, 226 and 236 respectively constitute the third layer 313.

The first layers 311 of the electrode films 21, 22 and 23 may all have the same thickness. Similarly, the second layers 312 of the electrode films 21, 22 and 23 may all have the same thickness. Similarly, the third layers 313 of the electrode films 21, 22 and 23 may all have the same thickness.

In the present embodiment, in all of the electrode films 21 and 22, the third layer 313 is located closer than the first layer 311 to the side on which the semiconductor chip 1 is located. On the other hand, in all of the electrode films 23, the first layer 311 is located closer than the third layer 313 to the side on which the semiconductor chip 1 is located.

As an alternative to the present embodiment, the electrode films 21, 22 and 23 may consist of a single material, rather than having a stacked structure in which metal layers are stacked. For example, the electrode films 21, 22 and 23 may be constituted by copper or aluminum.

The insulating layers 24 and 25 each consist of an insulating material. The insulating material constituting the insulating layers 24 and 25 preferably is a material whose main component is any of resins including an epoxy-based resin, a silicone-based resin, a polyimide-based resin, a polyolefin-based resin, a cyanate ester-based resin, a phenol-based resin and a naphthalene-based resin, for example. The insulating layers 24 and 25 have a maximum thickness (dimension in direction Z) of 0.02-0.06 mm, for example.

The insulating layer 24 extends in the XY plane. The insulating layer 24 is interposed between the electrode films 21 and the electrode films 22. The insulating layer 24 contacts the electrode surface 217 of the electrode films 21 and the electrode surface 226 of the electrode films 22.

The insulating layer 24 has side surfaces 246 and 247. The side surfaces 246 and 247 are flat and face in opposite directions to each other.

The insulating layer 25 extends in the XY plane. The insulating layer 25 is stacked on the insulating layer 24. The insulating layer 25 is interposed between the electrode films 22 and the electrode films 23. The insulating layer 25 contacts the electrode surface 227 of the electrode films 22 and the electrode surface 237 of the electrode films 23.

The insulating layer 25 has side surfaces 256 and 257 and an insulating surface 259. The side surfaces 256 and 257 are flat and face in the opposite directions to each other. The side surface 256 is flush with the side surface 246. Similarly, the side surface 257 is flush with the side surface 247. The insulating surface 259 faces away from the side on which the semiconductor chip 1 is located. The insulating surface 259 is flat. The electrode films 23 are exposed from the insulating surface 259. The insulating surface 259 is flush with the electrode surface 236 of the electrode film 23. Note that in a state where the semiconductor device 100 is mounted to the package substrate 810, the electrode surface 236 of the electrode films 23 is joined to the solder layer 820.

The insulating layers 291 and 292 are called underfillers and each consist of an insulating material. Exemplary materials constituting the insulating layers 291 and 292 include an epoxy resin. The insulating layer 291 contacts the electrode films 21. In the present embodiment, the insulating layer 291 is interposed between the insulating layer 24 and the sealing resin part 60. The insulating layer 292 contacts the electrode films 22. In the present embodiment, the insulating layer 292 is interposed between the insulating layer 24 and the insulating layer 25.

The electrical connection members 26 pass through the insulating layer 24. Each electrical connection members 26 is interposed between an electrode film 21 and an electrode film 22. The electrical connection member 26 is disposed in a position that overlaps both an electrode film 21 and an electrode film 22 when viewed in the direction Z. The electrical connection member 26 contacts the electrode film 21 and the electrode film 22. The electrical connection member 26 stands erect from the electrode film 21 or the electrode film 22 in the direction Z. The electrode film 21 is electrically connected to the electrode film 22 via the electrical connection member 26.

The electrical connection members 26 each have a conductive contact portion 261 and a conductive joining layer 262. The conductive contact portion 261 consists of a conductive material such as copper, for example. In the present embodiment, the conductive contact portion 261 contacts the electrode surface 226 of the electrode film 22. On the other hand, the conductive joining layer 262 consists of solder or silver, for example. The conductive joining layer 262 is interposed between the conductive contact portion 261 and the electrode film 21, and contacts the conductive contact portion 261 and the electrode film 21. The conductive joining layer 262 joins the conductive contact portion 261 and the electrode film 21.

The electrical connection members 27 have a similar configuration to the electrical connection members 26. The electrical connection members 27 pass through the insulating layer 25. Each electrical connection member 27 is interposed between an electrode film 22 and an electrode film 23. The electrical connection member 26 is disposed in a position that overlaps both the electrode film 22 and the electrode film 23 when viewed in the direction Z. The electrical connection member 27 contact the electrode film 22 and the electrode film 23. The electrical connection member 27 stands erect from the electrode film 22 or the electrode film 23 in the direction Z. The electrode film 22 is electrically connected to the electrode film 23 via the electrical connection member 27. The dimension of the electrode film 23 in the direction X is greater than the dimension of the electrical connection member 27 in the direction X. Thus, the joining area between the electrode film 23 and the solder layer 820 can be enlarged, compared with the case where the solder layer 820 is joined to the electrical connection member 27.

The electrical connection members 27 each have a conductive contact portion 271 and a conductive joining layer 272. The conductive contact portion 271 consists of a conductive material such as copper, for example. In the present embodiment, the conductive contact portion 271 contacts the electrode surface 237 of the electrode film 23. On the other hand, the conductive joining layer 272 consists of solder or silver, for example. The conductive joining layer 272 is interposed between the conductive contact portion 271 and the electrode film 22, and contacts the conductive contact portion 271 and the electrode film 22. The conductive joining layer 272 joins the conductive contact portion 271 and the electrode film 22.

Each conductive connection member 4 is interposed between a chip electrode 1a and an electrode film 21 that overlap when viewed in the direction Z. Also, the conductive connection member 4 contacts the chip electrode 1a and the electrode film 21 that overlap when viewed in the direction Z. The chip electrode 1a and the electrode film 21 are electrically connected via the conductive connection member 4. The conductive connection member 4 consists of solder, for example.

The sealing resin part 60 covers the semiconductor chip 1, the interconnect layer 2, and the conductive connection members 4. Specifically, the sealing resin part 60 covers the chip electrodes 1a of the semiconductor chip 1, the electrode films 21 and the insulating layer 24 in the interconnect layer 2, and the conductive connection members 4. The sealing resin part 60 has resin side surfaces 61 and 62. The resin side surfaces 61 and 62 face in opposite directions to each other. The resin side surface 61 is flat and flush with the side surface 246 of the insulating layer 24. The resin side surface 62 is flat and flush with the side surface 247 of the insulating layer 24. The sealing resin part 60 consists of a black epoxy-based resin, for example.

Next, a method for manufacturing the semiconductor device 100 will be described using FIGS. 39 to 56. Hereinafter, the same signs are given to configuration that is the same as or similar to the abovementioned configuration, and description thereof is omitted.

First, a frame 71 (see FIG. 39), a frame 72 (see FIG. 40), and a frame 73 (see FIG. 41) are manufactured.

Figure 39:
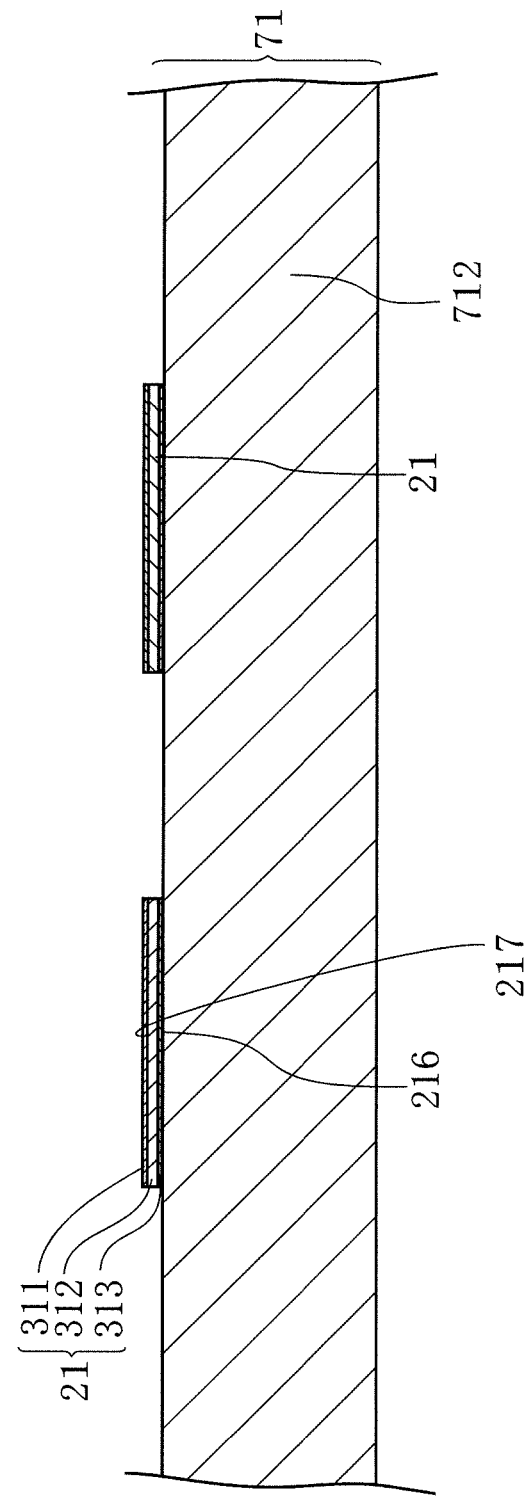
FIG. 39 is a cross-sectional view showing a frame formed in a method for manufacturing the semiconductor device based on Embodiment 1-C of the present invention.

To manufacture the frame 71 shown in FIG. 39, a base 712 is prepared. The base 712 is a copper plate having a thickness of about 0.125 mm, for example. The area of the base 712 in plan view is considerably larger than the area of a plurality of semiconductor chips 1 in plan view.

Next, as shown in this diagram, a process of forming the electrode films 21 having the electrode surface 216 and the electrode surface 217 that face in opposite directions to each other on the base 712 is performed. The electrode films 21 are directly formed in the base 712. That is, the electrode films 21 are formed on the base 712, such that the electrode films 21 contact the base 712 without an insulating layer or the like being interposed between the base 712 and the electrode films 21.

In a process of forming the electrode films 21, first the third layer 313 is formed. In a process of forming the third layer 313, a plating layer is formed over the entire top surface of the base 712 by electroless plating, for example. In the present embodiment, the plating layer consists of gold or palladium. Next, the plating layer formed over the entire top surface of the base 712 is formed into a desired shape by etching. The third layer 313 can be formed on the base 712 in this way.

Next, a plating layer is formed on the base 712 and the third layer 313. In the present embodiment, the plating layer consists of nickel. Next, similar etching to the etching performed in the method of forming the third layer 313 is performed on the plating layer. The second layer 312 can be formed on the third layer 313 in this way.

Next, a plating layer is formed on the base 712 and the second layer of 312. In the present embodiment, the plating layer consists of gold or palladium. Next, similar etching to the method of forming the third layer 313 is performed on the plating layer. The first layer 311 can be formed on the second layer 312 in this way.

By stacking the third layer 313, the second layer 312 and the first layer 311 on the base 712 as described above, the frame 71 including the base 712 and the electrode films 21 formed on the base 712 is manufactured. In the frame 71, the electrode surface 216 of the electrode films 21 contacts the base 712, and the electrode surface 217 of the electrode films 21 faces away from the base 712.

Figure 40:
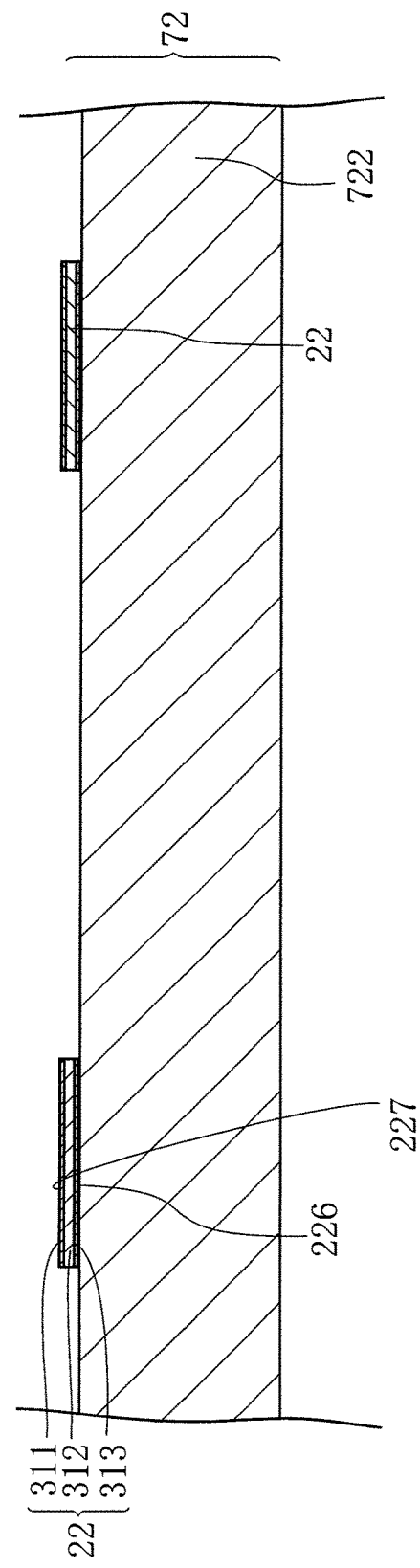
FIG. 40 is a cross-sectional view showing a frame formed in the method for manufacturing the semiconductor device based on Embodiment 1-C of the present invention.

As shown in FIG. 40, a process of forming the electrode films 22 having the electrode surface 226 and the electrode surface 227 that face in opposite directions to each other on a base 722 is performed similarly to manufacturing the frame 71. The electrode films 22 are formed directly on the base 722. In the frame 72, the electrode surface 226 of the electrode films 22 contacts the base 722, and the electrode surface 227 of the electrode films 22 faces away from the base 722.

Figure 41:
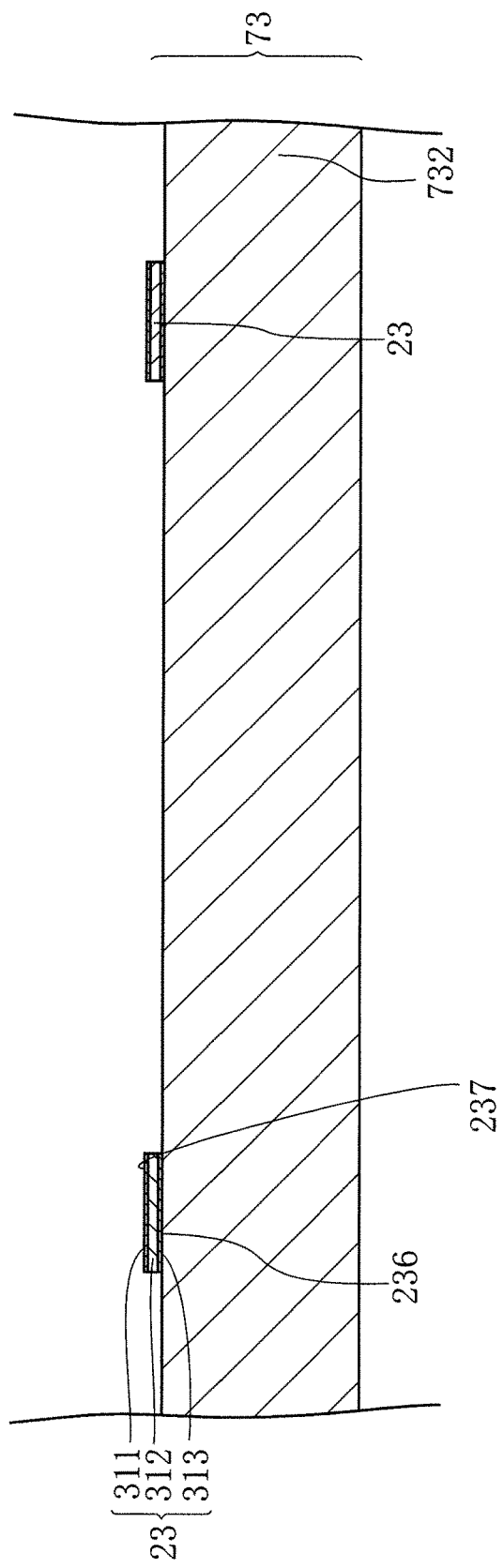
FIG. 41 is a cross-sectional view showing a frame formed in the method for manufacturing the semiconductor device based on Embodiment 1-C of the present invention.

As shown in FIG. 41, a process of forming the electrode films 23 having the electrode surface 236 and the electrode surface 237 that face in opposite directions to each other on a base 732 is performed similarly to manufacturing the frame 71. The electrode film 23 is formed directly on the base 732. In the frame 73, the electrode surface 236 of the electrode films 23 contacts the base 732, and the electrode surface 237 of the electrode films 23 faces away from the base 732.

Figure 42:
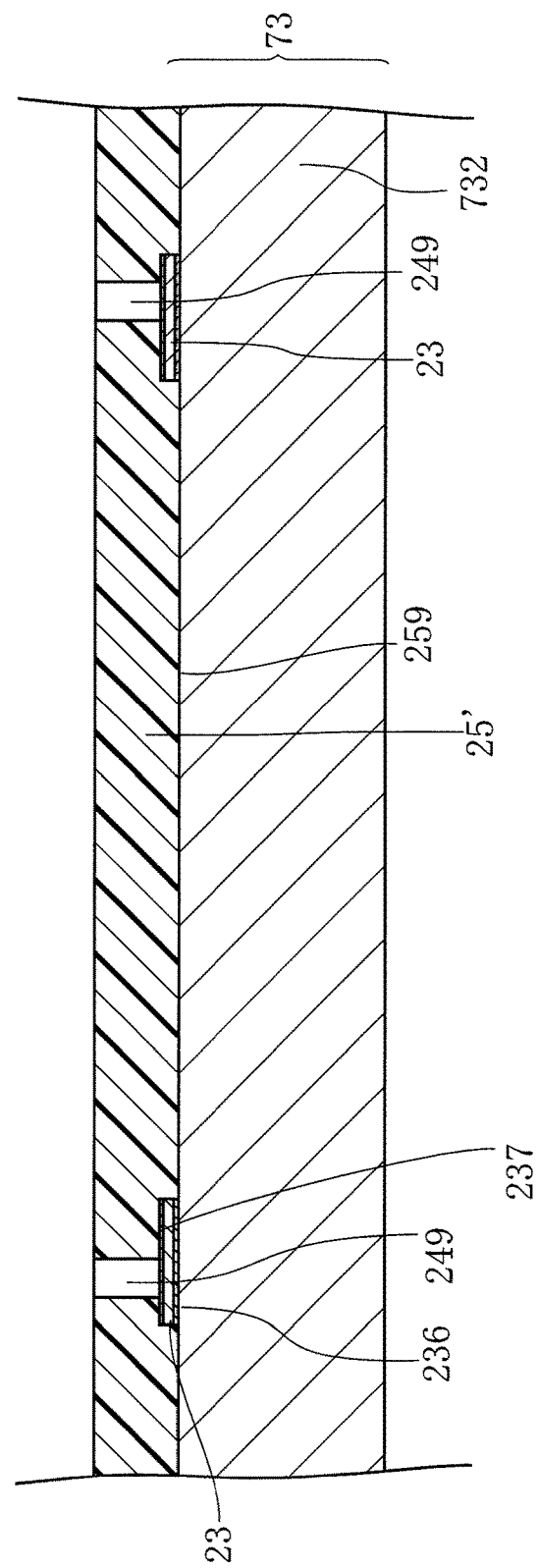
FIG. 42 is a cross-sectional view showing a process of the method for manufacturing the semiconductor device based on Embodiment 1-C of the present invention.

Next, as shown in FIG. 42, an insulating layer 25' is formed on the frame 73. To form the insulating layer 25', a spin coating method, CVD (Chemical Vapor Deposition) or PVD (Physical Vapor Deposition) may be used. Next, the insulating layer 25' is partially removed. Openings 249 are thereby formed in the insulating layer 25'. The electrode surface 237 of the electrode films 23 is exposed in the opening 249.

To partially remove the insulating layer 25', the entire top surface of the insulating layer 25' is coated with a photoresist. Next, a resist pattern is formed by performing exposure processing on the photoresist. Next, the insulating layer 25' is etched with the resist pattern as a mask.

Figure 43:
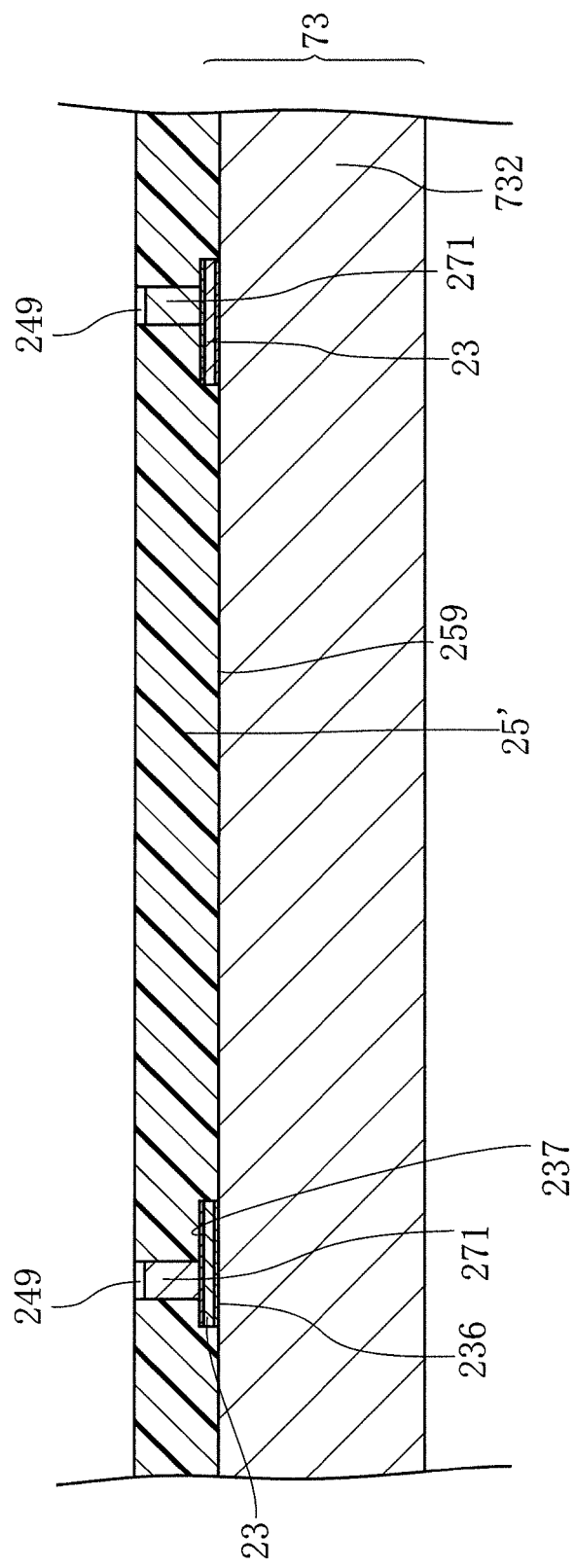
FIG. 43 is a cross-sectional view showing a process following FIG. 42.

Next, as shown in FIG. 43, the conductive contact portions 271 are formed in the openings 249 in the insulating layer 25'. The conductive contact portions 271 are formed by plating, for example.

Figure 44:
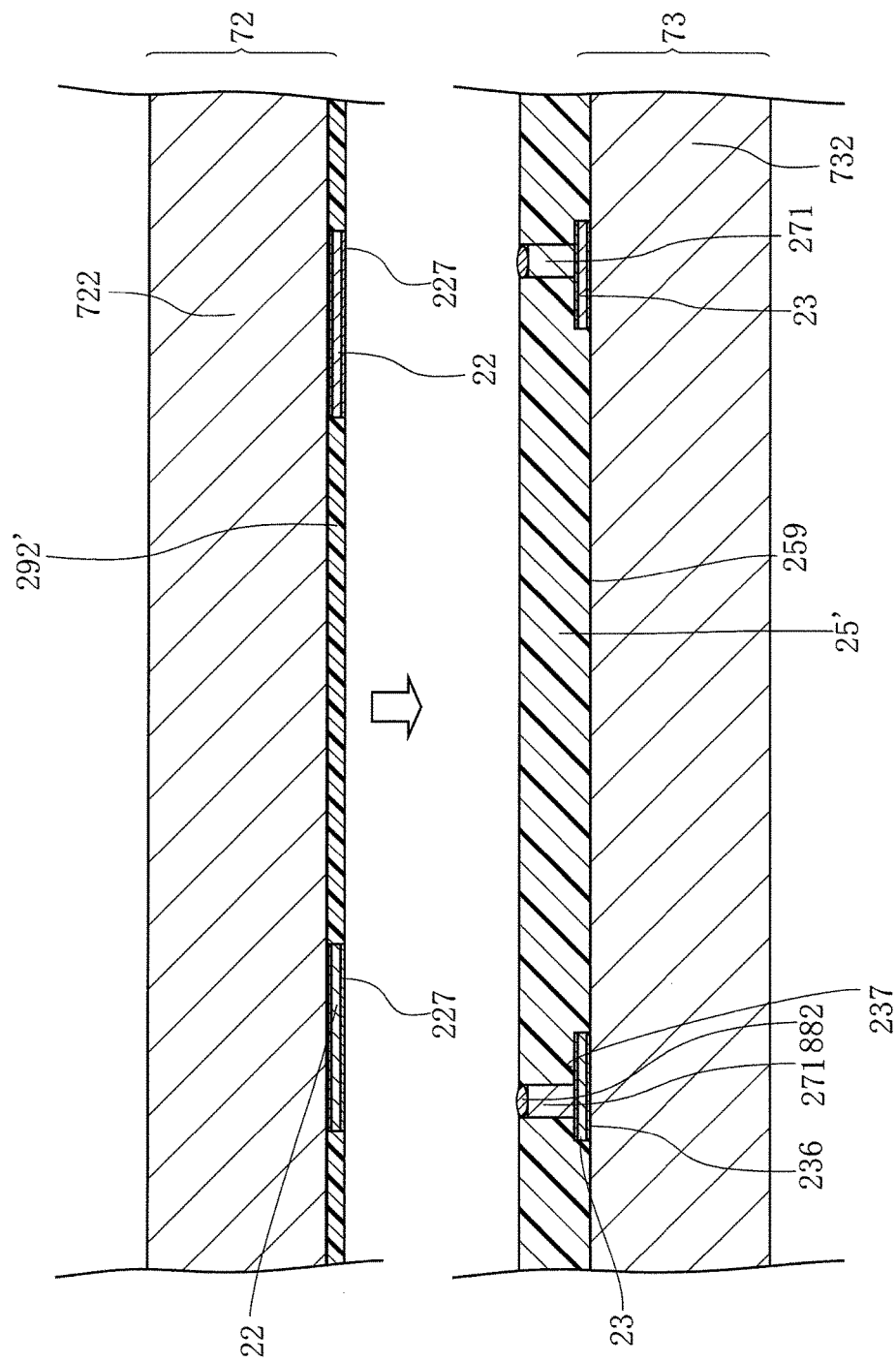
FIG. 44 is a cross-sectional view showing a process following FIG. 43.

Next, as shown in FIG. 44, a conductive adhesive 882 is applied to the conductive contact portions 271. The conductive adhesive 882 is solder or silver paste, for example. Next, an insulating layer 292' that contacts the electrode films 22 is formed on the base 722. The insulating layer 292' is formed by applying a liquid resin material to the base 722, for example.

Figure 45:
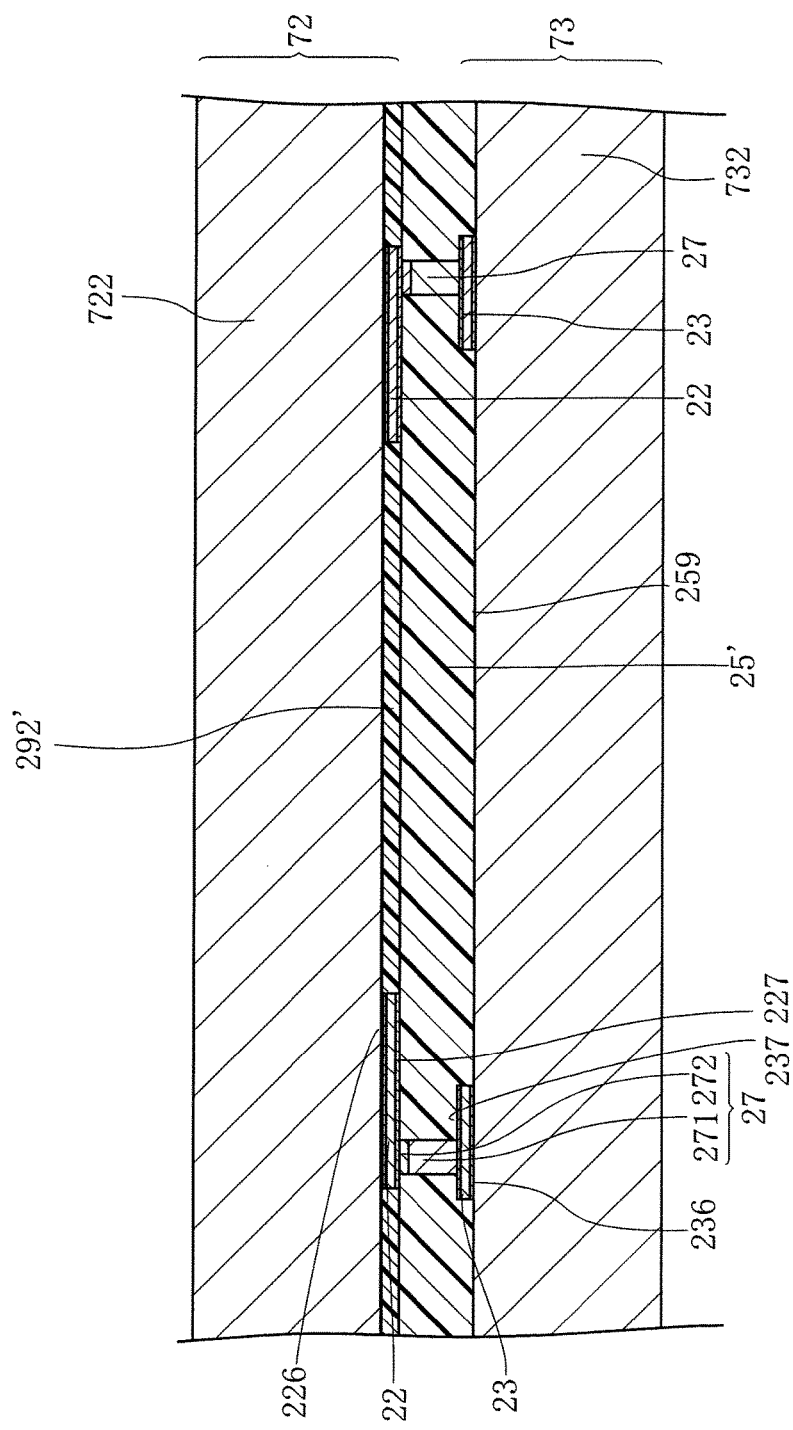
FIG. 45 is a cross-sectional view showing a process following FIG. 44.

Next, the frame 72 is pressed against the conductive contact portions 271 and the insulating layer 25', such that the conductive contact portions 271 and the electrode surface 227 of the electrode films 22 sandwich the conductive adhesive 882. As shown in FIG. 45, the frame 72 is fixed to the conductive contact portions 271 and the insulating layer 25', as a result of the conductive adhesive 882 solidifying. Also, the conductive adhesive 882 changes into the above-mentioned conductive joining layer 272 as a result of solidifying. The conductive contact portions 271 are joined to the electrode surface 227 of the electrode films 22 in this way. Also, the electrical connection members 27 that contact the electrode surface 227 of the electrode films 22 and the electrode surface 237 of the electrode films 23 are formed. As a result of the frame 72 being fixed to the conductive contact portions 271 and the insulating layer 25', the electrode films 22, which are located on the electrode surface 237 side of the electrode films 23, are fixed relative to the electrode films 23. As an alternative to the present embodiment, the insulating layer 292' may be formed by injecting a liquid resin material into the gap between the base 722 and the insulating layer 25', after joining the conductive contact portions 271 to the electrode surface 227.

Figure 46:
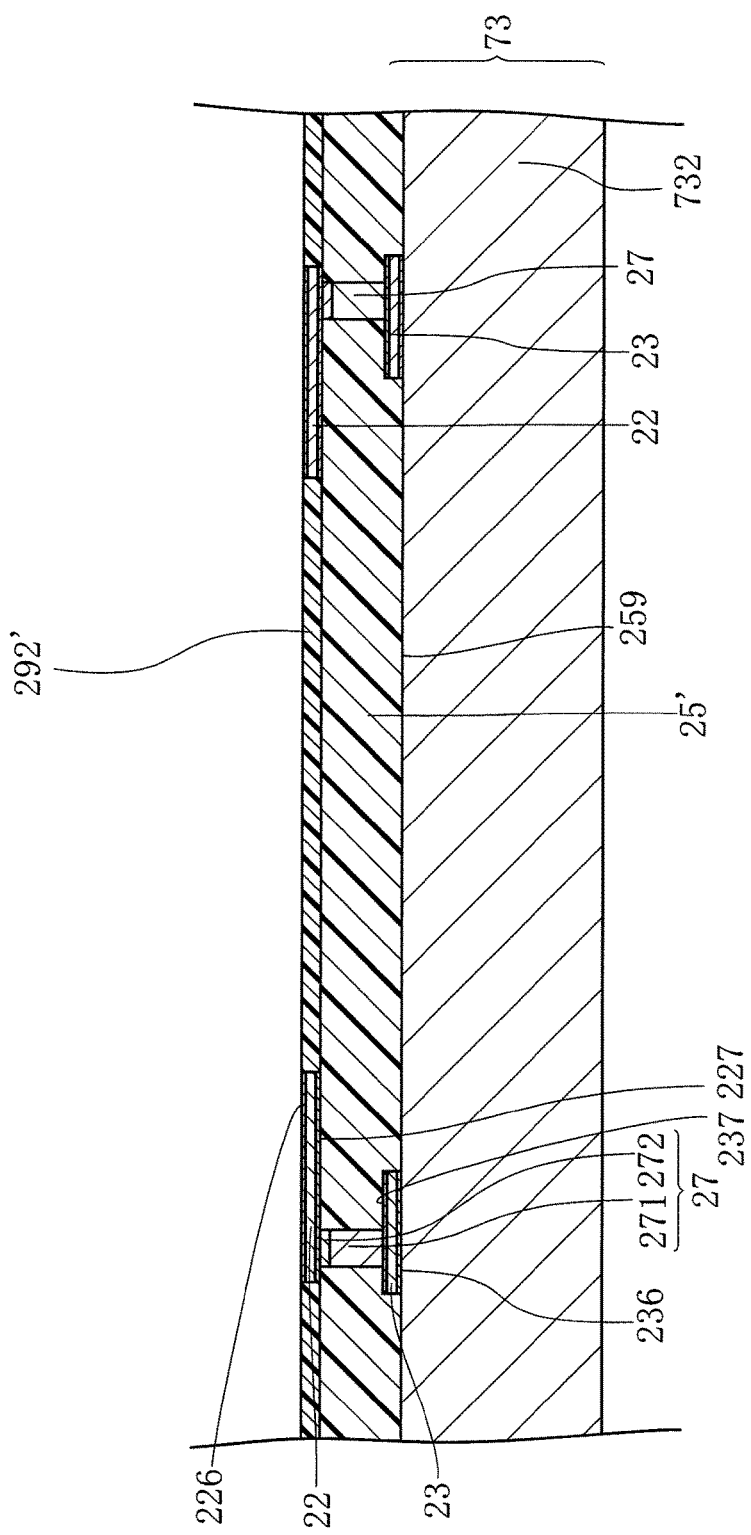
FIG. 46 is a cross-sectional view showing a process following FIG. 45.

Next, as shown in FIG. 46, the base 722 is removed from the frame 72. The electrode surface 226 of the electrode film 22 is thereby exposed. To remove the base 722, the base 722 is mechanically ground, for example. Alternatively, to remove the base 722, the base 722 is dissolved using a solution for dissolving the base 722. Removal of bases described later may be performed similarly to removing the base 722. Note that if the third layer 313 constituting the electrode surface 226 (see FIG. 37) consists of gold, the third layer 313 can be prevented from dissolving, even in the case where the base 722 is dissolved.

Next, an insulating layer 24' and the electrode films 21 are formed on the insulating layer 25', by repeating similar processes to the processes described with reference to FIGS. 42 to 46, as shown in FIGS. 47 to 51. Specifically, the following processes are performed.

Figure 47:
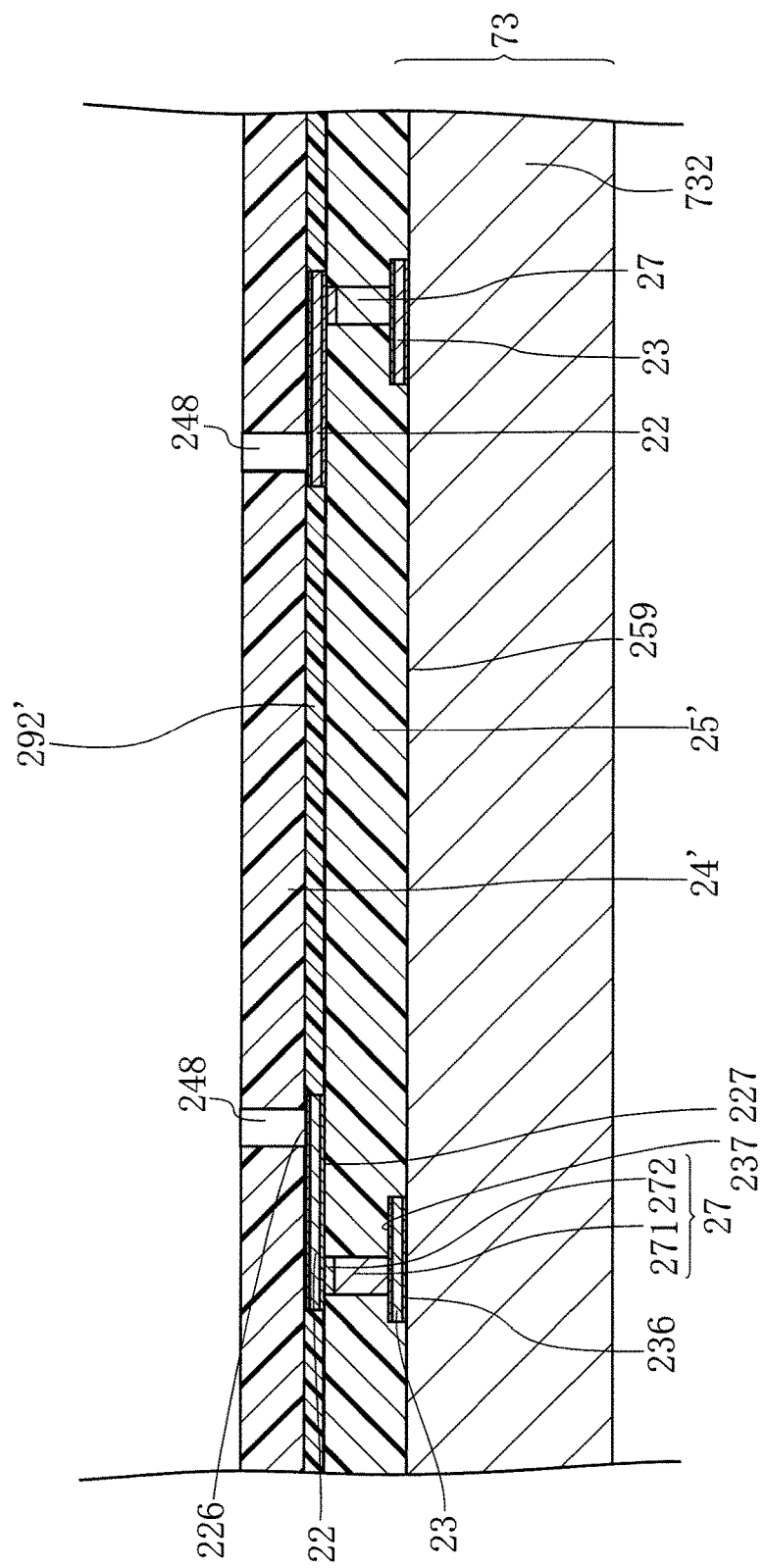
FIG. 47 is a cross-sectional view showing a process following FIG. 46.

The insulating layer 24' is formed on the insulating layer 25', as shown in FIG. 47. Next, the insulating layer 24' is partially removed. Openings 248 are thereby formed in the insulating layer 24'. The electrode surface 226 of the electrode films 22 is exposed in the openings 248.

Figure 48:
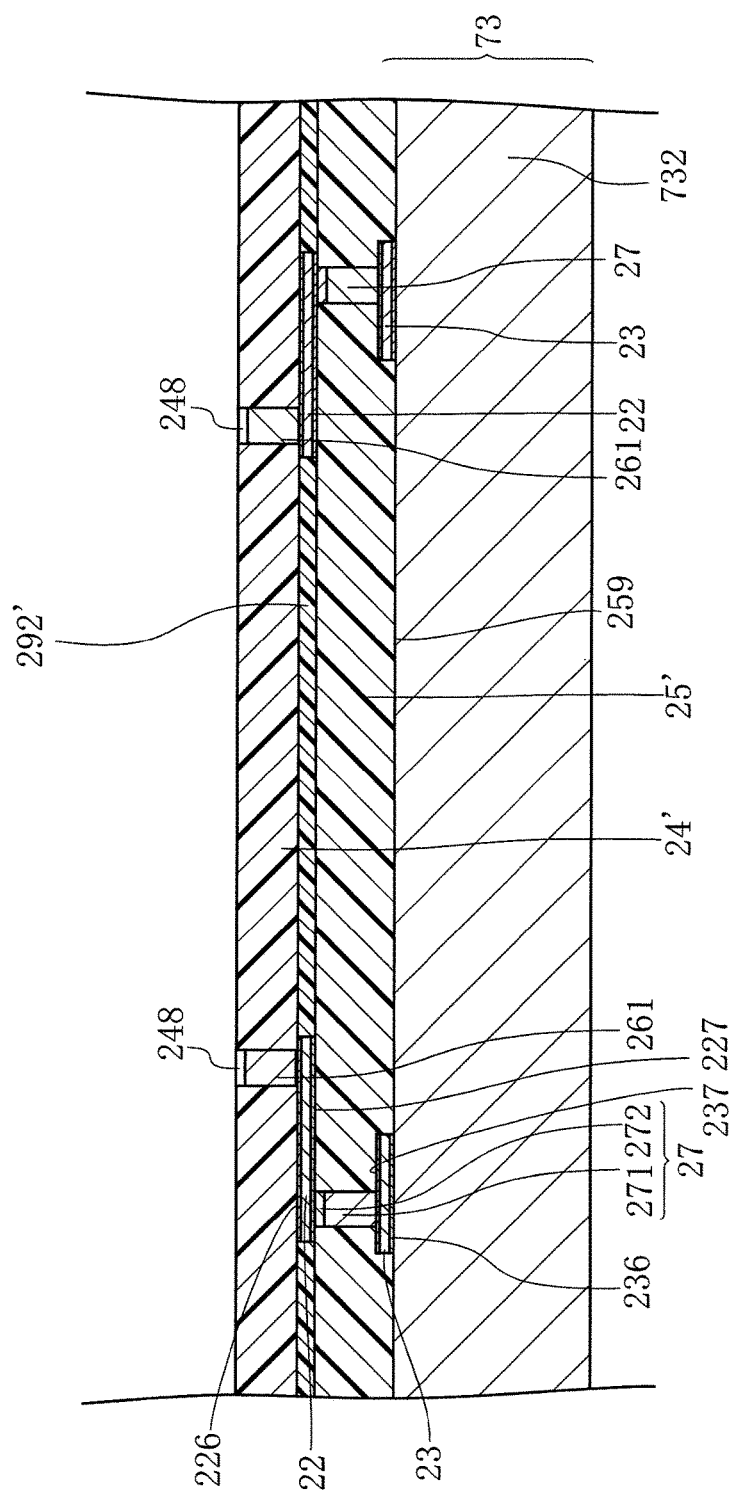
FIG. 48 is a cross-sectional view showing a process following FIG. 47.

Next, the conductive contact portions 261 are formed in the openings 248 in insulating layer 24', as shown in FIG. 48.

Figure 49:
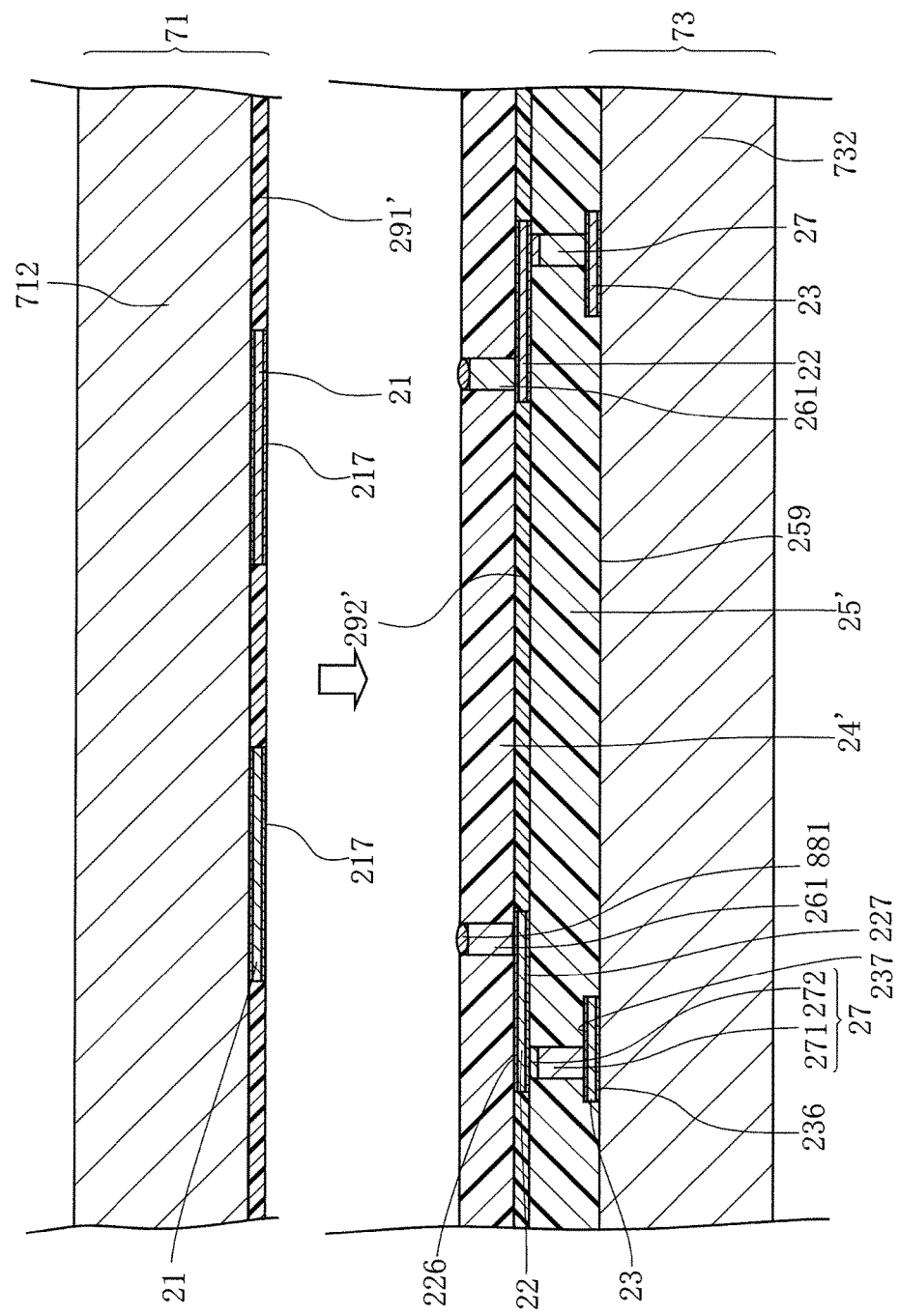
FIG. 49 is a cross-sectional view showing a process following FIG. 48.

Next, a conductive adhesive 881 is applied to the conductive contact portions 261, as shown in FIG. 49. Next, an insulating layer 291' that contacts the electrode films 21 is formed, similarly to forming the insulating layer 292', on the base 712. The insulating layer 291' is formed by applying a liquid resin material to the base 712, for example.

Figure 50:
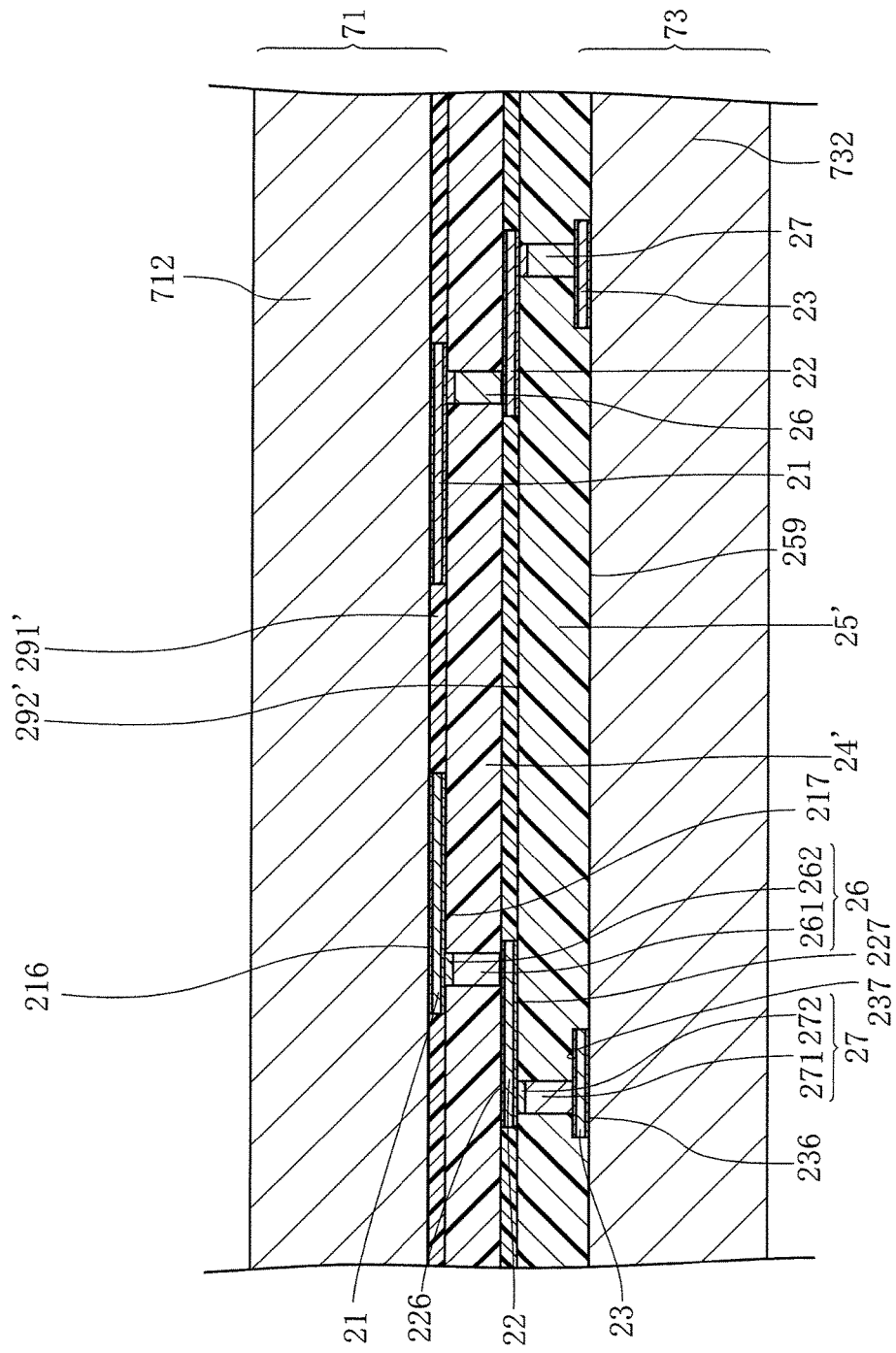
FIG. 50 is a cross-sectional view showing a process following FIG. 49.

Next, the frame 71 is pressed against the conductive contact portions 261 and the insulating layer 24', such that the conductive contact portions 261 and the electrode surface 217 of the electrode films 21 sandwich the conductive adhesive 881. As shown in FIG. 50, the frame 71 is fixed to the conductive contact portions 261 and the insulating layer 24', as a result of the conductive adhesive 881 solidifying. Also, the conductive adhesive 881 changes into the conductive joining layer 262 as a result of solidifying. The conductive contact portions 261 are joined to the electrode surface 217 of the electrode films 21 in this way. Also, the electrical connection members 26 that contact the electrode surface 217 of the electrode films 21 and the electrode surface 226 of the electrode films 22 are formed. As a result of the frame 71 being fixed to the conductive contact portions 261 and the insulating layer 24', the electrode films 22, which are located on the electrode surface 217 side of the electrode films 21, are fixed relative to the electrode films 21. Similarly, the electrode films 23, which are located on the electrode surface 217 side of the electrode films 21, are fixed relative to the electrode films 21. As an alternative to the present embodiment, the insulating layer 291' may be formed by injecting a liquid resin material into the gap between the base 712 and the insulating layer 24', after joining the conductive contact portions 261 and the electrode surface 217.

Figure 51:
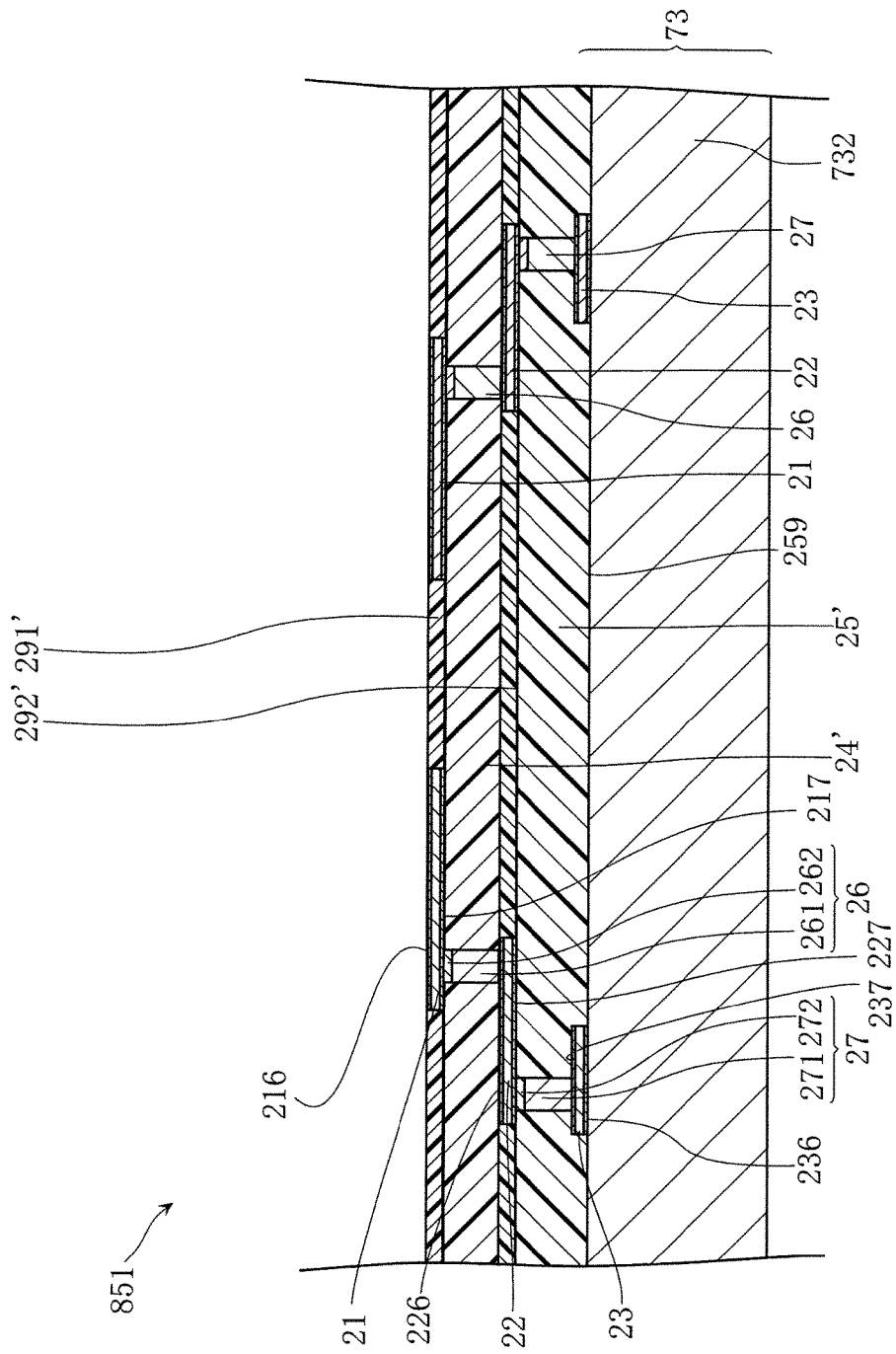
FIG. 51 is a cross-sectional view showing a process following FIG. 50.

Next, as shown in FIG. 51, the base 712 is removed from the frame 71. The electrode surface 216 of the electrode films 21 is thereby exposed.

An intermediate product 851 shown in FIG. 51 is formed as described above.

Figure 52:
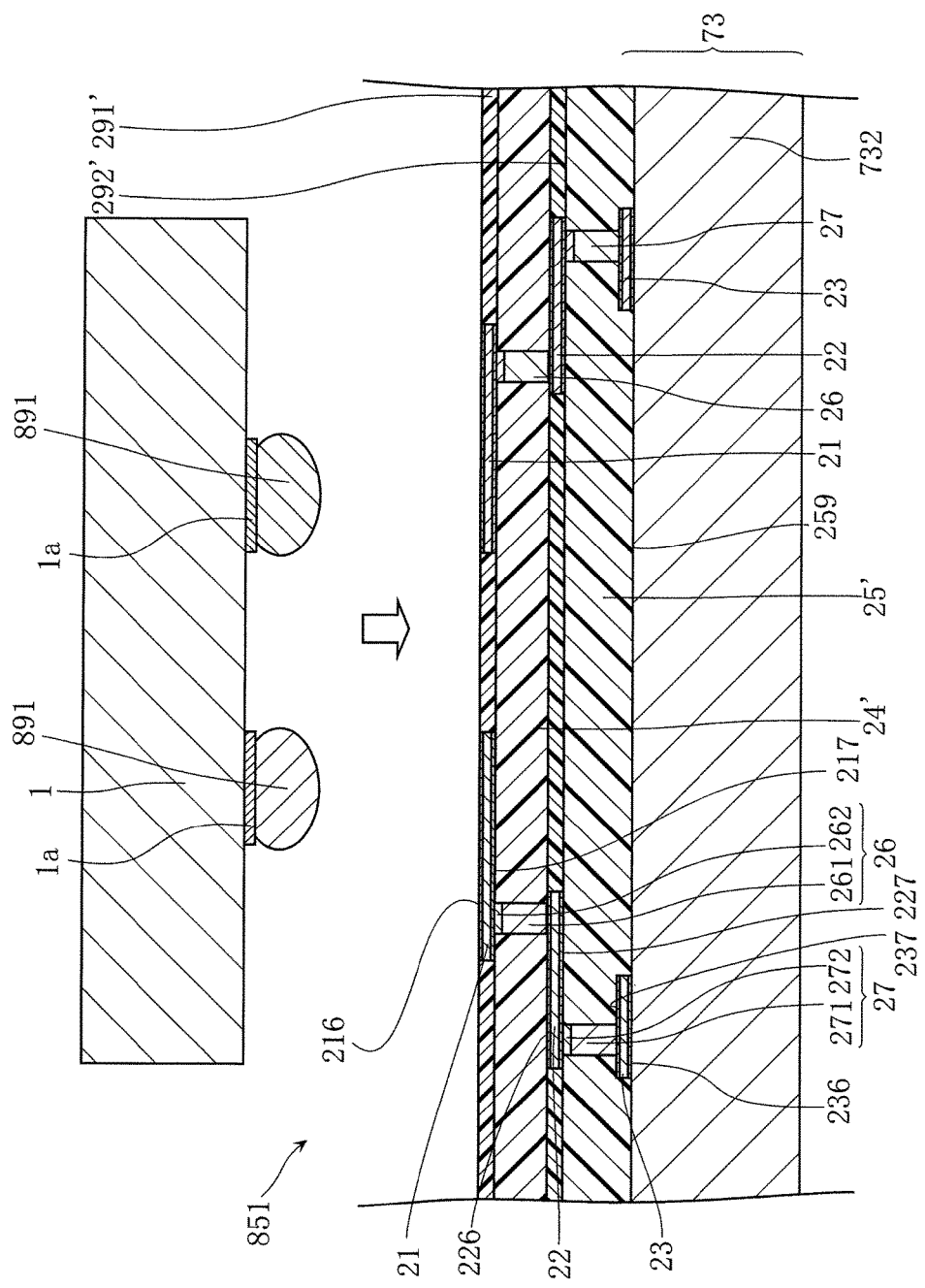
FIG. 52 is a cross-sectional view showing a process following FIG. 51.

Next, as shown in FIG. 52, a semiconductor chip 1 that includes the chip electrodes 1a is prepared. Next, a conductive adhesive 891 is applied to the chip electrodes 1a of the semiconductor chip 1. In the present embodiment, the conductive adhesive 891 is solder.

Figure 53:
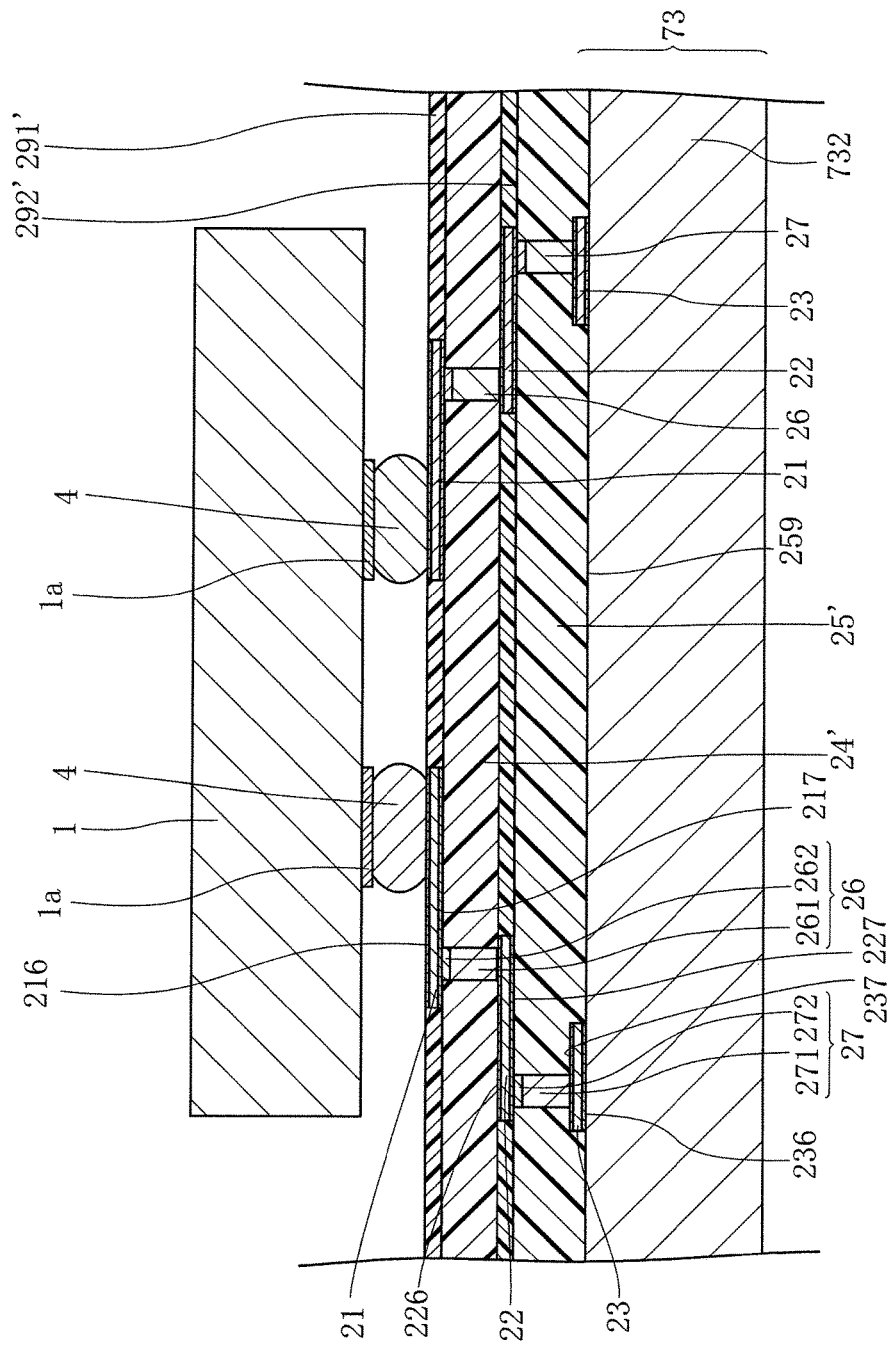
FIG. 53 is a cross-sectional view showing a process following FIG. 52.

Next, the semiconductor chip 1 is mounted to the intermediate product 851 so that the chip electrodes 1a and the electrode films 21 sandwich the conductive adhesive 891. As shown in FIG. 53, the semiconductor chip 1 is fixed to the intermediate product 851, as a result of the conductive adhesive 891 solidifying. Also, the conductive connection members 4 are formed as a result of the conductive adhesive 891 solidifying. The conductive connection members 4 are joined to the chip electrodes 1a and the electrode surface 216 of the electrode films 21 in this way. Note that although a plurality of semiconductor chips 1 are mounted to the intermediate product 851 in the present embodiment, one of the plurality of semiconductor chips 1 that are mounted to the intermediate product 851 is shown in this diagram. Also, when fixing the semiconductor chip 1 to the intermediate product 851, the conductive adhesive 891 may be applied to the electrode films 21, rather than applying the conductive adhesive 891 to the chip electrodes 1a.

Figure 54:
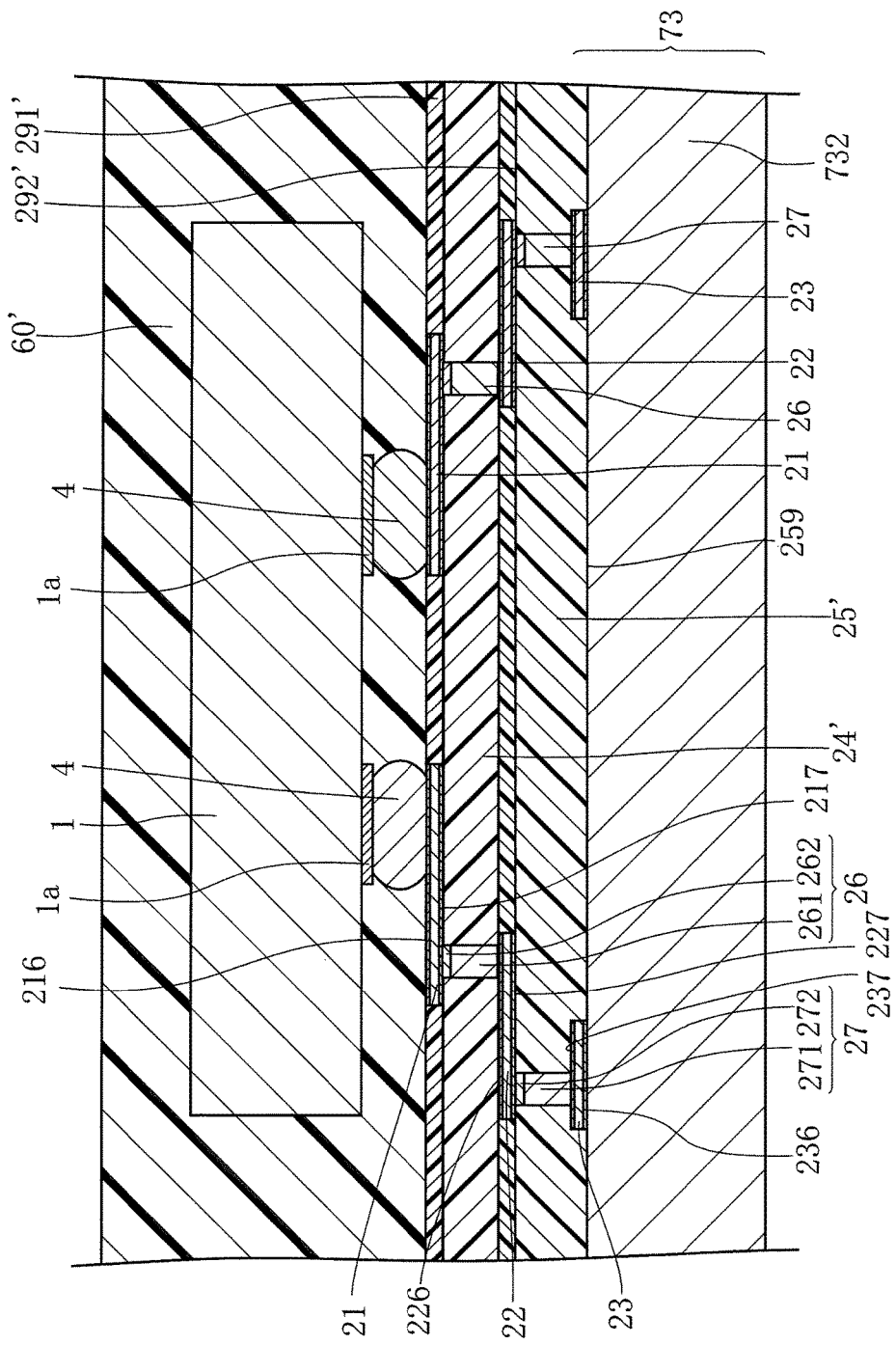
FIG. 54 is a cross-sectional view showing a process following FIG. 53.

Next, as shown in FIG. 54, the semiconductor chip 1 and the electrode films 21 are covered by a sealing resin part 60'. The sealing resin part 60' can be formed using a transfer mold technique, for example. With the transfer mold technique, processing for placing the intermediate product 851 in a metal mold and pouring a liquefied resin into the metal mold is performed.

Figure 55:
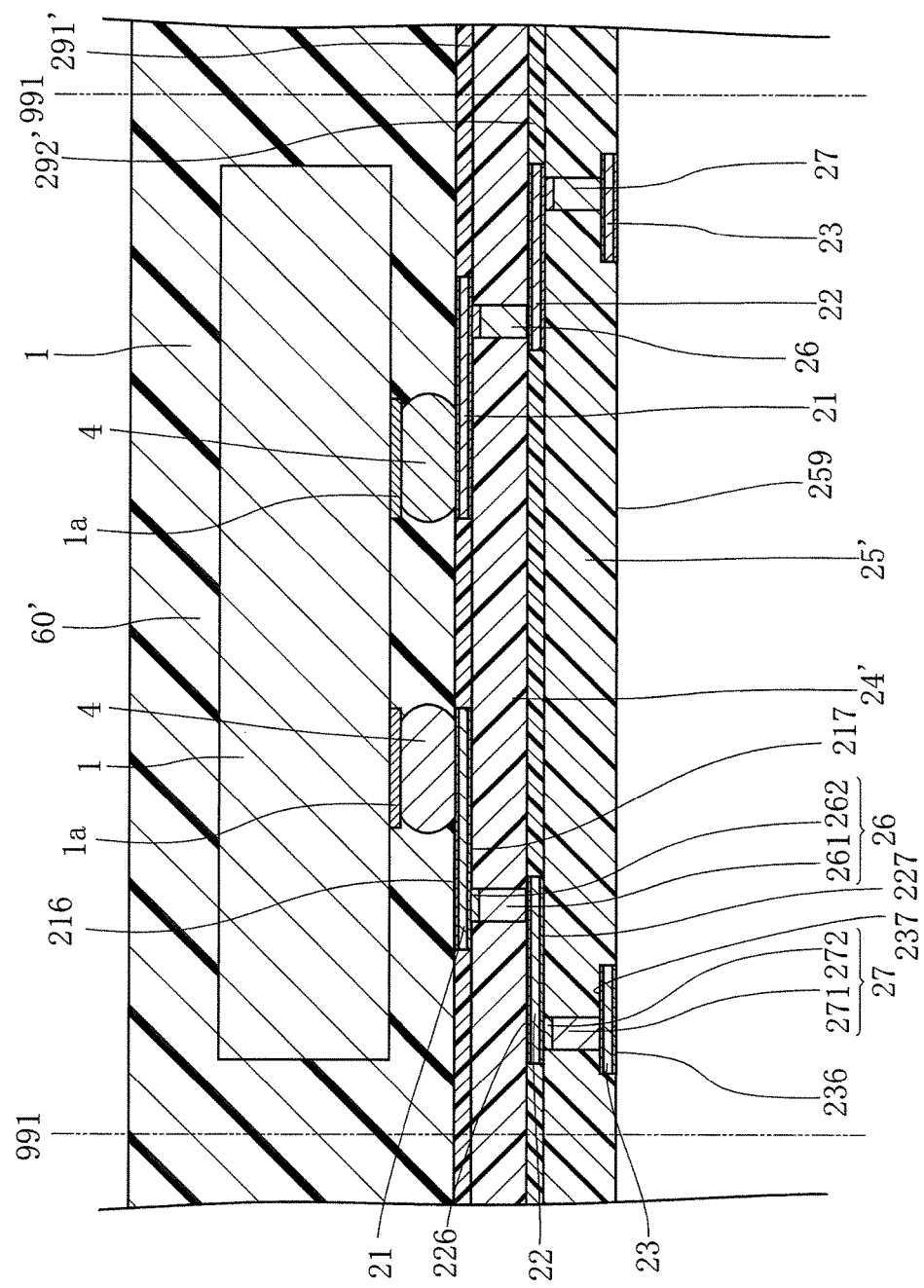
FIG. 55 is a cross-sectional view showing a process following FIG. 54.

Next, as shown in FIG. 55, the base 732 is removed from the frame 73. The electrode surface 236 of the electrode films 23 and the insulating surface 259 of the insulating layer 25' are thereby exposed. Since the electrode films 23 and the insulating layer 25' are formed on the base 732 having a flat top surface, the electrode surface 236 of the electrode films 23 is flush with the insulating surface 259 of the insulating layer 25'.

Figure 56:
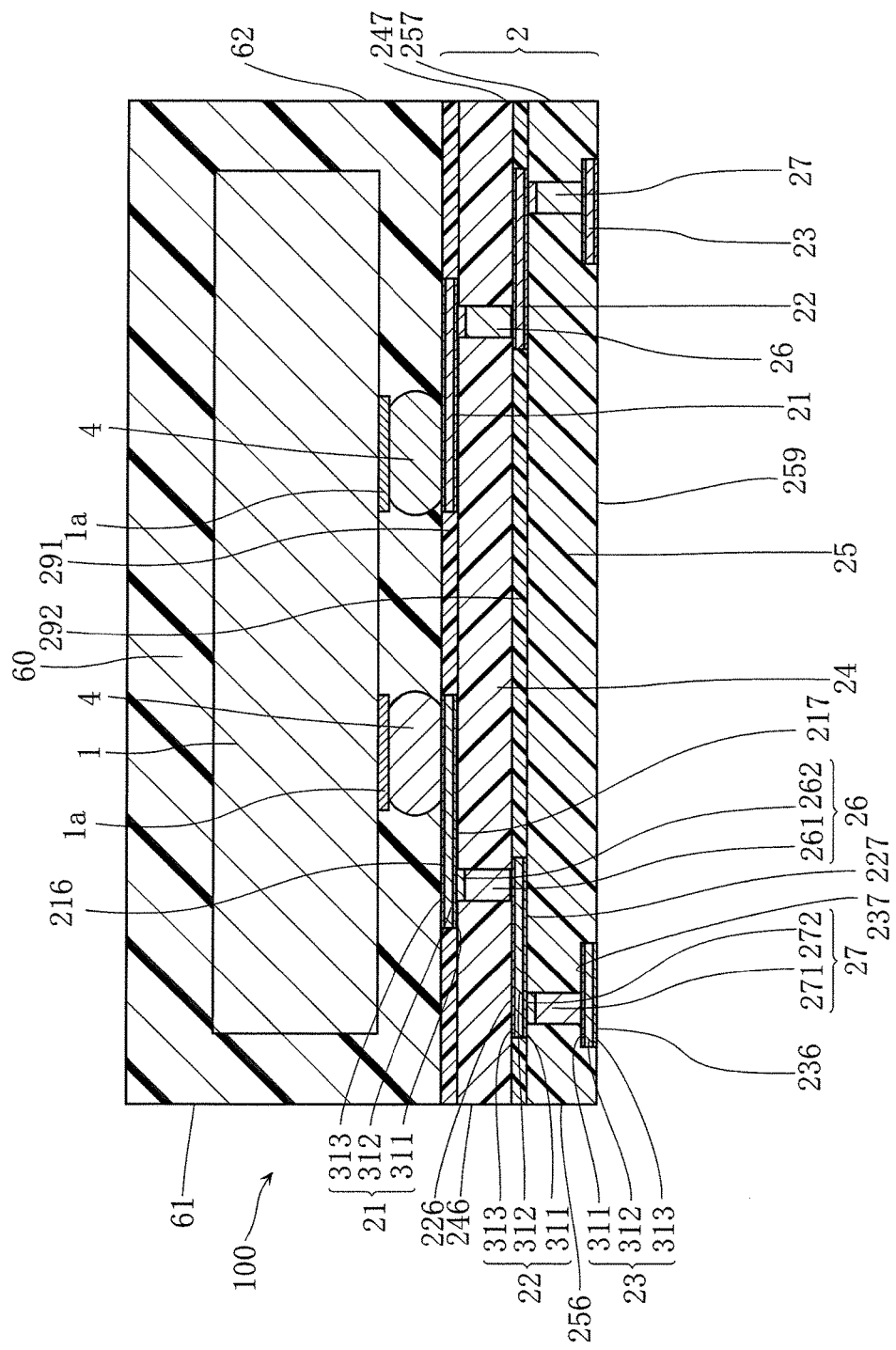
FIG. 56 is a cross-sectional view showing a process following FIG. 55.

Next, the semiconductor device 100 shown in FIG. 56 is manufactured by cutting the sealing resin part 60' along a two-dot chain line 991 shown in FIG. 55. Note that, by cutting the sealing resin part 60', the resin side surfaces 61 and 62 are formed in the sealing resin part 60, the side surfaces 246 and 247 are formed in the insulating layer 24, and the side surfaces 256 and 257 are formed in the insulating layer 25. The resin side surface 61, the side surface 246 and the side surface 256 are flush with each other. Similarly, the resin side surface 62, the side surface 247, and the side surface 257 are flush with each other.

Next, the working effects of the present embodiment will be described.

In the present embodiment, the frame 71 is formed by forming the electrode films 21 directly on the base 712. Such a configuration enables electrode films 21 having a given patterned shape to be formed on the base 712 in advance, even when the electrical connection members 26 do not exist. Generally, to perform photolithography, tasks such as forming a photomask and preparing an exposure machine are required. To perform tasks such as forming a photomask and preparing an exposure machine, much time and effort is required. In the present embodiment, photolithography for forming the electrode films 21 does not need to be performed, after the frame 71 including the electrode films 21 having a given patterned shape has been formed. Thus, in the manufacturing process of the semiconductor device 100, it is no longer necessary to perform photolithography for forming the electrode films 21 after the electrical connection members 26 have been formed. Accordingly, the method of the present embodiment enables the efficiency with which semiconductor devices are manufactured to be increased.

In the present embodiment, a process of forming the frame 73 by forming the electrode films 23 directly on the base 732 is further provided. This configuration enables electrode films 23 having a given patterned shape to be formed on the base 732 in advance, even when joining objects of the semiconductor device 100 to which the electrode films 23 are to be joined (in the present embodiment, the insulating layer 25 and the electrical connection members 27) do not exist. In the present embodiment, photolithography for forming the electrode films 23 does not need to be performed, after the frame 73 including the electrode films 23 having a given patterned shape has been formed. Thus, in the manufacturing process of the semiconductor device 100, it is no longer necessary to perform the photolithography for forming the electrode films 23 after forming the joining objects. Accordingly, the method of the present embodiment enables the efficiency with which semiconductor devices are manufactured to be increased.

In the present embodiment, the process of forming the interconnect layer 2 includes a process of fixing the electrode films 23 relative to the electrode films 21, on the electrode surface 217 side of the electrode films 21, and a process of removing the base 732 from the frame 73. Such a method results in the electrode films 23 and the electrode films 21 being disposed in different positions to each other in the thickness direction of the electrode films 21 (in the semiconductor device 100, coincides with the thickness direction Z of the semiconductor chip 1). Thus, the method of the present embodiment enables a configuration in which the interconnect layer 2 includes the electrode films 21 and 23 disposed in different positions to each other in the direction Z to be efficiently obtained.

In the present embodiment, a process of forming the conductive connection members 4 is performed after the process of fixing the electrode films 23 relative to the electrode films 21. That is, the process of mounting the semiconductor chip 1 to the intermediate product 851, described with reference to FIGS. 52 and 53, is performed after the process of fixing the frame 71 to the conductive contact portions 261 and the insulating layer 24', described with reference to FIGS. 49 and 50. As a result of such a configuration, it will be clear whether the electrode films 21 and 23 and the like have intended shapes and structures (i.e., are defective or not), before mounting the semiconductor chip 1 to the intermediate product 851 on which the plurality of electrode films 21 and 23 have been disposed. Thus, mounting the semiconductor chip 1 to the intermediate product 851 in the case where the intermediate product 851 is defective can be avoided. Accordingly, the method according to the present embodiment enables the yield of semiconductor devices to be improved.

With the method according to the present embodiment, the process of removing the base 732 from the frame 73 is performed after the process of forming the conductive connection members 4. That is, the process of removing the base 732, described with reference to FIGS. 54 and 55, is performed after the process of mounting the semiconductor chip 1 to the intermediate product 851, described with reference to FIGS. 52 and 53. According to such a configuration, the electrode surface 236 of the electrode films 23 can be located the furthest from the semiconductor chip 1 among the electrode films 21, 22 and 23. Such an electrode surface 236 can be the joining surface for joining to the solder layer 820. Also, with the method according to the present embodiment, the electrode films 23 and the base 732 are covered with the insulating layer 25', before the process of fixing the electrode films 23 relative to the electrode films 21. According to such a configuration, the electrode surface 236 of the electrode films 23 is flush with the insulating surface 259 of the insulating layer 25, as shown in FIGS. 37 and 56. That is, the electrode films 23 is disposed so as to encroach into the insulating layer 25. This is suitable for enlarging the contact area between the electrode films 23 and the insulating layer 25. Enlarging the contact area between the electrode films 23 and the insulating layer 25 is conducive to increasing the joining force between the electrode films 23 and the insulating layer 25. Accordingly, the electrode films 23 can also be prevented from separating from the insulating layer 25 when a force in a direction in while the electrode films 23 separate from the insulating layer 25 is received from the solder layer 820.

First Modification of Embodiment 1-C

Next, a first modification of Embodiment 1-C of the present invention will be described.

Figure 57:
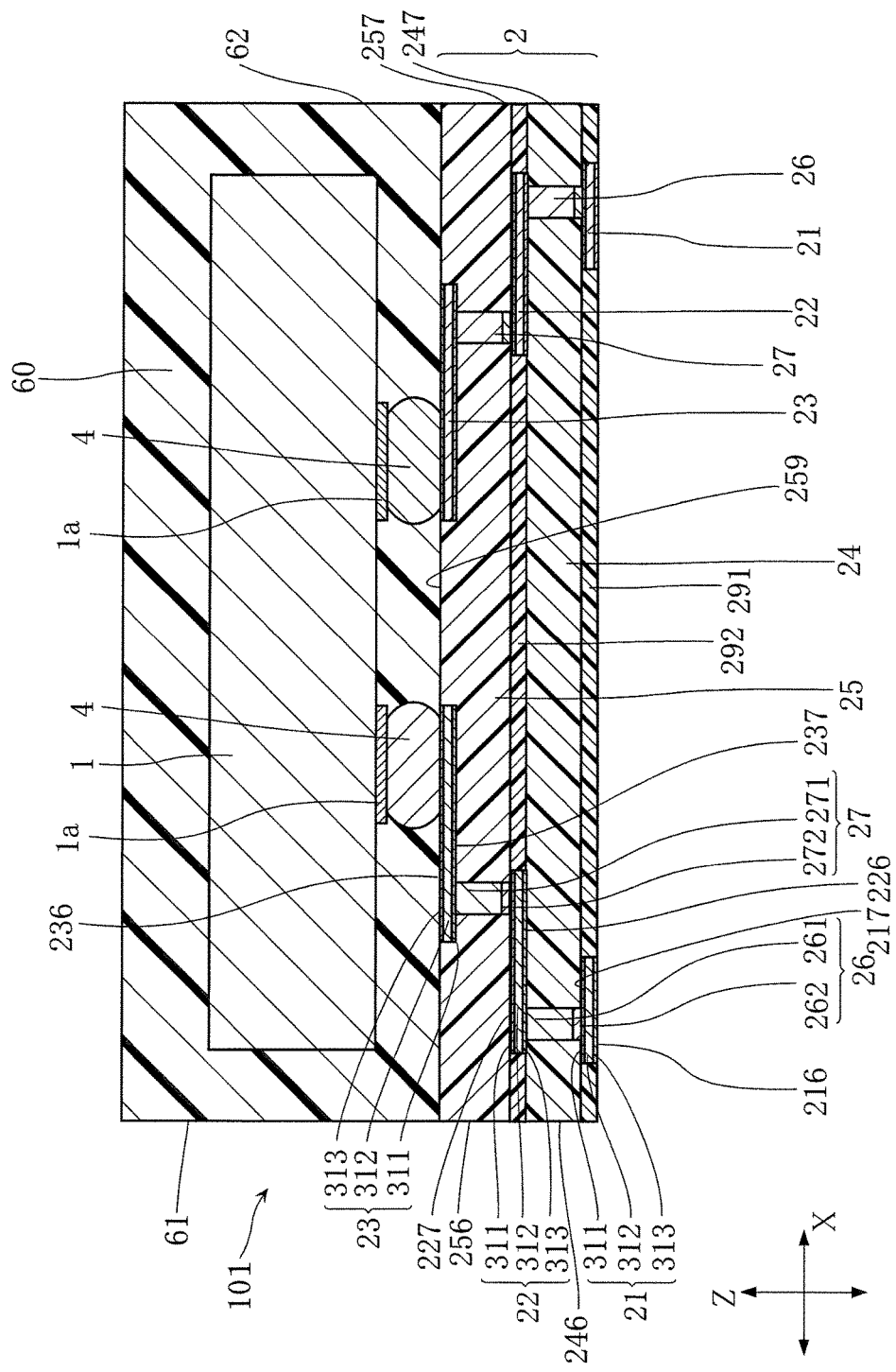
FIG. 57 is a cross-sectional view of a semiconductor device based on a first modification of Embodiment 1-C of the present invention.

FIG. 57 is a cross-sectional view of a semiconductor device according to the present modification.

In the present modification, the process of forming the interconnect layer 2 differs, compared with the method for manufacturing the semiconductor device 100. Thus, in a semiconductor device 101 shown in FIG. 57, the up-down direction of the interconnect layer 2 is opposite to the semiconductor device 100. In the semiconductor device 101, the electrode surfaces 217, 227 and 236 face the side on which the semiconductor chip 1 is located. On the other hand, the electrode surfaces 216, 226 and 237 face away from the side on which the semiconductor chip 1 is located. In the present embodiment, the electrode surface 236 of the electrode films 23 opposes the chip electrodes 1a across the conductive connection members 4. Also, the positions of the electrode films 21, 22 and 23 when viewed in the XY plane differ from the positions in the semiconductor device 100.

In the present embodiment, the electrode films 23 are disposed in positions that overlaps the semiconductor chip 1 when viewed in the direction Z. More specifically, the electrode films 23 are disposed in positions that overlap the chip electrodes 1a of the semiconductor chip 1 when viewed in the direction Z.

In all of the electrode films 21 and 22, the first layer 311 is located closer than the third layer 313 to the side on which the semiconductor chip 1 is located. On the other hand, in all of the electrode films 23, the third layer 313 is located closer than the first layer 311 to the side on which of the semiconductor chip 1 is located.

The insulating surface 259 of the insulating layer 25 contacts the sealing resin part 60.

The conductive connection members 4 are sandwiched between the electrode films 23 and the chip electrodes 1a. Each conductive connection member 4 is interposed between an electrode film 23 and a chip electrode 1a, and contacts the electrode surface 236 of the electrode film 23 and the chip electrode 1a. In a state where the semiconductor device 101 is mounted to the package substrate 810, the solder layers 820 are joined to the electrode films 21.

Next, a method for manufacturing the semiconductor device 101 will be described.

Figure 58:
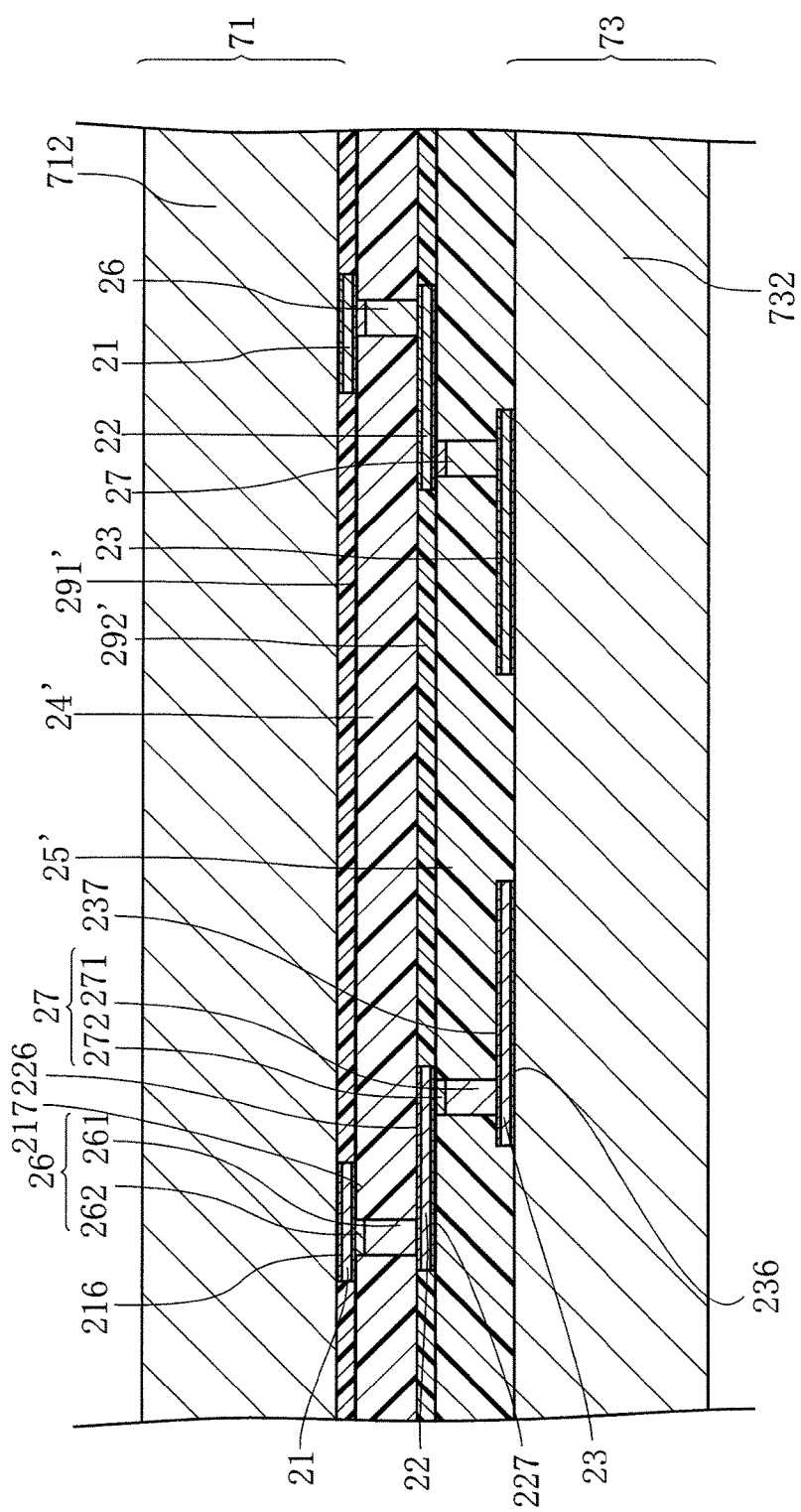
FIG. 58 is a cross-sectional view showing a process of a method for manufacturing the semiconductor device based on the first modification of Embodiment 1-C of the present invention.
Figure 59:
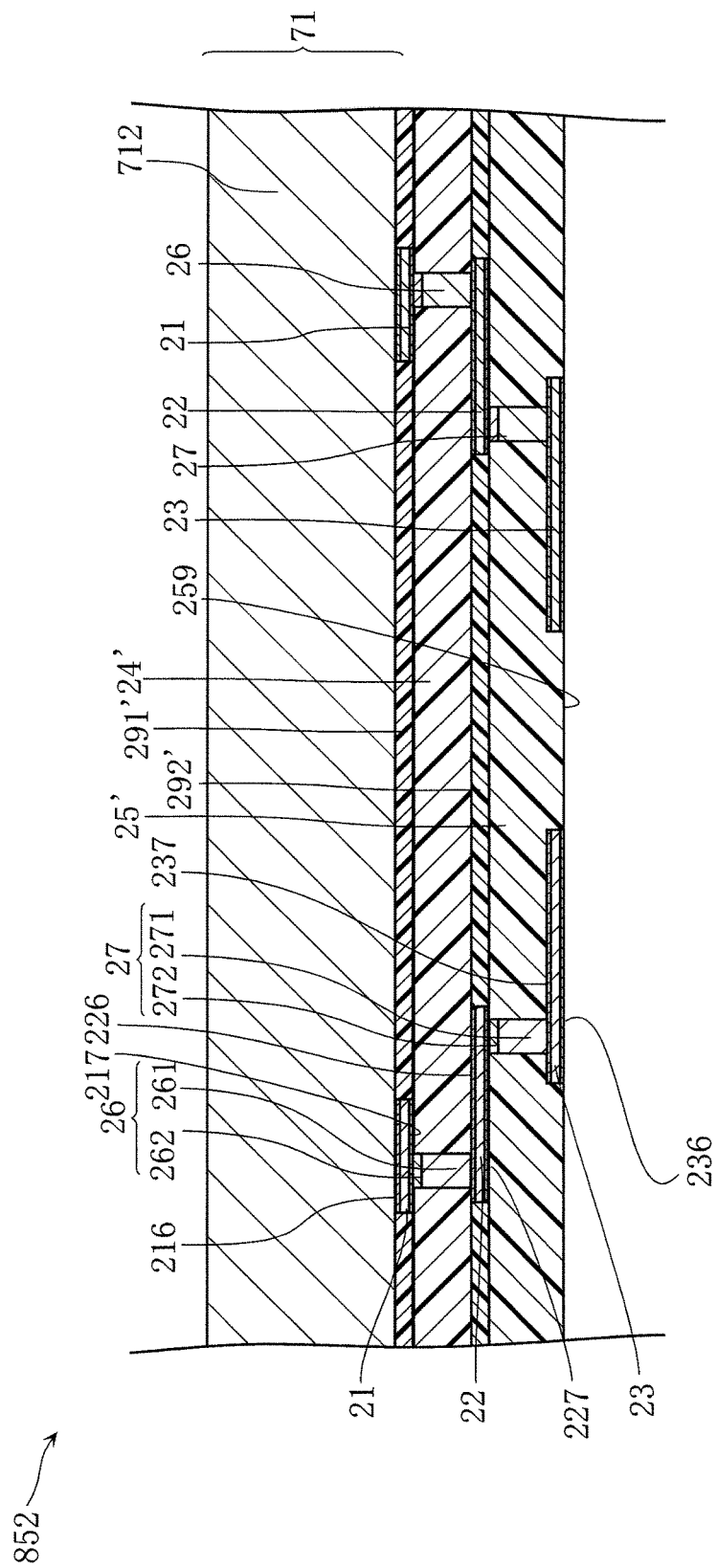
FIG. 59 is a cross-sectional view showing a process following FIG. 58.

First, processes similar to the processes described with reference to FIGS. 39 to 49 are performed, and the product shown in FIG. 58 is manufactured. Next, the base 732 is removed from the frame 73, while leaving the base 712 in the frame 71, as shown in FIG. 59. The intermediate product 852 shown in FIG. 59 is formed as described above.

Figure 60:
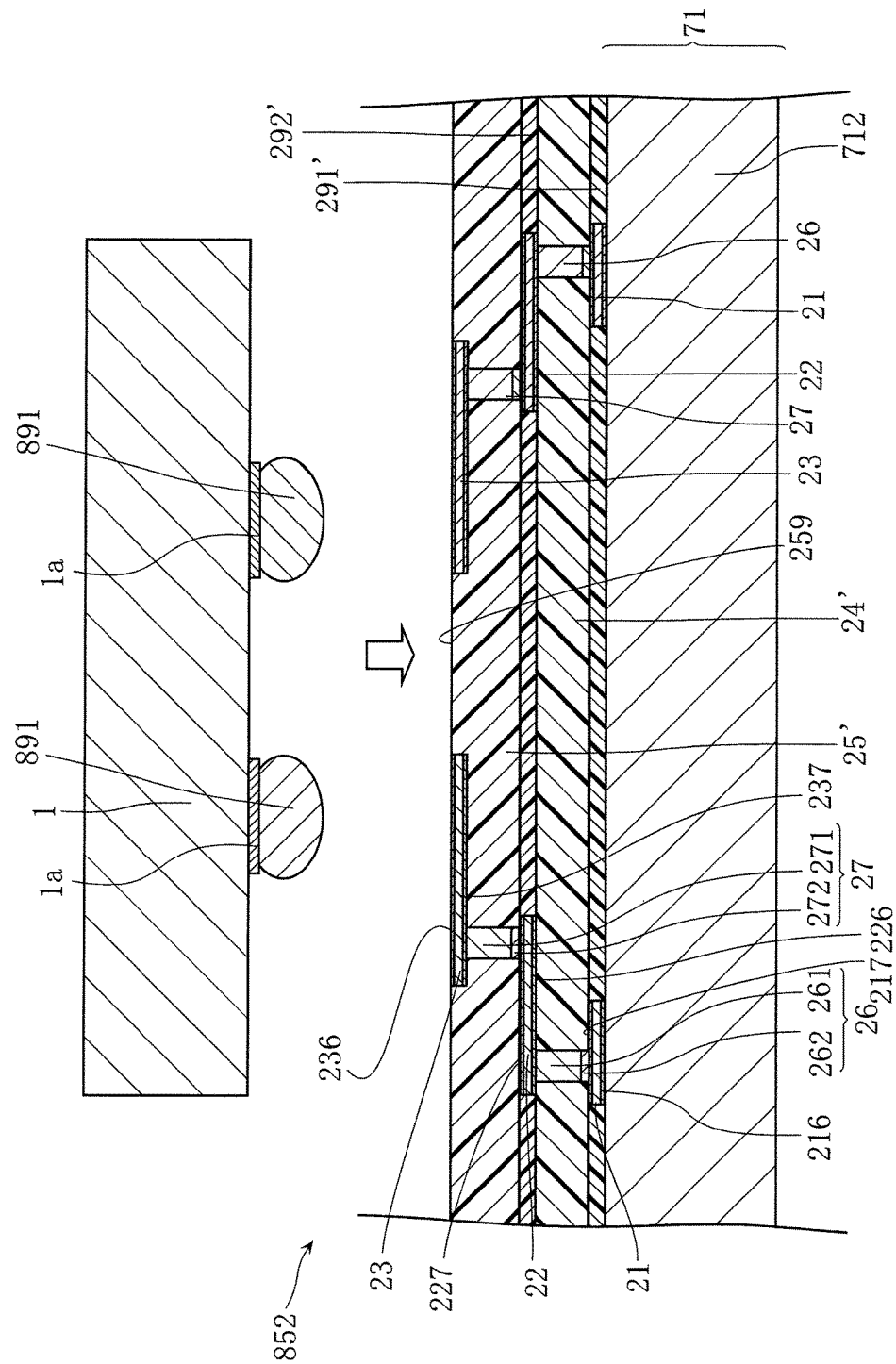
FIG. 60 is a cross-sectional view showing a process following FIG. 59.

Next, the following processes are performed, similarly to the case of manufacturing the semiconductor device 100, after turning the intermediate product 852 over, as shown in FIG. 60.

As shown in this diagram, the conductive adhesive 891 is applied to the chip electrodes 1a of the semiconductor chip 1. In the present embodiment, the conductive adhesive 891 is solder.

Figure 61:
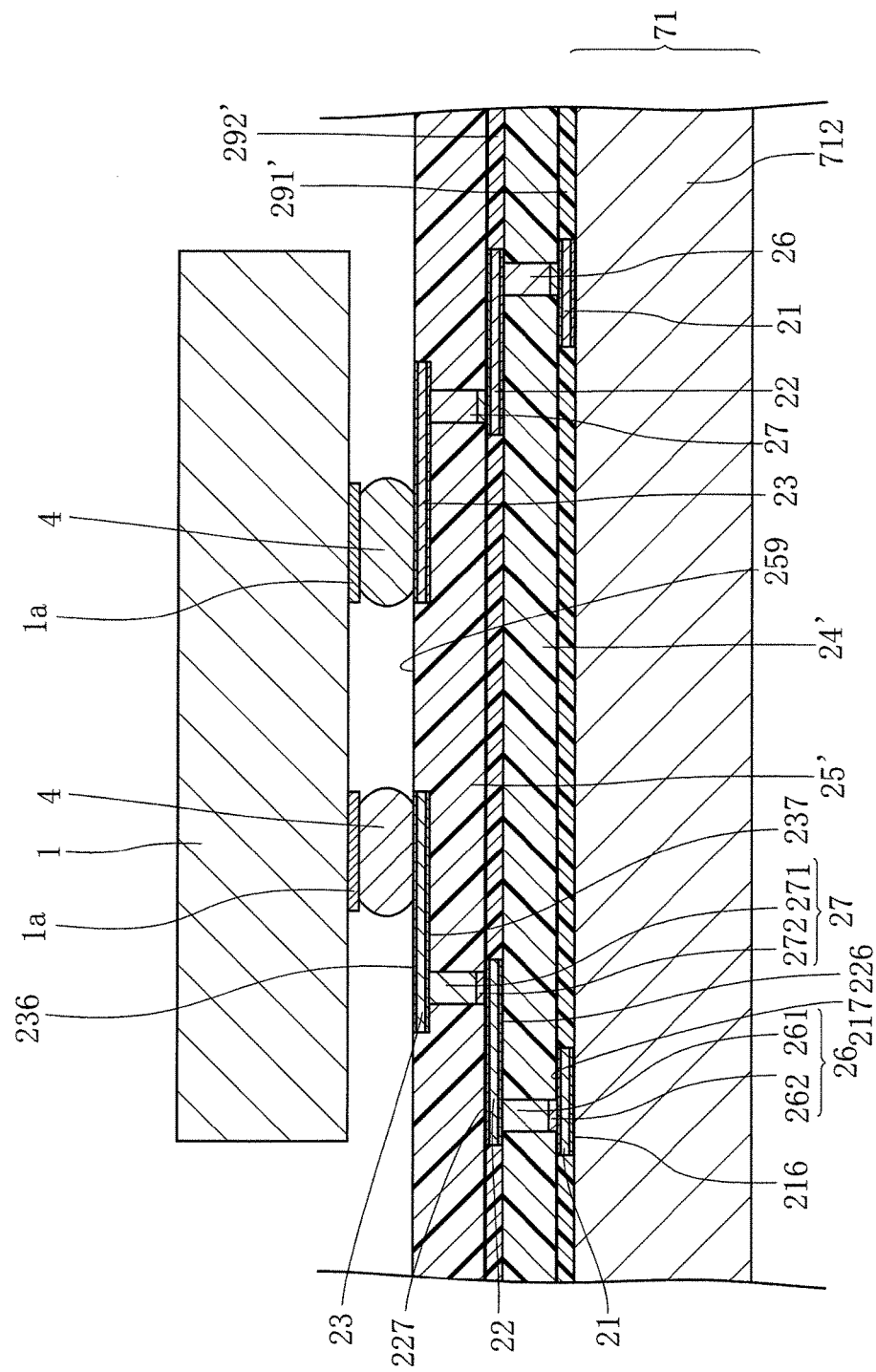
FIG. 61 is a cross-sectional view showing a process following FIG. 60.

Next, the semiconductor chip 1 is mounted to the intermediate product 852 so that the chip electrodes 1a and the electrode films 23 sandwich the conductive adhesive 891. As shown in FIG. 61, the semiconductor chip 1 is fixed to the intermediate product 852, as a result of the conductive adhesive 891 solidifying. Also, the conductive adhesive 891 changes into the conductive connection members 4 as a result of solidifying. The conductive connection members 4 are joined to the chip electrodes 1a and the electrode surface 236 of the electrode films 23 in this way. Note that although a plurality of semiconductor chips 1 are mounted to the intermediate product 852 in the present embodiment, one of the plurality of semiconductor chips 1 that is mounted to the intermediate product 852 is shown in this diagram. Also, when the semiconductor chip 1 is fixed to the intermediate product 852, the conductive adhesive 891 may be applied to the electrode films 23, rather than applying the conductive adhesive 891 to the chip electrodes 1a.

Figure 62:
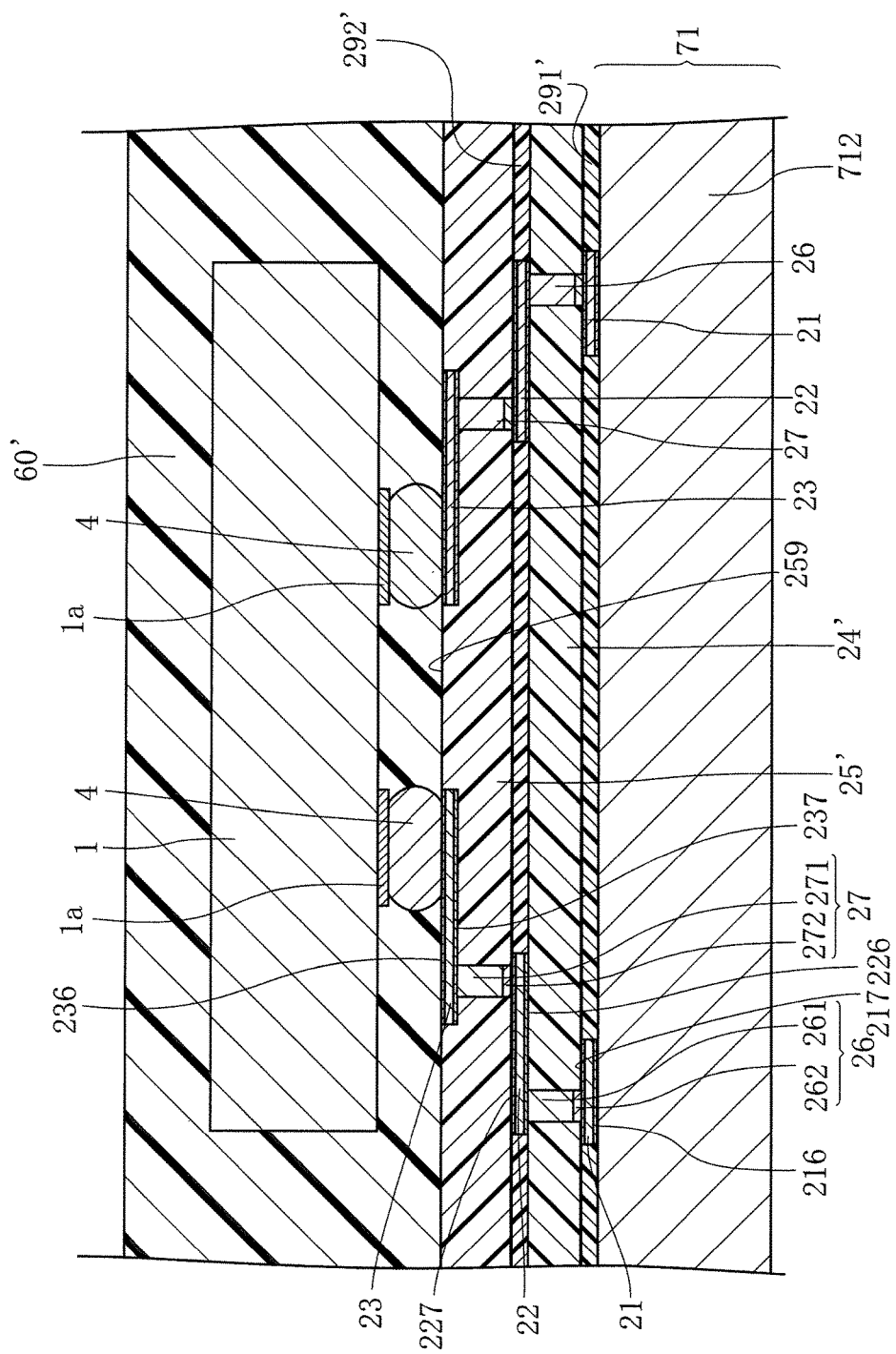
FIG. 62 is a cross-sectional view showing a process following FIG. 61.

Next, as shown in FIG. 62, the semiconductor chip 1, the insulating layer 25', and the electrode films 23 are covered with the sealing resin part 60'. The sealing resin part 60' can be formed by a transfer mold technique, for example. With the transfer mold technique, processing for placing the intermediate product 852 in a metal mold and pouring in a liquefied resin into the metal mold is performed.

Figure 63:
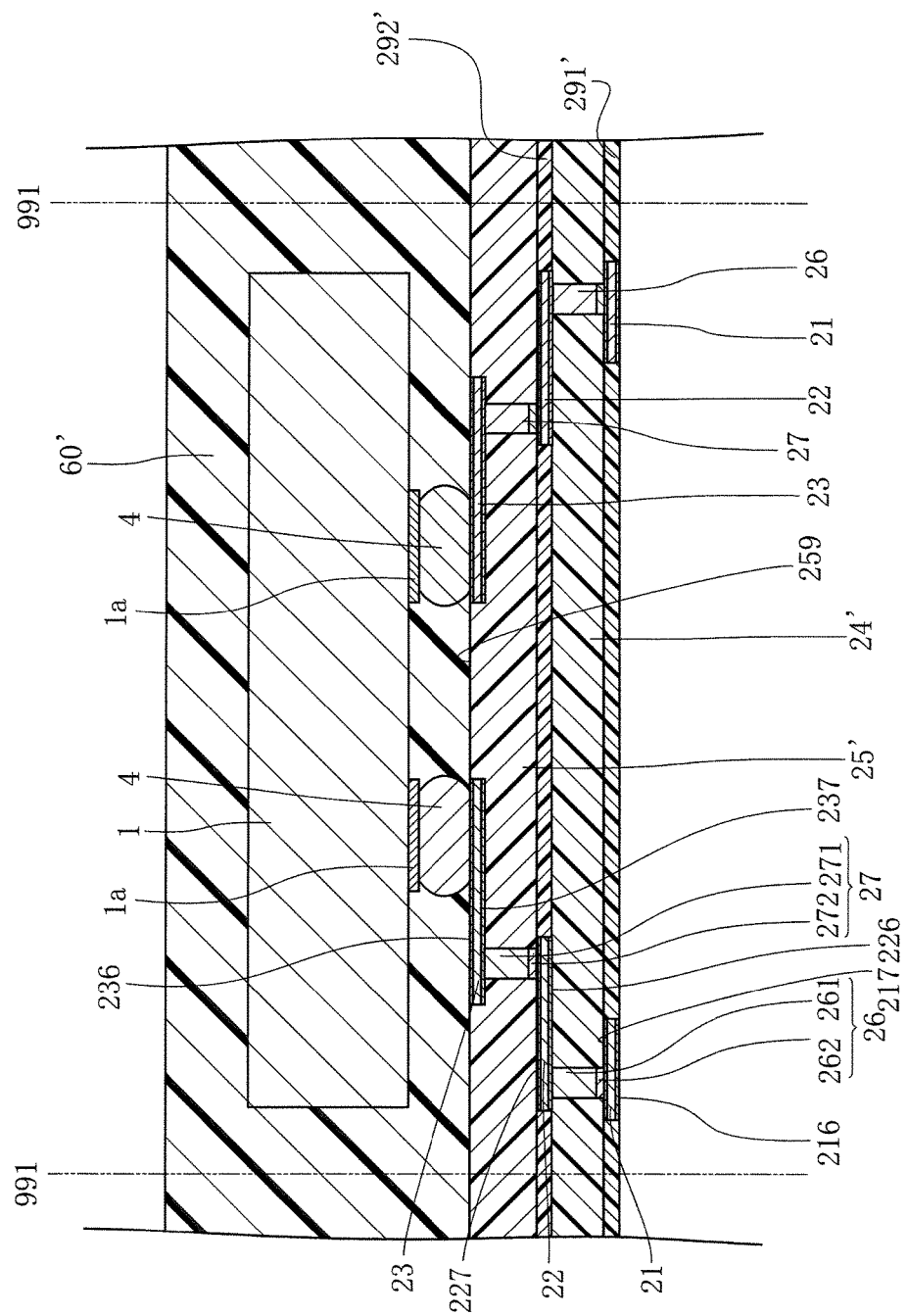
FIG. 63 is a cross-sectional view showing a process following FIG. 62.

Next, the base 712 is removed from the frame 71, as shown in FIG. 63. The electrode surface 216 of the electrode films 21 is thereby exposed.

Next, the semiconductor device 101 is manufactured by cutting the sealing resin part 60' along the two-dot chain line 991 shown in FIG. 63.

Next, the working effects of the present modification will be described.

In the present modification, the frame 73 is formed by forming the electrode films 23 on the base 732 directly. Such a configuration enables the efficiency with which semiconductor devices are manufactured to be increased for similar reasons to those described in relation to the semiconductor device 100.

In the present modification, a process of forming the frame 71 by forming the electrode films 21 directly on the base 712 is further provided. Such a configuration enables the efficiency with which semiconductor devices are manufactured to be increased for similar reasons to those described in relation to the semiconductor device 100.

In the present modification, the process of forming the interconnect layer 2 includes a process of fixing the electrode films 21 relative to the electrode films 23, on the electrode surface 237 side of the electrode films 23, and a process of removing the base 712 from the frame 71 (see FIGS. 62 and 63). According to such a method, the electrode films 21 and the electrode films 23 are disposed in different positions to each other in the thickness direction of the electrode films 23 (in the semiconductor device 101, coincides with the thickness direction Z of the semiconductor chip 1). Thus, the method of the present modification enables a configuration in which the interconnect layer 2 includes the electrode films 21 and 23 disposed in different positions to each other in the direction Z to be efficiently obtained.

In the present modification, the process of forming the conductive connection members 4 is performed after the process of fixing the electrode films 21 relative to the electrode films 23. That is, the process of mounting the semiconductor chip 1 to the intermediate product 852, described with reference to FIGS. 60 and 61, is performed after the process of fixing the frame 71 to the conductive contact portion 261 and the insulating layer 24'. According to such a configuration, it will be clear whether the electrode films 21 and 23 and the like have intended shapes and structures (i.e., are defective or not), before mounting the semiconductor chip 1 to the intermediate product 852 on which a plurality of electrode films 21 and 23 have been disposed. Thus, mounting the semiconductor chip 1 to the intermediate product 852 in the case where the intermediate product 852 is defective can be avoided. Accordingly, the method according to the present modification enables the yield of semiconductor devices to be improved.

Second Modification of Embodiment 1-C

Next, a second modification of Embodiment 1-C of the present invention will be described.

Figure 64:
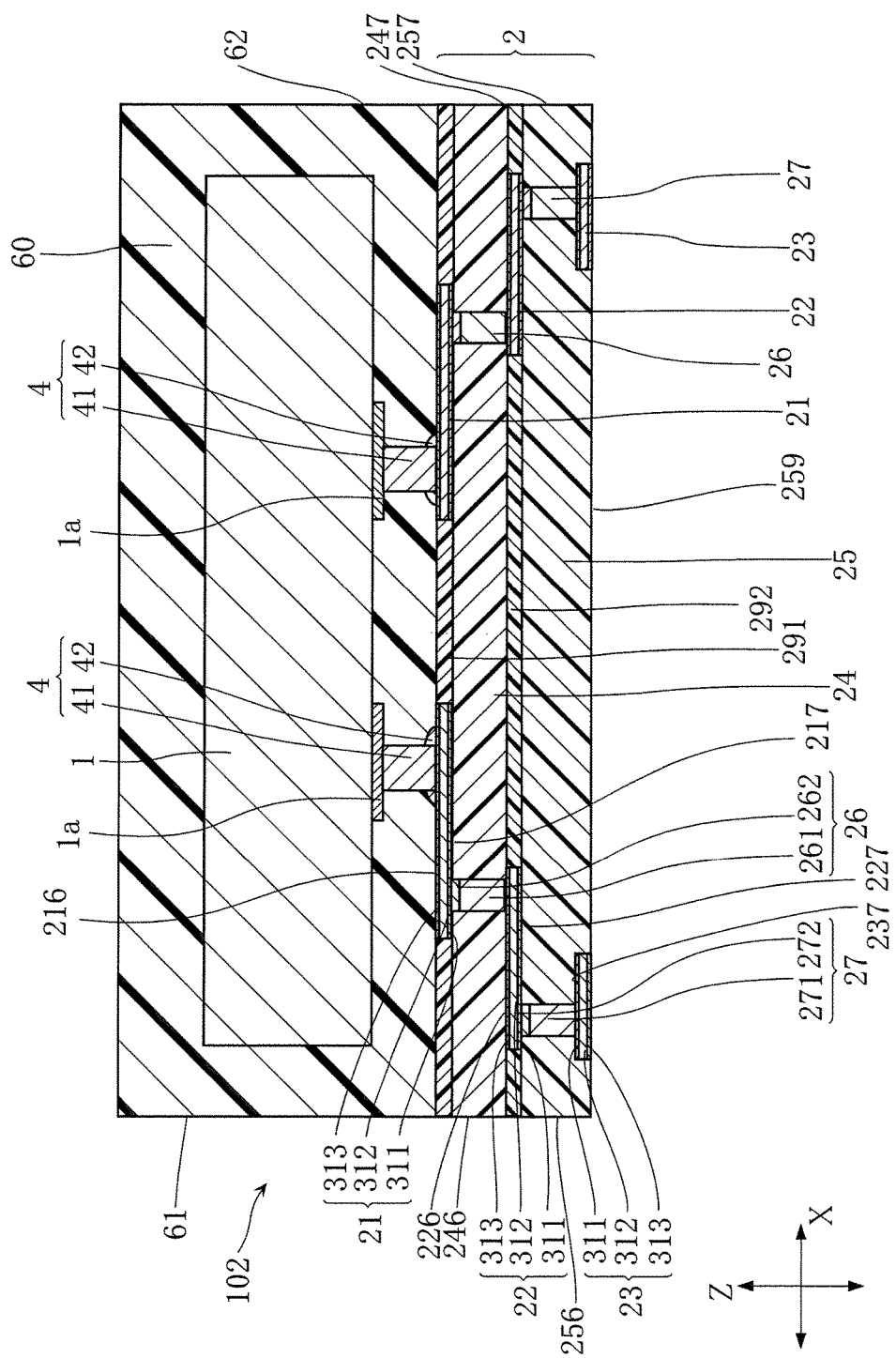
FIG. 64 is a cross-sectional view of a semiconductor device based on a second modification of Embodiment 1-C of the present invention.

FIG. 64 is a cross-sectional view of the semiconductor device according to the present modification.

A semiconductor device 102 shown in this diagram differs from the semiconductor device 100 in that the conductive connection members 4 each include a columnar member 41 and a fixing member 42. The columnar member 41 is a post that consists of copper or gold. The columnar member 41 has a cylindrical shape that extends in the direction Z. The fixing member 42 fixes the columnar member 41 to the electrode film 21. The fixing member 42 consists of silver or solder, for example. When mounting the semiconductor chip 1 to the intermediate product 851 shown in FIG. 51, a silver paste or a solder paste is interposed between the columnar members 41 and the electrode films 21, in a state where the columnar members 41 are formed on the chip electrodes 1a. The semiconductor chip 1 is thereby fixed to the intermediate product 851. The silver paste or solder paste serves as the fixing member 42.

Even with such a configuration, similar effects to the semiconductor device 100 can be acquired.

Third Modification of Embodiment 1-C

Next, a third modification of Embodiment 1-C of the present invention will be described.

Figure 65:
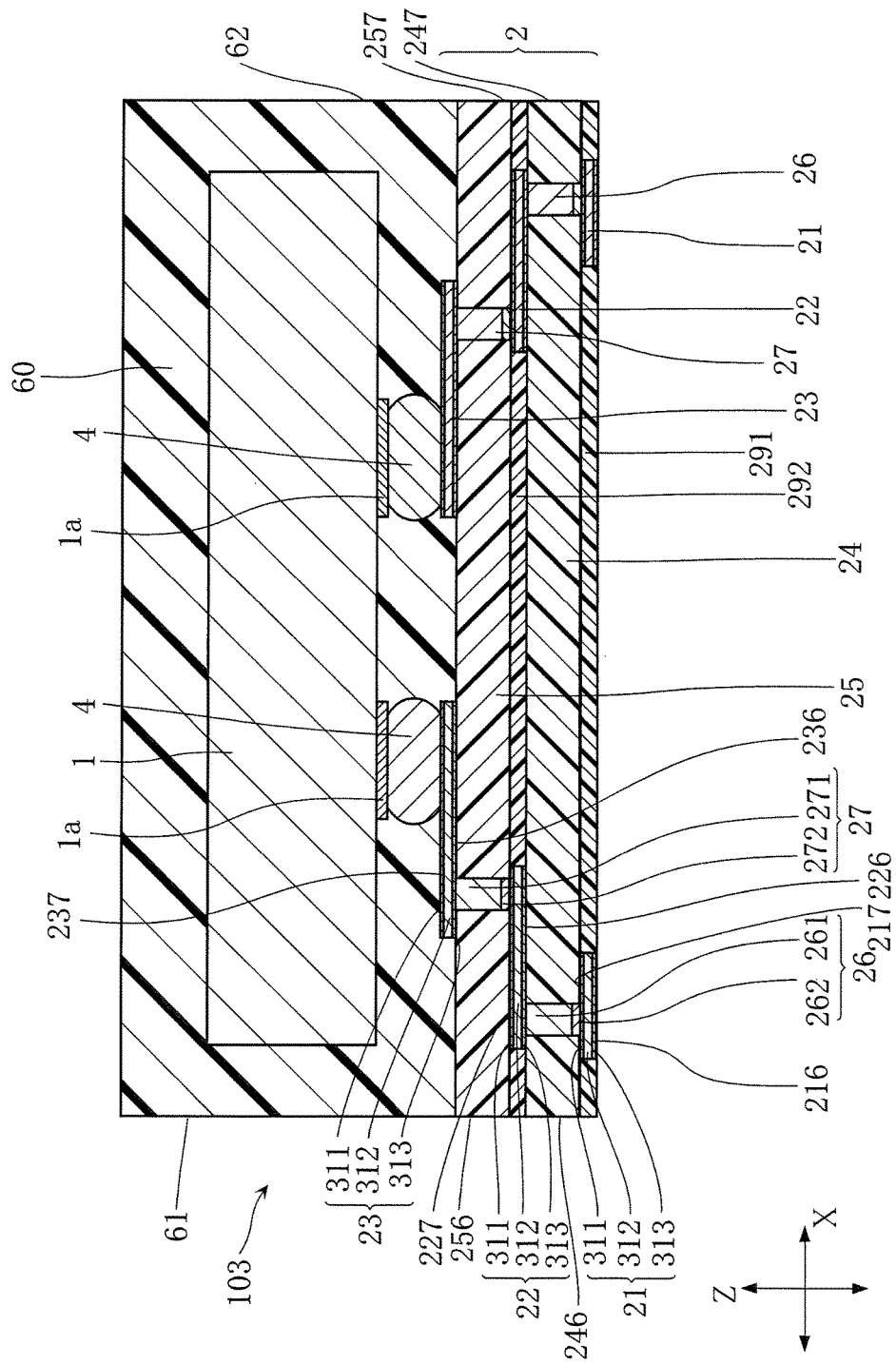
FIG. 65 is a cross-sectional view of a semiconductor device based on a third modification of Embodiment 1-C of the present invention.

FIG. 65 is a cross-sectional view of a semiconductor device according to the present modification.

In the present modification, the process of manufacturing the interconnect layer 2 differs, compared with the method for manufacturing the semiconductor device 101. Thus, in a semiconductor device 103, the electrode surface 237 of the electrode films 23 faces the side on which the semiconductor chip 1 is located, and the electrode surface 236 of the electrode films 23 faces away from the side on which the semiconductor chip 1 is located. In the present embodiment, the electrode surface 237 of the electrode films 23 opposes the chip electrodes 1a across the conductive connection members 4.

Next, a method for manufacturing the semiconductor device 103 will be described.

First, the frames 71, 72, and 73 are manufactured by the method described with reference to FIGS. 39 to 41.

Figure 66:
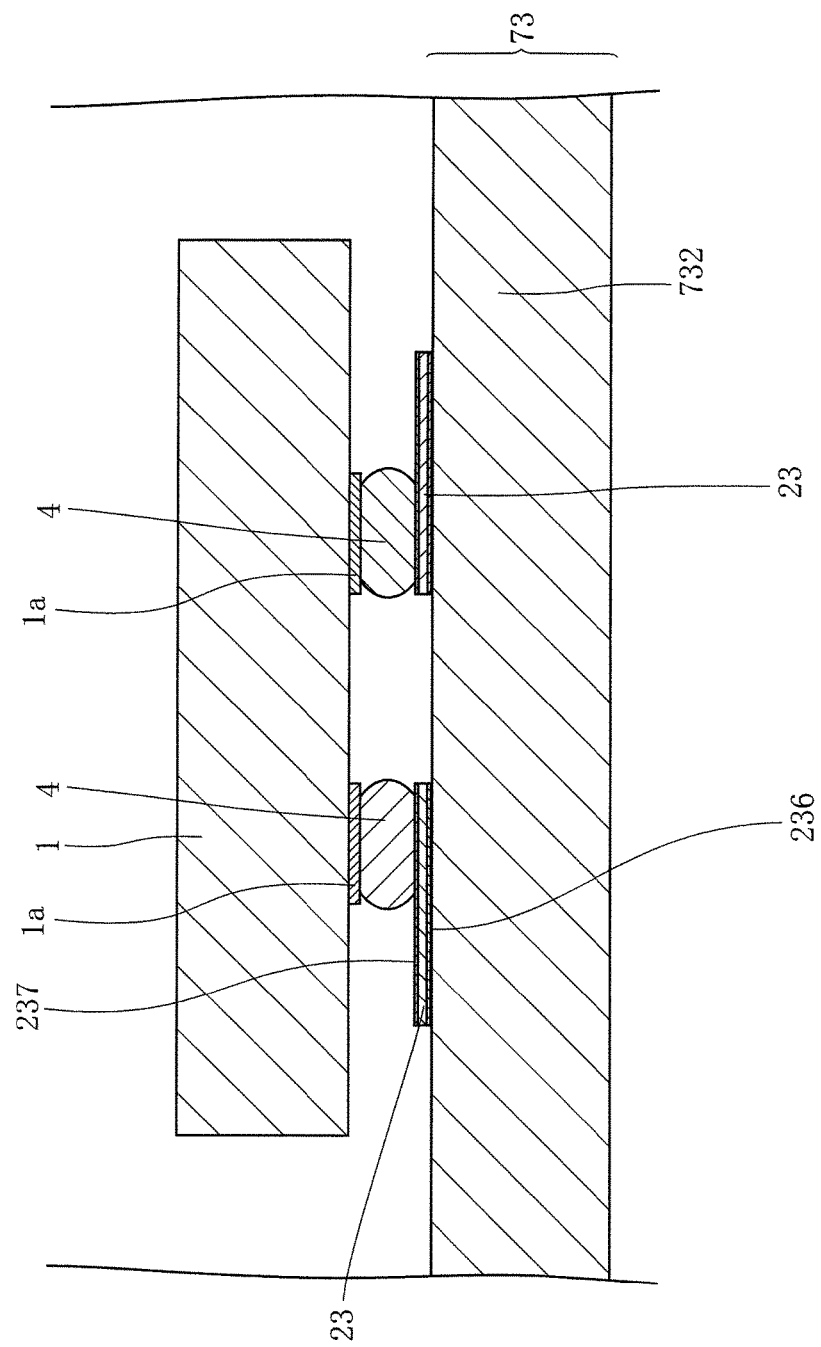
FIG. 66 is a cross-sectional view showing a process of a method for manufacturing the semiconductor device based on the third modification of Embodiment 1-C of the present invention.

Next, as shown in FIG. 66, a semiconductor chip 1 that includes the chip electrodes 1a is prepared. Next, the conductive adhesive 891 (not shown in the present modification) is applied to the chip electrodes 1a of the semiconductor chip 1.

Next, the semiconductor chip 1 is mounted to the frame 73 so that the chip electrodes 1a and the electrode films 23 sandwich the conductive adhesive 891. The semiconductor chip 1 is fixed to the frame 73, as a result of the conductive adhesive 891 solidifying. Also, the conductive adhesive 891 changes into the conductive connection members 4 as a result of solidifying. The conductive connection members 4 are joined to the chip electrodes 1a and the electrode surface 237 of the electrode films 23 in this way.

Figure 67:
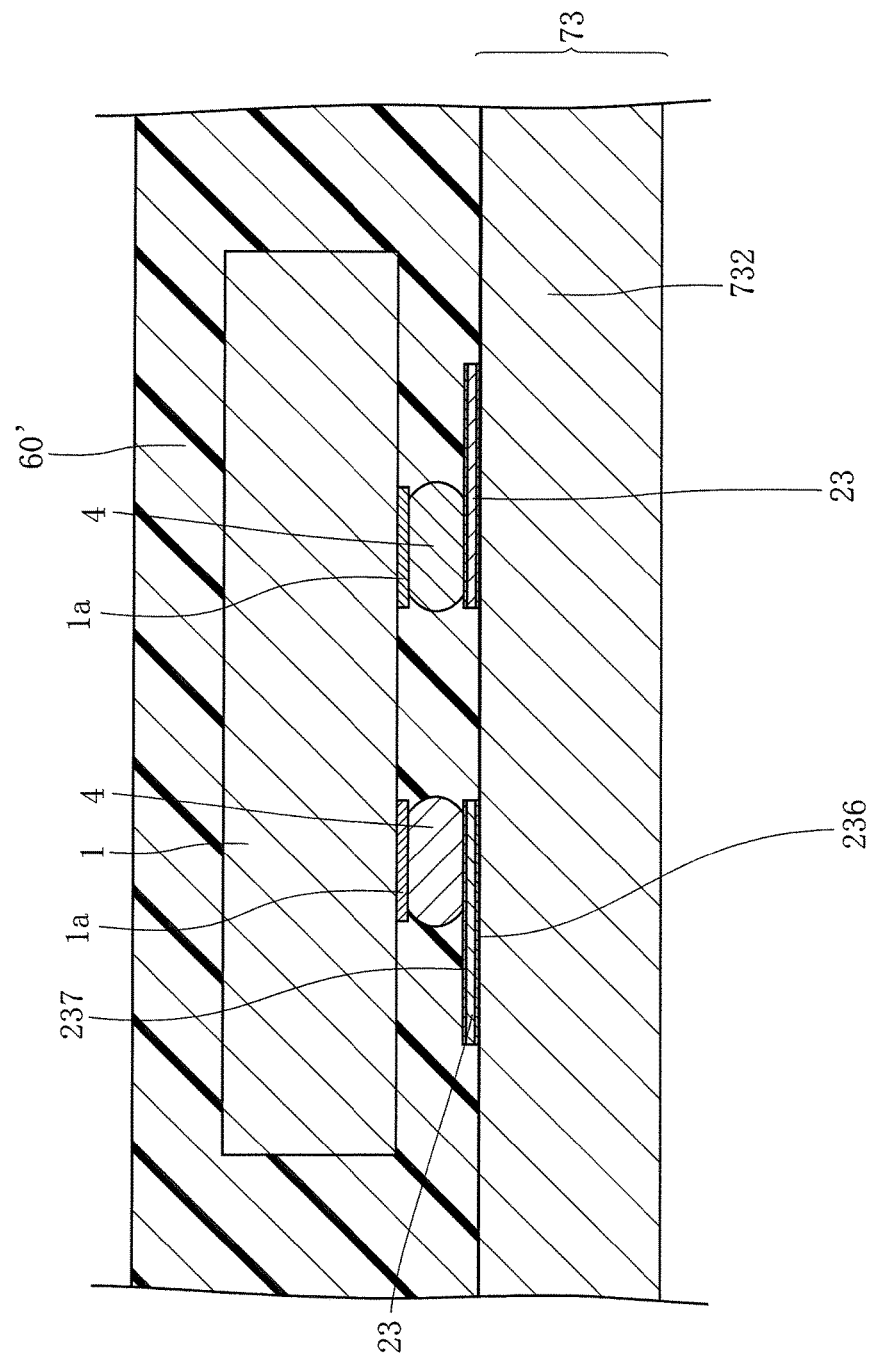
FIG. 67 is a cross-sectional view showing a process following FIG. 66.

Next, as shown in FIG. 67, the semiconductor chip 1, the base 732 and the electrode films 23 are covered with the sealing resin part 60'. The sealing resin part 60' can be formed by a transfer mold technique, for example. With the transfer mold technique, processing for placing the frame 73 in a metal mold and pouring in a liquefied resin into the metal mold is performed.

Next, the base 732 is removed from the frame 73. The electrode surface 236 of the electrode films 23 is thereby exposed from the sealing resin part 60'.

Figure 68:
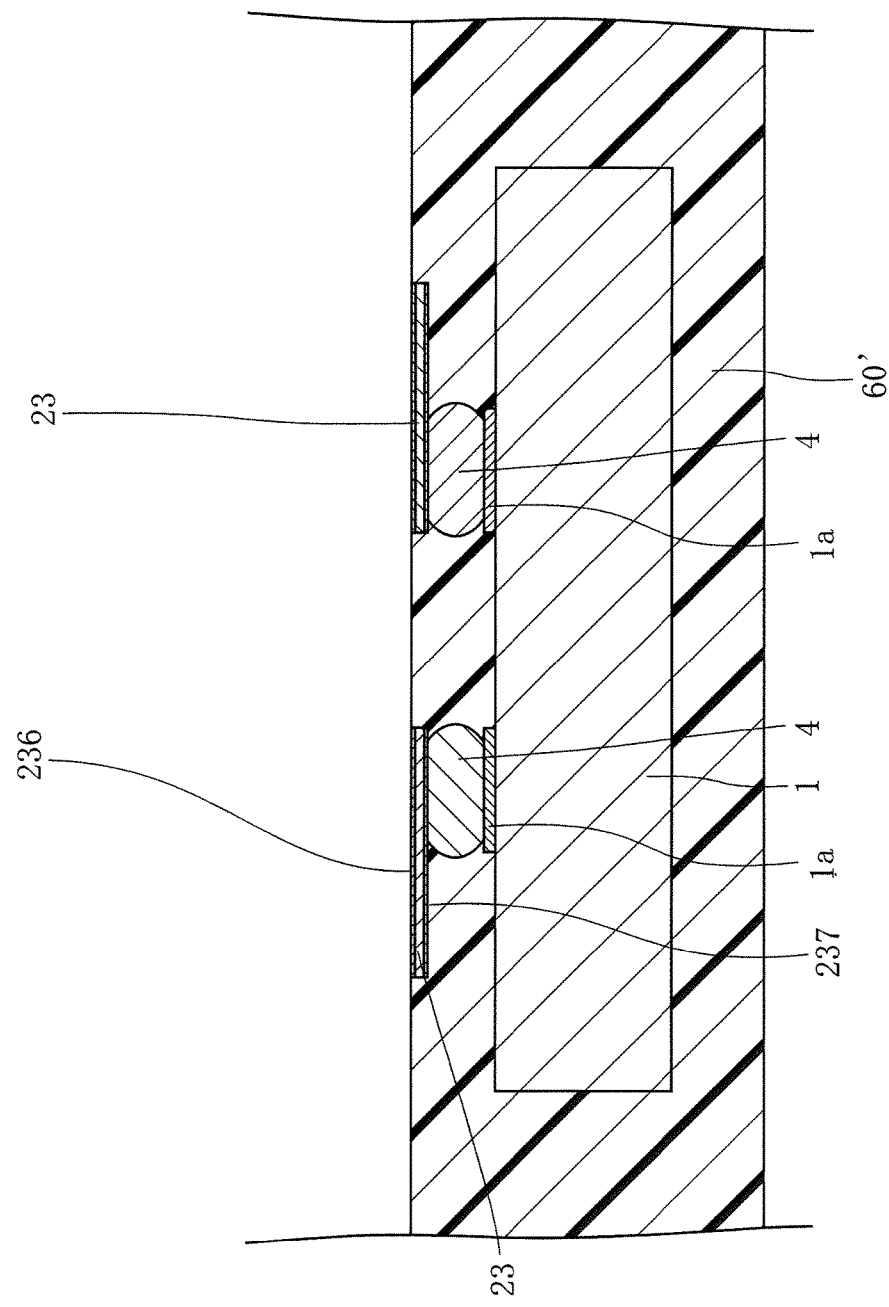
FIG. 68 is a cross-sectional view showing a process following FIG. 67.

Next, the product shown in FIG. 67 is turned over, as shown in FIG. 68.

Figure 69:
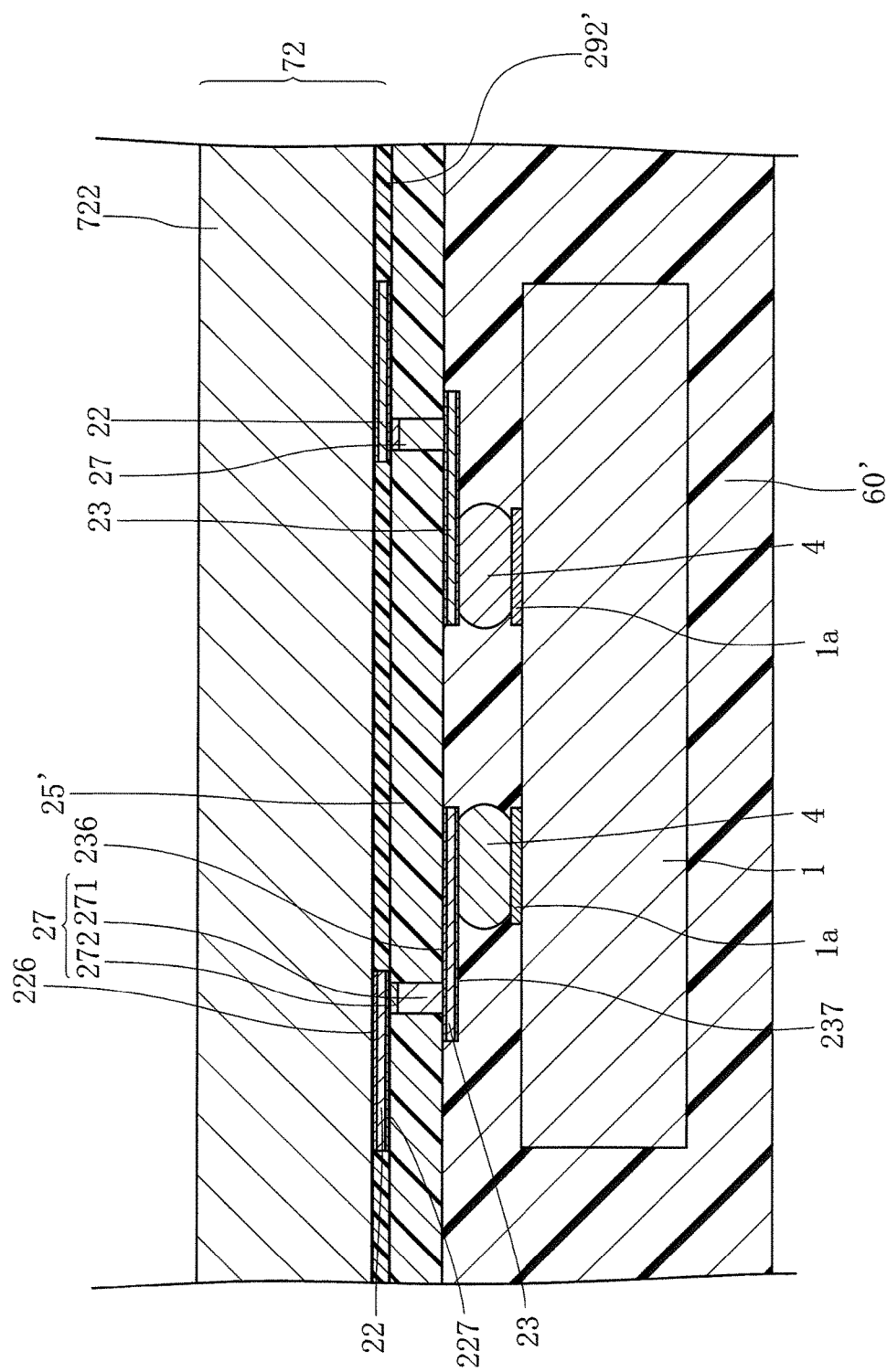
FIG. 69 is a cross-sectional view showing a process following FIG. 68.
Figure 70:
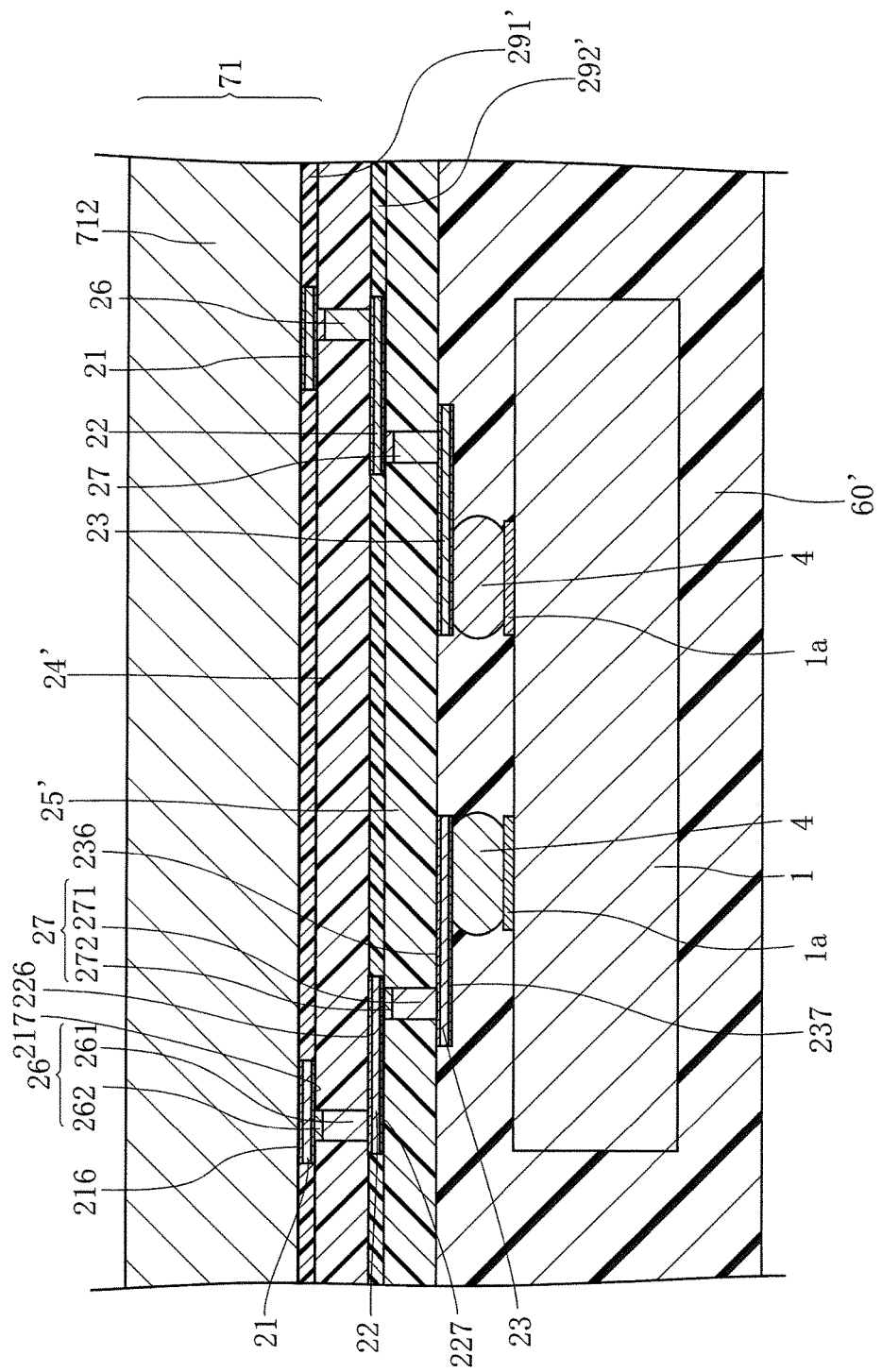
FIG. 70 is a cross-sectional view showing a process following FIG. 69.
Figure 71:
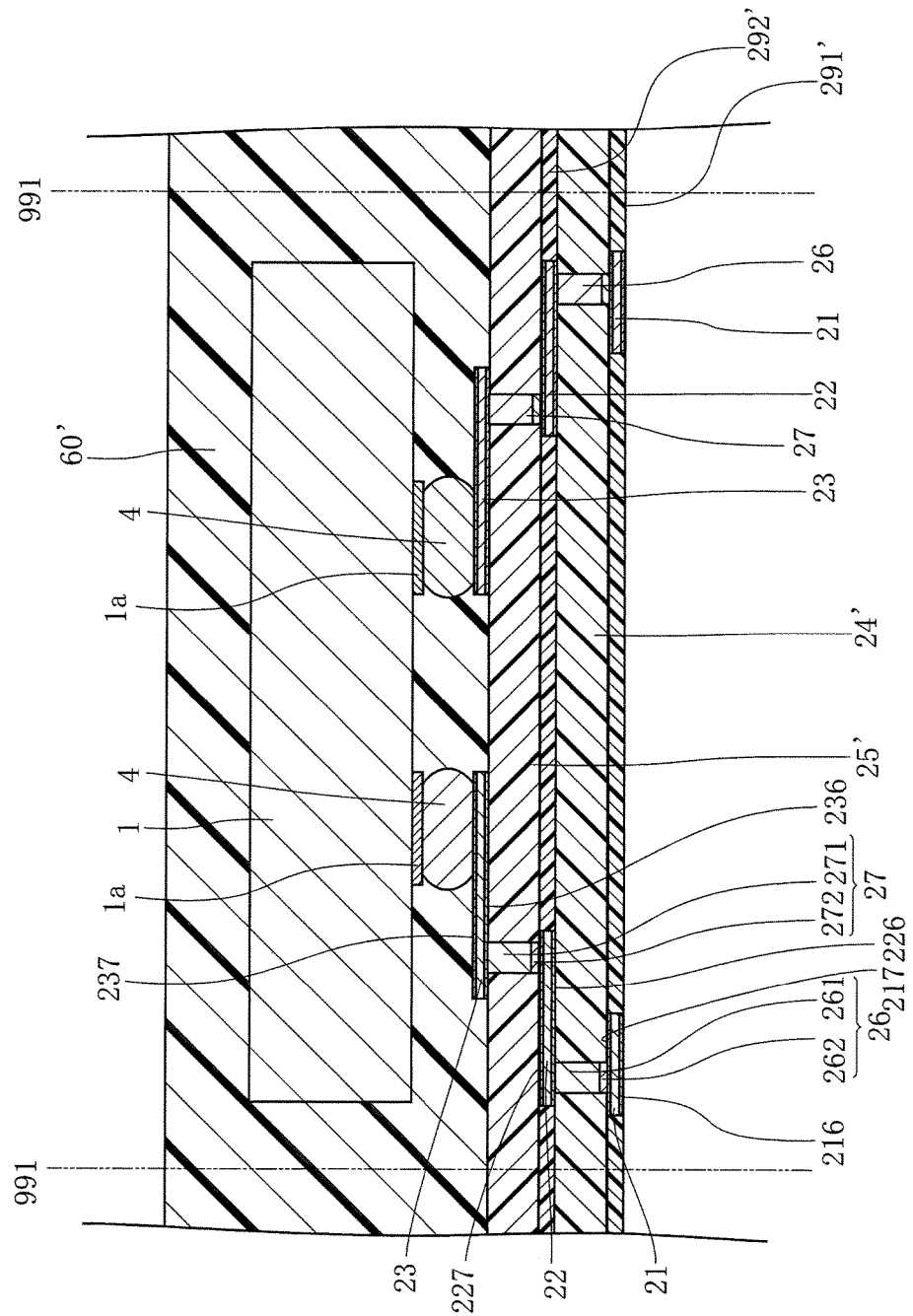
FIG. 71 is a cross-sectional view showing a process following FIG. 70.

Next, as shown in FIGS. 69 to 71, the insulating layer 24', and 25' and the electrode films 21 and 22 are formed, by repeating processes similar to the processes described with reference to FIGS. 43 to 51. Specifically, the following processes are performed.

As shown in FIG. 69, the insulating layer 25' is formed on the sealing resin part 60' and the electrode films 23. Next, the insulating layer 25' is partially removed. Next, the conductive contact portions 271 are formed. Next, the conductive adhesive 882 is applied to the conductive contact portions 271 (not shown). Next, the insulating layer 292' is formed. Next, the frame 72 is pressed against the conductive contact portions 271 and the insulating layer 25' so that the conductive contact portions 271 and the electrode surface 227 of the electrode films 22 sandwich the conductive adhesive 882. The frame 72 is fixed to the conductive contact portions 271 and the insulating layer 25', as a result of the conductive adhesive 882 solidifying. Also, the conductive adhesive 882 changes into the conductive joining layer 272 as a result of solidifying. The conductive contact portions 271 are joined to the electrode surface 227 of the electrode films 22 in this way. Also, the electrical connection members 27 that contact the electrode surface 227 of the electrode films 22 and the electrode surface 236 of the electrode films 23 are formed. The electrode films 22, which are located in the electrode surface 236 side of the electrode films 23, are fixed relative to the electrode films 23, as a result of the frame 72 being fixed to the conductive contact portions 271 and the insulating layer 25'. Next, the base 722 is removed from the frame 72.

Next, the frame 71 is disposed after performing processes such as forming the insulating layer 24', as shown in FIG. 70. Next, the base 712 is removed from the frame 71 and the product shown in FIG. 71 is turned over.

Next, the semiconductor device 103 is manufactured by cutting the sealing resin part 60' along the two-dot chain line 991 shown in FIG. 71.

Next, the working effects of the present modification will be described.

In the present modification, the frame 73 is formed by forming the electrode films 23 directly on the base 732. Such a configuration enables the efficiency with which semiconductor devices are manufactured to be increased, similarly to the semiconductor device 101.

In the present modification, a process of forming the frame 71 by forming the electrode films 21 directly on the base 712 is further provided. Such a configuration enables the efficiency with which semiconductor devices are manufactured to be increased, similarly to the semiconductor device 101.

In the present modification, the process of forming the interconnect layer 2 includes a process of fixing the electrode films 21 relative to the electrode films 23, on the electrode surface 237 side of the electrode films 23, and a process of removing the base 712 from the frame 71 (see FIG. 70). According to such a method, the electrode films 21 and the electrode films 23 are disposed in different positions to each other in the thickness direction (in the semiconductor device 103, coincides with the thickness direction Z of the semiconductor chip 1) of the electrode films 23. Thus, such a method enables a configuration in which the interconnect layer 2 includes the electrode films 21 and 23 disposed in different positions to each other in the thickness direction Z to be effectively obtained.

Embodiment 2-C

Figure 72:
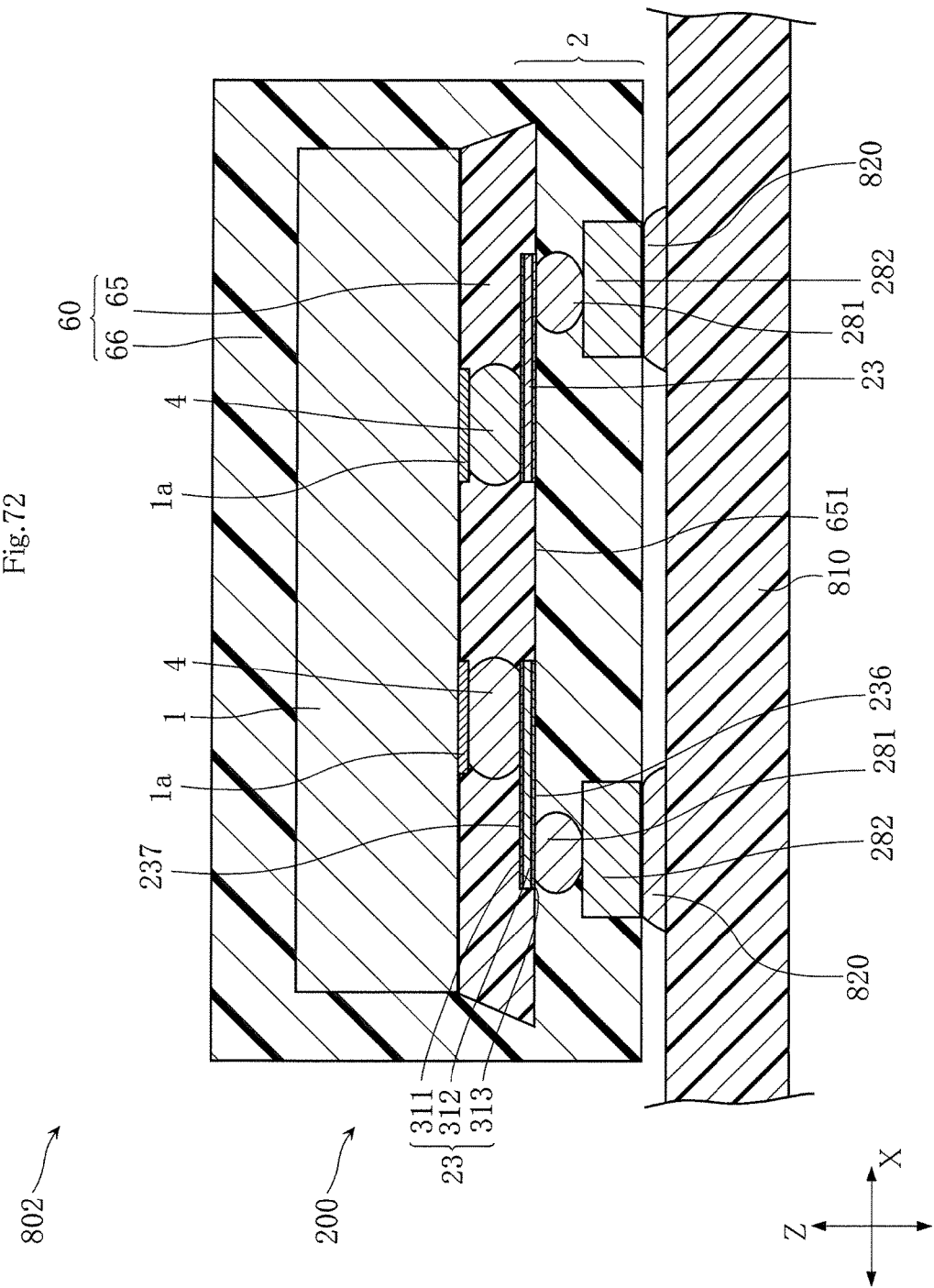
FIG. 72 is a cross-sectional view of a semiconductor device based on Embodiment 2-C of the present invention.

FIG. 72 is a cross-sectional view of the package structure of a semiconductor device according to Embodiment 2-C of the present invention.

A package structure 802 shown in this diagram is provided with a semiconductor device 200, a package substrate 810, and a solder layer 820. The semiconductor device 200 is mounted to the package substrate 810. Since the package substrate 810 and the solder layer 820 are similar to Embodiment 1-C, description thereof will be omitted.

The semiconductor device 200 is provided with a semiconductor chip 1, a interconnect layer 2, 2 conductive connection members 4, and a sealing resin part 60. Since the semiconductor chip 1 and the conductive connection members 4 are similar to Embodiment 1-C, description thereof will be omitted.

In the present embodiment, the interconnect layer 2 includes a plurality of electrode films 23, a plurality of electrical connection members 281, and a plurality of leads 282. Because the specific configuration of the electrode films 23 is similar to the configuration in the semiconductor device 103, description thereof will be omitted.

The leads 282 consist of a conductor such as copper. The thickness (dimension in the direction Z) of the leads 282 is considerably greater than the thickness of the electrode films 23. The leads 282 each have a thickness of 0.1-0.4 mm, for example. The leads 282 each have a region that overlaps one of the plurality of the electrode films 23.

Each electrical connection member 281 is interposed between an electrode film 23 and a lead 282. The electrical connection member 281 is disposed in a position that overlaps both the electrode films 23 and the lead 282 when viewed in the direction Z. The electrical connection member 281 contacts the electrode films 23 and the lead 282. The electrode films 23 and the lead 282 are electrically connected via an electrical connection member 281. The electrical connection members 281 consist of solder, for example.

The sealing resin part 60 includes a first resin portion 65 and a second resin portion 66.

The first resin portion 65 is called an underfiller, and covers the chip electrodes 1a, the conductive connection members 4, and the electrode films 23. The first resin portion 65 has a resin side surface 651. The resin side surface 651 is flat, and is flush with the electrode surface 236 of the electrode films 23. The first resin portion 65 consists of an epoxy-based resin, for example.

The second resin portion 66 covers the semiconductor chip 1, the electrical connection members 281, and the leads 282. The semiconductor chip 1 and the electrical connection member 281 are not exposed at all from the second resin portion 66. On the other hand, a portion of each lead 282 is exposed from the second resin portion 66. The portion of the leads 282 exposed from the second resin portion 66 is joined to the solder layer 820.

Next, a method for manufacturing the semiconductor device 200 will be described.

The product shown in FIG. 66 is manufactured by passing through similar processes to the manufacturing process of the semiconductor device 103.

Figure 73:
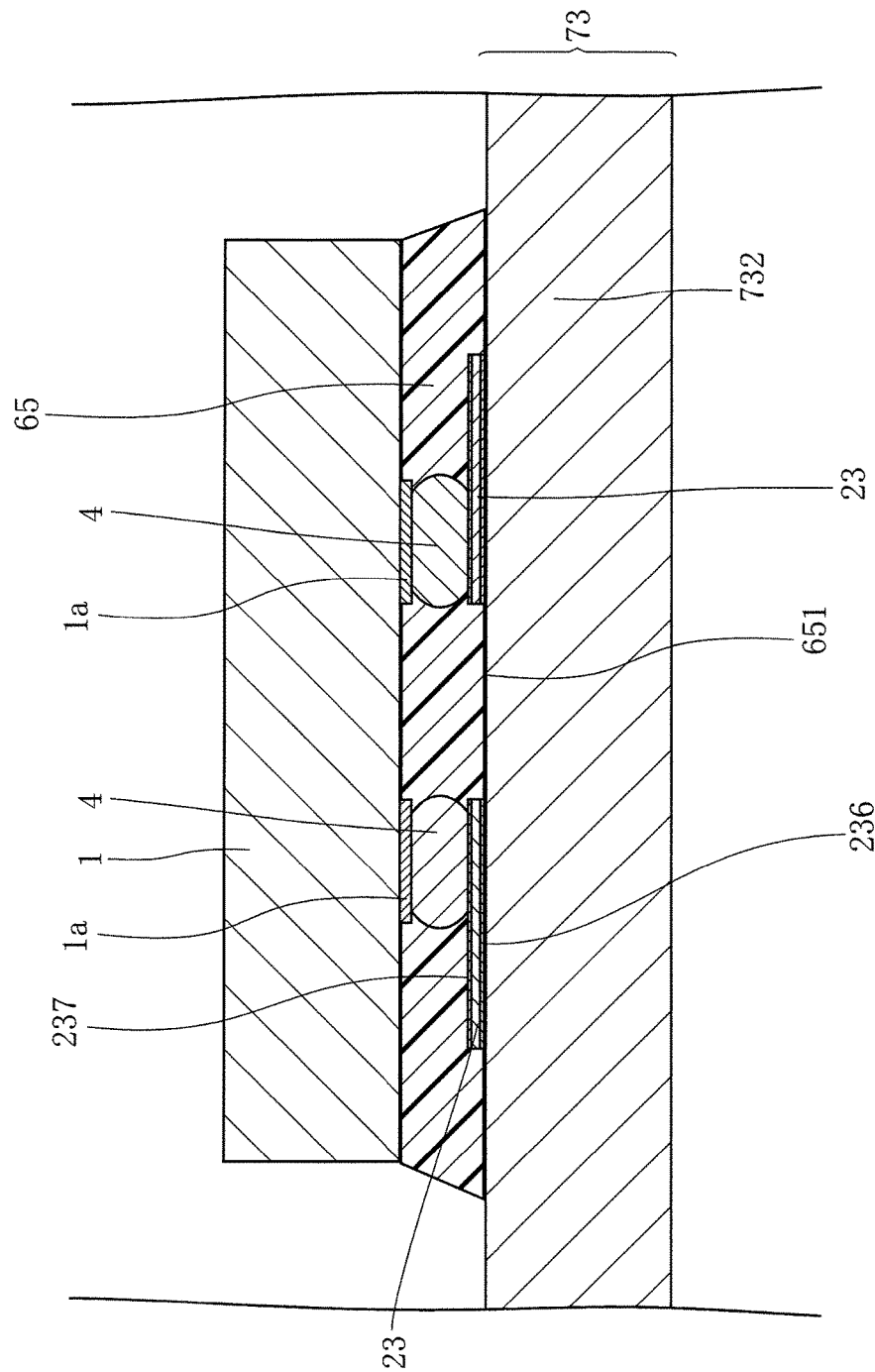
FIG. 73 is a cross-sectional view showing a process of a method for manufacturing the semiconductor device based on Embodiment 2-C of the present invention.

Next, the first resin portion 65 is formed, as shown in FIG. 73. With the first resin portion 65, a liquid resin material is dripped on the electrode films 23 or near the electrode films 23. The resin material flows between the base 732 and the semiconductor chip 1, and fills the space between the base 732 and the semiconductor chip 1. Thereafter, the first resin portion 65 is formed by solidifying the resin material. When the resin material has set, the electrode films 23, the conductive connection members 4, and the semiconductor chip 1 are fixed.

Figure 74:
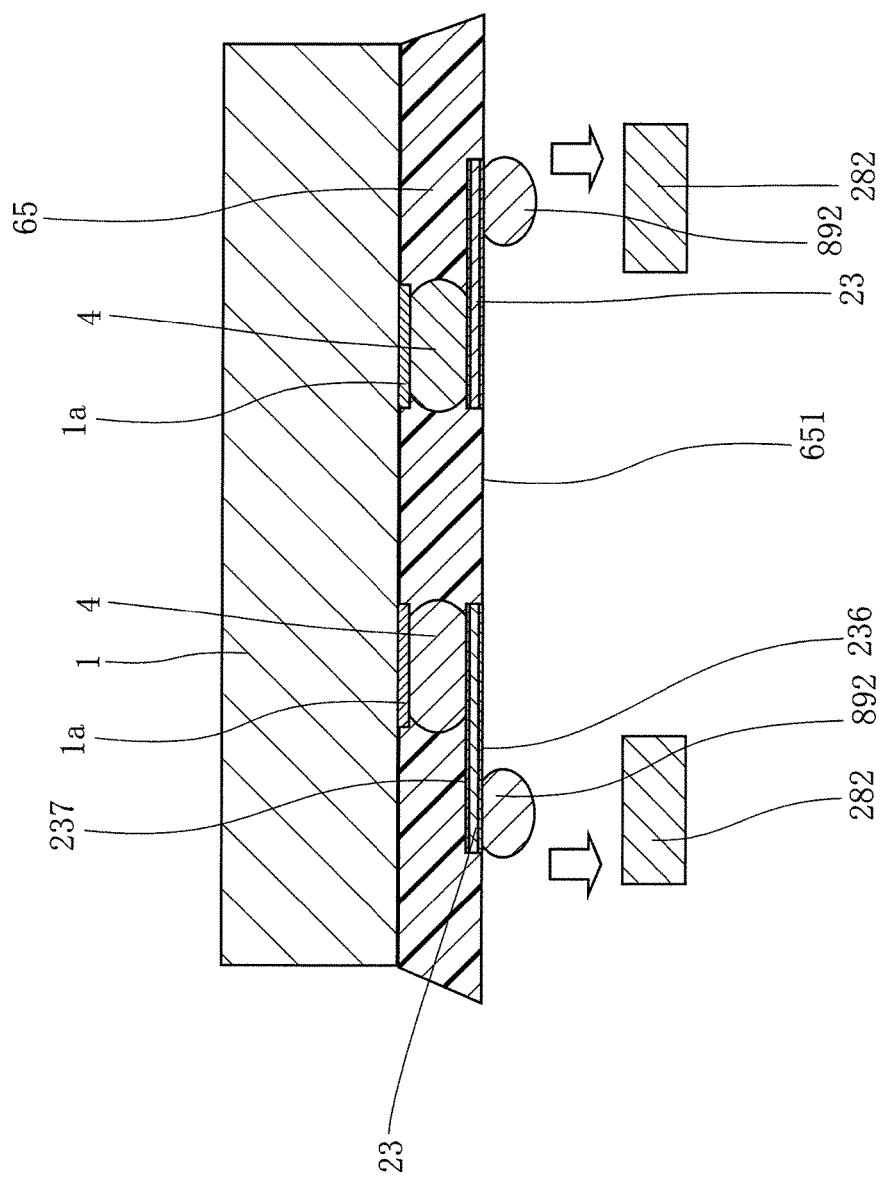
FIG. 74 is a cross-sectional view showing a process following FIG. 73.

Next, the base 732 is removed from the frame 73, as shown in FIG. 74. The electrode surface 236 of the electrode films 23 and the resin side surface 651 of the first resin portion 65 are exposed, as a result of removing the base 732. Since the electrode films 23 and the first resin portion 65 are formed on the base 732 having a flat surface, the electrode surface 236 of the electrode films 23 is flush with the resin side surface 651 of the first resin portion 65.

Next, a conductive adhesive 892 is applied to the electrode films 23, as shown in this diagram. The conductive adhesive 892 consists of solder in the present embodiment.

Figure 75:
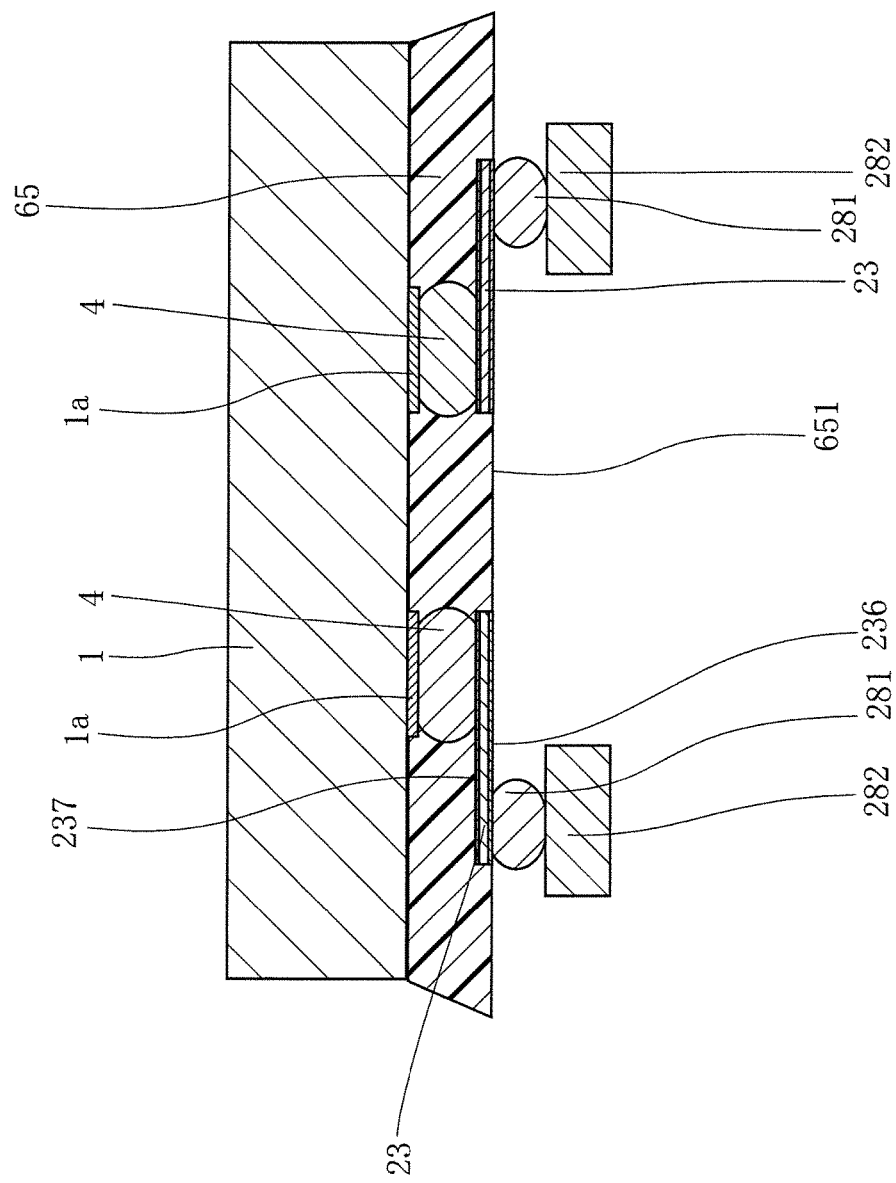
FIG. 75 is a cross-sectional view showing a process following FIG. 74.

Next, the semiconductor chip 1 is disposed on the leads 282 so that the electrode films 23 and the leads 282 sandwich the conductive adhesive 892. Thereafter, the conductive adhesive 892 solidifies, and the electrode films 23 are fixed to the leads 282, as shown in FIG. 75. The conductive adhesive 892 changes into the electrical connection member 281 as a result of solidifying.

Figure 76:
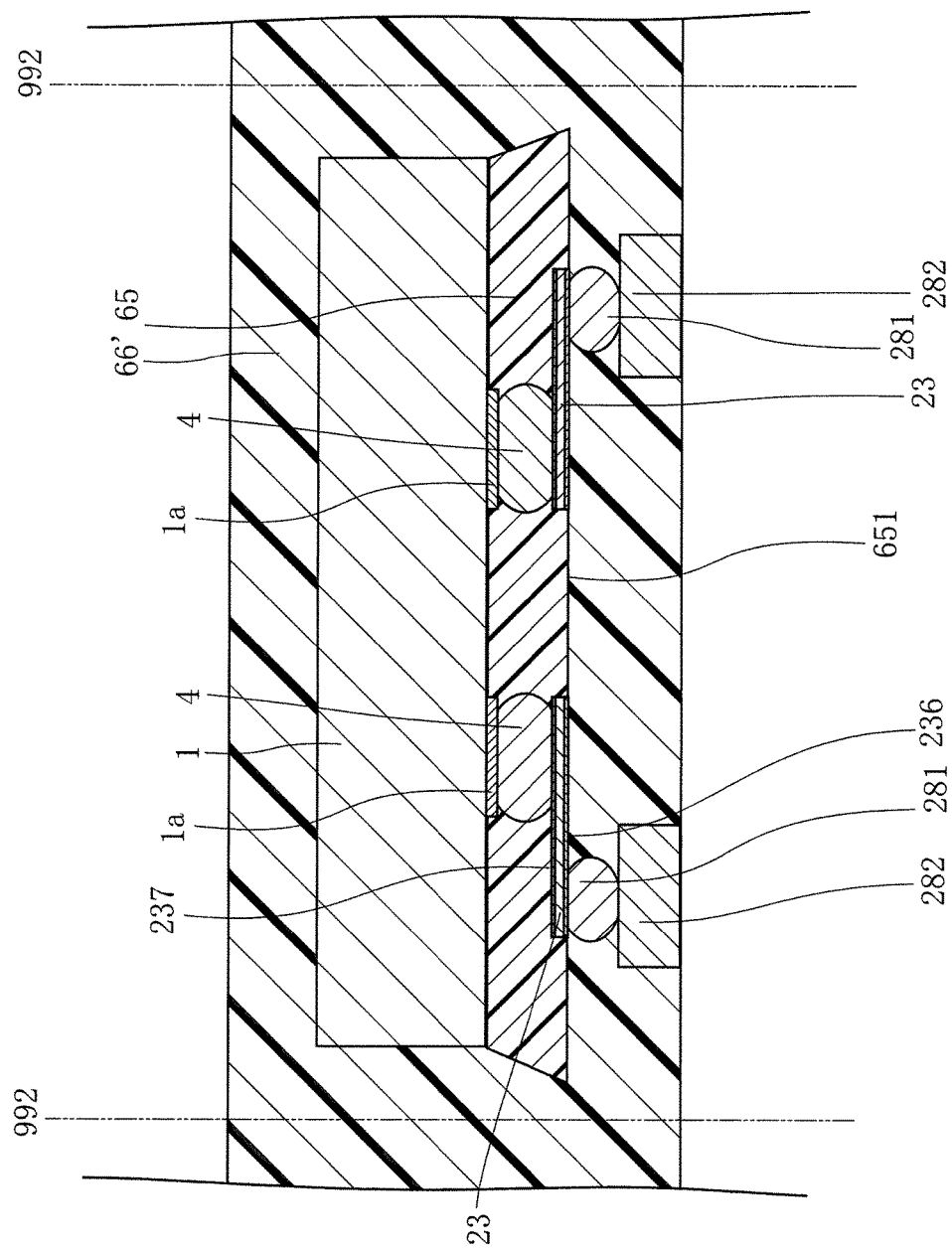
FIG. 76 is a cross-sectional view showing a process following FIG. 75.
Figure 77:
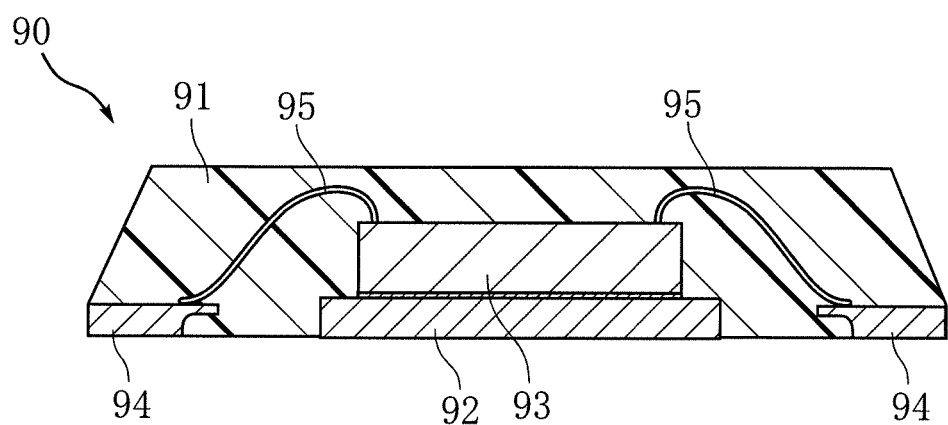
FIG. 77 is a cross-sectional view showing an example of a conventional semiconductor device.

Next, a second resin portion 66' that covers the semiconductor chip 1, the first resin portion 65, the electrical connection members 281 and the leads 282 is formed, as shown in FIG. 76. The same material as that constituting the sealing resin part 60' in Embodiment 1-C can be used as the material constituting second resin portion 66'.

Next, the semiconductor device 200 is manufactured by cutting second resin portion 66' along the two-dot chain line 992 shown in this diagram.

In the present embodiment, the frame 73 is formed by forming the electrode films 23 directly on the base 732. Such a configuration enables the efficiency with which semiconductor devices are manufactured to be increased for similar reasons to those described in relation to the semiconductor device 101.

The present invention is not limited to the abovementioned embodiments. Various design changes can be made to the specific configurations of the constituent elements of the present invention. For example, although an example in which three layers consisting of the electrode films 21, 22 and 23 are included as the interconnect layer 2 was shown in Embodiment 1-C, there may be three or more electrode layers in the interconnect layer 2.

Appendix 1

A method for manufacturing a semiconductor device is provided with the steps of preparing a semiconductor chip that includes a chip electrode; forming a first frame by forming a first electrode film having a first electrode surface and a second electrode surface that face in opposite directions to each other directly on a first base; forming a conductive connection member that contacts the first electrode surface and the chip electrode; removing the first base from the first frame; and forming an electrical connection member that contacts the second electrode surface.

Appendix 2

The method for manufacturing a semiconductor device according to appendix 1 is further provided with the steps of forming a second frame by forming a second electrode film directly on a second base; fixing the second electrode film relative to the first electrode film, on the second electrode surface side of the first electrode film; and removing the second base from the second frame.

Appendix 3

In the method for manufacturing a semiconductor device according to appendix 2, the step of forming the conductive connection member is performed after the step of fixing the second electrode film.

Appendix 4

The method for manufacturing a semiconductor device according to appendix 3 is further provided with the step of covering the second electrode film and the second base with an insulating layer, before the step of fixing the second electrode film, and the step of removing the second base is performed after the step of forming the conductive connection member.

Appendix 5

The method for manufacturing a semiconductor device according to any of appendixes 1 to 4 is further provided with the step of forming a sealing resin part that covers the semiconductor chip.

Appendix 6

In the method for manufacturing a semiconductor device according to appendix 5, the step of forming the sealing resin part is performed after the step of forming the conductive connection member.

Appendix 7

In the method for manufacturing a semiconductor device according to any of appendixes 1 to 6, the semiconductor chip is a bare chip.

Appendix 8

In the method for manufacturing a semiconductor device according to any of appendixes 1 to 7, the first electrode film has a thickness of 0.01-0.03 mm.

Appendix 9

In the method for manufacturing a semiconductor device according to any of appendixes 1 to 8, the first electrode film is formed by plating, in the step of forming the first frame.

Appendix 10

A semiconductor device is provided with a semiconductor chip that includes a chip electrode; a interconnect layer including a plurality of electrode films disposed in different positions to each other in a thickness direction of the semiconductor chip; a sealing resin part that covers the chip electrode and any one of the plurality of the electrode films. The interconnect layer includes an electrical connection member, and the electrical connection member has a conductive contact portion that contacts one of any two electrode films adjacent to each other in the thickness direction among the plurality of electrode films and is located between the two electrode films; and a conductive joining layer that joins the other of the two electrode films to the conductive contact portion.

Appendix 11

In the semiconductor device according to appendix 10, the interconnect layer includes an insulating layer that is interposed between any two electrode films adjacent to each other in the thickness direction among the plurality of electrode films, one of the two electrode films has an electrode surface that faces in one direction in the thickness direction, and the insulating layer has an insulating surface that is flush with the electrode surface.

Appendix 12

In the semiconductor device according to appendix 11, the electrode surface faces away from a side on which the semiconductor chip is located.

Appendix 13

In the semiconductor device according to appendix 11 or 12, the electrical connection member passes through the insulating layer.

Appendix 14

In the semiconductor device according to any of appendixes 10 to 13, the electrode films each have a thickness of 0.01-0.03 mm.

Appendix 15

The semiconductor device according to any of appendixes 10 to 14 is further provided with a conductive connection member that contacts the chip electrode, the plurality of electrode films include a first electrode film that contacts the conductive connection member, and the first electrode film contacts the conductive contact portion.

Appendix 16

The semiconductor device according to any of appendixes 10 to 14 is further provided with a conductive connection member that contacts the chip electrode, the plurality of electrode films include a first electrode film that contacts the conductive connection member, and the first electrode film contacts the conductive joining layer.

Appendix 17

In the semiconductor device according to any of appendixes 10 to 16, the electrode films each include a first layer that consists of gold or palladium and a second layer that is stacked on the first layer and consists of nickel.

Appendix 18

In the semiconductor device according to appendix 11, the insulating layer has a thickness of 0.02-0.06 mm.

Appendix 19

In the semiconductor device according to any of appendixes 10 to 18, the sealing resin part includes a first resin portion that covers the chip electrode and any one of the plurality of the electrode films; and a second resin portion that covers the semiconductor chip and the first resin portion.

Appendix 20

A package structure of a semiconductor device is provided with a semiconductor device according to any of appendixes 10 to 19; a package substrate that supports the semiconductor device; and a solder layer that is interposed between the semiconductor device and the package substrate.

What is claimed is:

1. A method of manufacturing a semiconductor device, comprising:
    preparing a semiconductor chip that includes a chip electrode;
    forming a first frame by forming a first electrode film having a first electrode surface and a second electrode surface that face in opposite directions to each other directly on a first base;
    forming a conductive connection member that contacts the first electrode surface and the chip electrode;
    removing the first base from the first frame; and
    forming an electrical connection member that contacts the second electrode surface.

2. The method of claim 1, further comprising:
    forming a second frame by forming a second electrode film directly on a second base;
    fixing the second electrode film relative to the first electrode film, on the second electrode surface side of the first electrode film; and
    removing the second base from the second frame.

3. The method of claim 2, wherein forming the conductive connection member is performed after fixing the second electrode film.

4. The method of claim 3, further comprising covering the second electrode film and the second base with an insulating layer, before fixing the second electrode film,
    wherein removing the second base is performed after forming the conductive connection member.

5. The method of claim 1, further comprising forming a sealing resin part that covers the semiconductor chip.

6. The method of claim 5, wherein forming the sealing resin part is performed after forming the conductive connection member.

7. The method of claim 1, wherein the semiconductor chip is a bare chip.

8. The method of claim 1, wherein the first electrode film has a thickness of 0.01-0.03 mm.

9. The method of claim 1, wherein the first electrode film is formed by plating, in forming the first frame.

10. A semiconductor device, comprising:
    a semiconductor chip that includes a chip electrode;
    an interconnect layer including a plurality of electrode films disposed in different positions to each other in a thickness direction of the semiconductor chip; and
    a sealing resin part that covers the chip electrode and any one of the plurality of the electrode films,
    wherein the interconnect layer includes an electrical connection member, and
    the electrical connection member has:
        a conductive contact portion that contacts one of any two electrode films adjacent to each other in the thickness direction among the plurality of electrode films and is located between the two electrode films; and
        a conductive joining layer that joins the other of the two electrode films to the conductive contact portion,
    wherein the interconnect layer includes an insulating layer that is interposed between any two electrode films adjacent to each other in the thickness direction among the plurality of electrode films,
    one of the two electrode films has an electrode surface that faces in one direction in the thickness direction, and
    the insulating layer has an insulating surface that is flush with the electrode surface.

11. The semiconductor device of claim 10, wherein the electrode surface faces away from a side on which the semiconductor chip is located.

12. The semiconductor device of claim 10, wherein the electrical connection member passes through the insulating layer.

13. The semiconductor device of claim 10, wherein the electrode films each have a thickness of 0.01-0.03 mm.

14. The semiconductor device of claim 10, further comprising a conductive connection member that contacts the chip electrode,
wherein the plurality of electrode films include a first electrode film that contacts the conductive connection member, and
the first electrode film contacts the conductive contact portion.

15. The semiconductor device of claim 10, further comprising a conductive connection member that contacts the chip electrode,
wherein the plurality of electrode films include a first electrode film that contacts the conductive connection member, and
the first electrode film contacts the conductive joining layer.

16. The semiconductor device of claim 10, wherein the electrode films each include a first layer that includes at least one of gold or palladium and a second layer that is stacked on the first layer and includes nickel.

17. The semiconductor device of claim 10, wherein the insulating layer has a thickness of 0.02-0.06 mm.

18. The semiconductor device of claim 10, wherein the sealing resin part includes:
a first resin portion that covers the chip electrode and any one of the plurality of the electrode films; and
a second resin portion that covers the semiconductor chip and the first resin portion.

19. A mounting structure of a semiconductor device, comprising:
a semiconductor device of claim 10;
a package substrate that supports the semiconductor device; and
a solder layer that is interposed between the semiconductor device and the package substrate.

* * * * *